(12) United States Patent
Poltorak

(10) Patent No.: US 11,031,312 B2
(45) Date of Patent: Jun. 8, 2021

(54) MULTI-FRACTAL HEATSINK SYSTEM AND METHOD

(71) Applicant: Fractal Heatsink Technologies, LLC, Miami, FL (US)

(72) Inventor: Alexander Poltorak, Monsey, NY (US)

(73) Assignee: Fractal Heatsink Technologies, LLC, Miami, FL (US)

(*) Notice: Subject to any disclaimer, the term of this patent is extended or adjusted under 35 U.S.C. 154(b) by 265 days.

(21) Appl. No.: 16/038,150

(22) Filed: Jul. 17, 2018

(65) Prior Publication Data

US 2019/0021186 A1 Jan. 17, 2019

Related U.S. Application Data

(60) Provisional application No. 62/533,421, filed on Jul. 17, 2017.

(51) Int. Cl.

| H01L 23/367 | (2006.01) |
|---|---|
| F28F 13/12 | (2006.01) |
| H05K 7/20 | (2006.01) |
| H01L 23/467 | (2006.01) |
| G05B 15/02 | (2006.01) |
| H01L 23/473 | (2006.01) |
| H01L 23/373 | (2006.01) |

(52) U.S. Cl.
CPC .......... *H01L 23/367* (2013.01); *F28F 13/12* (2013.01); *G05B 15/02* (2013.01); *H01L 23/467* (2013.01); *H01L 23/473* (2013.01); *H05K 7/20154* (2013.01); *H05K 7/20172* (2013.01); *H05K 7/20209* (2013.01); *H05K 7/20272* (2013.01); *H05K 7/20281* (2013.01); *H01L 23/3736* (2013.01)

(58) Field of Classification Search
CPC .. H01L 23/367; H01L 23/467; F28F 2215/10; F28F 13/12
See application file for complete search history.

(56) References Cited

U.S. PATENT DOCUMENTS

| 2,535,721 A | 12/1950 | Gaston et al. |
|---|---|---|
| 2,676,448 A | 4/1954 | Limberger et al. |
| 3,975,039 A | 8/1976 | Penneck et al. |
| 4,023,391 A | 5/1977 | Kamii et al. |

(Continued)

FOREIGN PATENT DOCUMENTS

| WO | WO9904429 | 1/1999 |
|---|---|---|
| WO | WO2008086479 A2 | 1/2008 |

*Primary Examiner* — Devon Russell
(74) *Attorney, Agent, or Firm* — Hoffberg & Associates; Steven M Hoffberg

(57) ABSTRACT

A heat sink comprising a heat exchange device having a large scale morphology over a scale range and a small scale texture over a scale range, wherein at least one of the large scale morphology and the small scale texture has a fractal-like self-similarity over a scale range. The large scale morphology and small scale texture may be independently defined and implemented, or be provided with a transitional range. The large scale morphology may be algorithmically optimized according to a set of geometrically constraints. The small scale texture may be optimized according to aerodynamic parameters and constraints. The heat sink may be dynamically varying, and/or operated in conjunction with a dynamically varying heat transfer medium supply.

34 Claims, 24 Drawing Sheets

(56) References Cited

U.S. PATENT DOCUMENTS

| | | |
|---|---|---|
| 4,104,032 A | 8/1978 | Spevack |
| 4,112,062 A | 9/1978 | Spevack |
| 4,192,850 A | 3/1980 | Spevack |
| 4,213,563 A | 7/1980 | van Kuijk |
| 4,287,245 A | 9/1981 | Kikuchi |
| 4,362,864 A | 12/1982 | Idel et al. |
| 4,415,279 A | 11/1983 | Beuse et al. |
| 4,645,633 A | 2/1987 | Hattori |
| 4,654,092 A | 3/1987 | Melton |
| 4,696,010 A | 9/1987 | Eastman |
| 4,715,438 A * | 12/1987 | Gabuzda ............... H01L 23/467 165/185 |
| 4,811,402 A | 3/1989 | Ward |
| 4,865,232 A | 9/1989 | Cassady, Jr. et al. |
| 4,922,728 A | 5/1990 | Backus |
| 4,931,626 A | 6/1990 | Shikama et al. |
| 5,171,969 A | 12/1992 | Nishimura et al. |
| 5,224,358 A | 7/1993 | Yamanaka et al. |
| 5,324,796 A | 6/1994 | Han |
| 5,326,454 A | 7/1994 | Engelhaupt |
| 5,371,753 A | 12/1994 | Adsett |
| 5,417,279 A | 5/1995 | Wada |
| 5,483,098 A | 1/1996 | Joiner, Jr. |
| 5,496,622 A | 3/1996 | Isobe et al. |
| 5,510,598 A | 4/1996 | Kawam et al. |
| 5,527,580 A | 6/1996 | Ikeda et al. |
| 5,538,598 A | 7/1996 | Schlesinger et al. |
| 5,548,481 A | 8/1996 | Salisbury et al. |
| 5,566,377 A | 10/1996 | Lee |
| 5,583,316 A | 12/1996 | Kitahara et al. |
| 5,626,031 A | 5/1997 | Motohashi et al. |
| 5,695,619 A | 12/1997 | Williamson et al. |
| 5,756,931 A | 5/1998 | Kitahara et al. |
| 5,760,333 A | 6/1998 | Kitahara et al. |
| 5,817,422 A | 10/1998 | Engelhaupt |
| 5,834,871 A | 11/1998 | Puskas |
| 5,843,383 A | 12/1998 | Williamson et al. |
| 5,853,897 A | 12/1998 | Engelhaupt |
| 5,855,855 A | 1/1999 | Williamson et al. |
| 5,856,836 A | 1/1999 | Silverbrook |
| 5,870,284 A | 2/1999 | Stewart et al. |
| RE36,408 E | 11/1999 | Yamanaka et al. |
| 6,002,588 A | 12/1999 | Vos et al. |
| 6,011,216 A | 1/2000 | Kitahara et al. |
| 6,015,008 A | 1/2000 | Kogure et al. |
| 6,100,303 A | 8/2000 | Hirotani et al. |
| 6,128,188 A | 10/2000 | Hanners |
| 6,140,571 A | 10/2000 | Kitahara et al. |
| 6,143,977 A | 11/2000 | Kitahara et al. |
| 6,145,804 A | 11/2000 | Baumann et al. |
| 6,166,904 A | 12/2000 | Kitahara et al. |
| 6,274,260 B1 | 8/2001 | Schuler |
| 6,276,370 B1 | 8/2001 | Fisch et al. |
| 6,298,784 B1 | 10/2001 | Knowlton et al. |
| 6,330,157 B1 | 12/2001 | Bezama et al. |
| 6,333,852 B1 | 12/2001 | Lin |
| 6,442,951 B1 | 9/2002 | Maeda et al. |
| 6,474,074 B2 | 11/2002 | Ghoshal |
| 6,515,346 B1 | 2/2003 | Kemeny |
| 6,539,869 B2 | 4/2003 | Knowlton et al. |
| 6,544,309 B1 | 4/2003 | Hoefer et al. |
| 6,657,131 B2 | 12/2003 | Gonzalez et al. |
| 6,679,272 B2 | 1/2004 | Bran et al. |
| 6,688,381 B2 * | 2/2004 | Pence ..................... B01F 5/06 165/139 |
| 6,689,486 B2 | 2/2004 | Ho et al. |
| 6,715,431 B1 | 4/2004 | Maejima |
| 6,736,195 B2 | 5/2004 | Busch et al. |
| 6,848,499 B1 | 2/2005 | Bhatia |
| 6,863,117 B2 | 3/2005 | Valenzuela |
| 6,865,083 B2 | 3/2005 | Liu |
| 6,878,339 B2 | 4/2005 | Akiyama et al. |
| 6,884,943 B1 | 4/2005 | Gonzalez et al. |
| 6,937,473 B2 | 8/2005 | Cheng et al. |
| 6,938,560 B2 | 9/2005 | Okazaki et al. |
| 7,080,989 B2 | 7/2006 | Gates |
| 7,096,580 B2 | 8/2006 | Gonzalez et al. |
| 7,104,084 B2 | 9/2006 | Park et al. |
| 7,113,402 B2 | 9/2006 | Rutledge et al. |
| 7,195,058 B2 | 3/2007 | Wolford et al. |
| 7,238,085 B2 | 7/2007 | Montierth et al. |
| 7,240,505 B2 | 7/2007 | Kim et al. |
| 7,243,504 B2 | 7/2007 | Kang et al. |
| 7,254,955 B2 | 8/2007 | Otake et al. |
| 7,256,751 B2 | 8/2007 | Cohen |
| 7,351,360 B2 | 4/2008 | Hougham et al. |
| 7,392,752 B2 | 7/2008 | Okazaki et al. |
| 7,401,762 B2 | 7/2008 | Ohmori et al. |
| 7,411,791 B2 | 8/2008 | Chang et al. |
| 7,418,108 B2 | 8/2008 | Oser |
| 7,431,416 B2 | 10/2008 | Chung et al. |
| 7,434,411 B2 | 10/2008 | Drost et al. |
| 7,442,360 B2 | 10/2008 | Tonkovich et al. |
| 7,448,229 B2 | 11/2008 | Chin et al. |
| 7,456,799 B1 | 11/2008 | Cohen |
| 7,466,034 B2 | 12/2008 | Kang et al. |
| 7,481,071 B2 | 1/2009 | Choi et al. |
| 7,490,657 B2 | 2/2009 | Ueyama |
| 7,533,539 B2 | 5/2009 | Otake et al. |
| 7,602,089 B2 | 10/2009 | Kabata et al. |
| 7,614,406 B2 | 11/2009 | Bran |
| 7,623,928 B2 | 11/2009 | DiLorenzo |
| 7,646,607 B2 | 1/2010 | Gallina et al. |
| 7,669,418 B2 | 3/2010 | Chino et al. |
| 7,696,890 B2 | 4/2010 | Bandholz et al. |
| 7,724,113 B2 | 5/2010 | Fullerton et al. |
| 7,724,114 B2 | 5/2010 | Fullerton et al. |
| 7,742,673 B2 | 6/2010 | Li et al. |
| 7,746,205 B2 | 6/2010 | Fullerton et al. |
| 7,750,773 B2 | 7/2010 | Fullerton et al. |
| 7,750,774 B2 | 7/2010 | Fullerton et al. |
| 7,750,777 B2 | 7/2010 | Fullerton et al. |
| 7,750,778 B2 | 7/2010 | Fullerton et al. |
| 7,750,779 B2 | 7/2010 | Fullerton et al. |
| 7,750,780 B2 | 7/2010 | Fullerton et al. |
| 7,750,781 B2 | 7/2010 | Fullerton et al. |
| 7,755,462 B2 | 7/2010 | Fullerton et al. |
| 7,760,058 B2 | 7/2010 | Fullerton et al. |
| 7,772,951 B2 | 8/2010 | Fullerton et al. |
| 7,772,952 B2 | 8/2010 | Fullerton et al. |
| 7,775,261 B2 | 8/2010 | Valenzuela |
| 7,778,029 B2 | 8/2010 | Ueno |
| 7,800,471 B2 | 9/2010 | Fullerton et al. |
| 7,800,472 B2 | 9/2010 | Fullerton et al. |
| 7,800,473 B2 | 9/2010 | Fullerton et al. |
| 7,804,387 B2 | 9/2010 | Fullerton et al. |
| 7,808,348 B2 | 10/2010 | Fullerton et al. |
| 7,808,349 B2 | 10/2010 | Fullerton et al. |
| 7,808,350 B2 | 10/2010 | Fullerton et al. |
| 7,812,697 B2 | 10/2010 | Fullerton et al. |
| 7,834,728 B2 | 11/2010 | Fullerton et al. |
| 7,839,244 B2 | 11/2010 | Fullerton et al. |
| 7,839,245 B2 | 11/2010 | Fullerton et al. |
| 7,839,246 B2 | 11/2010 | Fullerton et al. |
| 7,839,247 B2 | 11/2010 | Fullerton et al. |
| 7,839,248 B2 | 11/2010 | Fullerton et al. |
| 7,843,294 B2 | 11/2010 | Fullerton et al. |
| 7,855,624 B2 | 12/2010 | Fullerton et al. |
| 7,864,009 B2 | 1/2011 | Fullerton et al. |
| 7,864,010 B2 | 1/2011 | Fullerton et al. |
| 7,864,011 B2 | 1/2011 | Fullerton et al. |
| 7,868,721 B2 | 1/2011 | Fullerton et al. |
| 7,889,038 B2 | 2/2011 | Fullerton et al. |
| 7,891,818 B2 | 2/2011 | Christensen et al. |
| 7,898,176 B2 | 3/2011 | Li et al. |
| 7,898,798 B2 | 3/2011 | Sakata et al. |
| 7,908,861 B2 | 3/2011 | Chino et al. |
| 7,959,880 B2 | 6/2011 | Tonkovich et al. |
| 7,973,732 B2 | 7/2011 | Cohen |
| 7,974,714 B2 | 7/2011 | Hoffberg |
| 7,987,677 B2 | 8/2011 | McCutchen |
| 8,006,746 B2 | 8/2011 | Tao et al. |
| 8,014,150 B2 | 9/2011 | Campbell et al. |
| 8,015,823 B2 | 9/2011 | Vanderspurt et al. |

(56) References Cited

U.S. PATENT DOCUMENTS

| | | |
|---|---|---|
| 8,030,818 B2 | 10/2011 | Nelson et al. |
| 8,032,262 B2 | 10/2011 | Noureldin |
| 8,037,927 B2 | 10/2011 | Schuette |
| 8,047,273 B2 | 11/2011 | Schubert et al. |
| 8,058,802 B2 | 11/2011 | Li et al. |
| 8,109,105 B2 | 2/2012 | Unezaki et al. |
| 8,116,920 B2 | 2/2012 | Noureldin |
| 8,137,554 B2 | 3/2012 | Jovanovic et al. |
| 8,179,219 B2 | 5/2012 | Fullerton et al. |
| 8,192,144 B2 | 6/2012 | Shibata |
| 8,203,840 B2 | 6/2012 | Lin et al. |
| 8,207,479 B2 | 6/2012 | Ben-Shmuel et al. |
| 8,228,671 B2 | 7/2012 | Ikeda |
| 8,273,245 B2 | 9/2012 | Jovanovic et al. |
| 8,289,710 B2 | 10/2012 | Spearing et al. |
| 8,295,046 B2 * | 10/2012 | St. Rock .............. H01L 23/467 361/697 |
| 8,295,902 B2 | 10/2012 | Salahieh et al. |
| 8,324,835 B2 | 12/2012 | Shum et al. |
| 8,351,249 B2 | 1/2013 | Ishiwata et al. |
| 8,356,400 B2 | 1/2013 | Fullerton et al. |
| 8,357,553 B2 | 1/2013 | Veerasamy et al. |
| 8,371,722 B2 | 2/2013 | Carroll |
| 8,373,526 B2 | 2/2013 | Fullerton et al. |
| 8,373,527 B2 | 2/2013 | Fullerton et al. |
| 8,385,066 B2 | 2/2013 | Chang et al. |
| 8,387,685 B2 | 3/2013 | Kimbara et al. |
| 8,389,916 B2 | 3/2013 | Ben-Shmuel et al. |
| 8,400,766 B2 | 3/2013 | Kim |
| 8,410,882 B2 | 4/2013 | Fullerton et al. |
| 8,417,486 B2 | 4/2013 | Noureldin |
| 8,450,661 B2 | 5/2013 | Ito et al. |
| 8,461,952 B1 | 6/2013 | Fullerton et al. |
| 8,474,264 B2 | 7/2013 | McCutchen |
| 8,491,683 B1 | 7/2013 | Brown-Fitzpatrick et al. |
| 8,492,788 B2 | 7/2013 | Veerasamy et al. |
| 8,493,167 B2 | 7/2013 | Kim et al. |
| 8,506,674 B1 | 8/2013 | Brown-Fitzpatrick et al. |
| 8,525,396 B2 | 9/2013 | Shum et al. |
| 8,526,222 B2 | 9/2013 | Ishiwata et al. |
| 8,536,966 B2 | 9/2013 | Fullerton et al. |
| 8,539,840 B2 | 9/2013 | Ariessohn et al. |
| 8,547,733 B2 | 10/2013 | Ishiwata et al. |
| 8,573,804 B2 | 11/2013 | Veerasamy et al. |
| 8,593,242 B2 | 11/2013 | Fullerton et al. |
| 8,602,599 B2 | 12/2013 | Zimmer et al. |
| 8,618,742 B2 | 12/2013 | Shum et al. |
| 8,629,746 B2 | 1/2014 | Lu |
| 8,643,257 B2 | 2/2014 | Shum et al. |
| 8,643,454 B2 | 2/2014 | Fullerton et al. |
| 8,648,142 B2 | 2/2014 | Kondo et al. |
| 8,650,897 B2 | 2/2014 | Honda |
| 8,652,187 B2 | 2/2014 | Wells et al. |
| 8,653,482 B2 | 2/2014 | Ben-Shmuel |
| 8,680,754 B2 | 3/2014 | Premysler |
| 8,689,741 B2 | 4/2014 | Park et al. |
| 8,698,583 B2 | 4/2014 | Fullerton et al. |
| 8,702,013 B2 | 4/2014 | Zhadanovsky |
| 8,710,598 B2 | 4/2014 | Morand |
| 8,717,131 B2 | 5/2014 | Fullerton et al. |
| 8,759,729 B2 | 6/2014 | Ben-Shmuel et al. |
| 8,760,252 B2 | 6/2014 | Fullerton et al. |
| 8,764,243 B2 | 7/2014 | Zimmer et al. |
| 8,764,247 B2 | 7/2014 | Pattekar et al. |
| 8,769,974 B2 | 7/2014 | Honda |
| 8,779,877 B2 | 7/2014 | Fullerton et al. |
| 8,784,540 B2 | 7/2014 | Rubit et al. |
| 8,792,978 B2 | 7/2014 | Wells et al. |
| 8,805,466 B2 | 8/2014 | Salahieh et al. |
| 8,806,858 B2 | 8/2014 | Zhou et al. |
| 8,829,774 B1 | 9/2014 | Shum et al. |
| 8,830,678 B2 | 9/2014 | Lin |
| 8,839,527 B2 | 9/2014 | Ben-Shmuel et al. |
| 8,844,121 B2 | 9/2014 | Fullerton et al. |
| 8,857,044 B2 | 10/2014 | Fullerton et al. |
| 8,864,806 B2 | 10/2014 | Wells et al. |
| 8,884,517 B1 | 11/2014 | Shum et al. |
| 8,911,642 B2 | 12/2014 | Keite-Telgenbuscher et al. |
| 8,914,118 B2 | 12/2014 | Hasulak |
| 8,922,454 B2 | 12/2014 | Danesh |
| 8,923,042 B2 | 12/2014 | Ishiwata et al. |
| 8,941,040 B2 | 1/2015 | Ben-Shmuel et al. |
| 8,962,376 B2 | 2/2015 | Atanackovic et al. |
| 8,963,668 B2 | 2/2015 | Fullerton et al. |
| 8,968,376 B2 | 3/2015 | Wells et al. |
| 8,976,362 B2 | 3/2015 | Hagopian et al. |
| 8,984,901 B2 | 3/2015 | Honda |
| 8,991,199 B2 | 3/2015 | Honda |
| 9,010,966 B2 | 4/2015 | Maeda et al. |
| 9,027,846 B2 | 5/2015 | Zhadanovsky |
| 9,040,883 B2 | 5/2015 | Ben-Shmuel et al. |
| 9,078,298 B2 | 7/2015 | Ben-Shmuel et al. |
| 9,082,539 B2 | 7/2015 | Fullerton |
| 9,150,300 B2 | 10/2015 | Vanderspurt et al. |
| 9,153,722 B2 | 10/2015 | Escher et al. |
| 9,167,633 B2 | 10/2015 | Ben-Shmuel et al. |
| 9,203,205 B2 | 12/2015 | Kitabayashi |
| 9,219,183 B2 | 12/2015 | Escher et al. |
| 9,227,067 B2 | 1/2016 | Hasulak |
| 9,228,785 B2 * | 1/2016 | Poltorak ................. F28F 21/02 |
| D750,317 S | 2/2016 | Lui et al. |
| 9,257,627 B2 | 2/2016 | Aguirre et al. |
| 9,293,653 B2 | 3/2016 | Veerasamy et al. |
| 9,302,953 B2 | 4/2016 | Molinier et al. |
| 9,304,703 B1 | 4/2016 | Ignomirello |
| 9,310,106 B2 | 4/2016 | Honda |
| 9,310,107 B2 | 4/2016 | Yamashita et al. |
| 9,360,226 B2 | 6/2016 | Honda |
| 9,423,192 B2 | 8/2016 | Tsoi et al. |
| 9,433,974 B2 | 9/2016 | Veerasamy et al. |
| 9,435,549 B2 | 9/2016 | Yamashita et al. |
| 9,437,766 B2 | 9/2016 | Escher et al. |
| 9,443,200 B2 | 9/2016 | Schroff |
| 9,469,579 B2 | 10/2016 | Molinier et al. |
| 9,492,783 B2 | 11/2016 | Tsutsumi et al. |
| 9,504,158 B2 | 11/2016 | Findley |
| 9,543,803 B2 | 1/2017 | Hoj et al. |
| 9,551,352 B2 | 1/2017 | MacDonald et al. |
| 9,561,651 B2 | 2/2017 | Hatsui et al. |
| 9,581,361 B2 | 2/2017 | Honda |
| 9,610,006 B2 | 4/2017 | Salahieh et al. |
| 9,625,215 B2 | 4/2017 | Hsiao |
| 9,628,108 B2 | 4/2017 | Ignomirello |
| 9,655,677 B2 | 5/2017 | Salahieh et al. |
| 9,677,792 B2 | 6/2017 | Auringer et al. |
| 9,719,699 B2 | 8/2017 | Tamura et al. |
| 9,730,433 B2 | 8/2017 | Sahin |
| 9,738,573 B2 | 8/2017 | Molinier et al. |
| 9,763,478 B2 | 9/2017 | Cameron et al. |
| 9,770,055 B2 | 9/2017 | Cameron et al. |
| 9,795,442 B2 | 10/2017 | Salahieh et al. |
| 9,800,323 B2 | 10/2017 | Auricchio, Jr. et al. |
| 9,803,623 B2 | 10/2017 | Burkle |
| 9,817,439 B2 | 11/2017 | Gosieski, Jr. et al. |
| 9,840,675 B2 | 12/2017 | Horizoe et al. |
| 9,872,345 B2 | 1/2018 | Ben-Shmuel et al. |
| 9,877,505 B2 | 1/2018 | Cameron et al. |
| 9,888,714 B2 | 2/2018 | Cameron et al. |
| 9,888,723 B2 | 2/2018 | Cameron et al. |
| 9,888,724 B2 | 2/2018 | Cameron et al. |
| 9,888,725 B2 | 2/2018 | Cameron et al. |
| 9,901,002 B2 | 2/2018 | Jenkins |
| 9,933,790 B2 | 4/2018 | Blackley |
| 9,936,736 B2 | 4/2018 | Cameron et al. |
| 9,936,737 B2 | 4/2018 | Cameron et al. |
| 9,936,738 B2 | 4/2018 | Cameron et al. |
| 9,943,111 B2 | 4/2018 | Cameron et al. |
| 9,943,116 B2 | 4/2018 | Cameron et al. |
| 9,951,996 B2 | 4/2018 | Ishizaka |
| 9,958,170 B2 | 5/2018 | Yamashita et al. |
| 9,961,812 B2 | 5/2018 | Suorsa |
| 9,976,814 B2 | 5/2018 | Gomez et al. |
| 9,981,532 B2 | 5/2018 | Blackley |
| 2001/0054495 A1 | 12/2001 | Yevin et al. |

(56) References Cited

U.S. PATENT DOCUMENTS

| | | |
|---|---|---|
| 2002/0035945 A1 | 3/2002 | Knowlton et al. |
| 2002/0062648 A1 | 5/2002 | Ghoshal |
| 2002/0070448 A1 | 6/2002 | Gonzalez et al. |
| 2002/0080563 A1* | 6/2002 | Pence et al. |
| 2003/0155110 A1 | 8/2003 | Joshi et al. |
| 2003/0156982 A1 | 8/2003 | Akiyama et al. |
| 2003/0159809 A1 | 8/2003 | Valenzuela |
| 2003/0183368 A1 | 10/2003 | Paradis et al. |
| 2004/0170086 A1 | 9/2004 | Mayer et al. |
| 2004/0187751 A1 | 9/2004 | Okazaki et al. |
| 2004/0187861 A1 | 9/2004 | Harrison et al. |
| 2004/0213982 A1 | 10/2004 | Touzov |
| 2005/0003737 A1 | 1/2005 | Montierth et al. |
| 2005/0116336 A1 | 6/2005 | Chopra et al. |
| 2005/0126211 A1 | 6/2005 | Drost et al. |
| 2005/0161807 A1 | 7/2005 | Gonzalez et al. |
| 2005/0174473 A1 | 8/2005 | Morgan et al. |
| 2005/0207609 A1 | 9/2005 | Oser |
| 2005/0230085 A1 | 10/2005 | Valenzuela |
| 2005/0245659 A1 | 11/2005 | Chen |
| 2005/0257721 A1 | 11/2005 | Okazaki et al. |
| 2005/0265915 A1 | 12/2005 | Tonkovich et al. |
| 2005/0279126 A1 | 12/2005 | Otake et al. |
| 2006/0002110 A1 | 1/2006 | Dowling et al. |
| 2006/0005558 A1 | 1/2006 | Otake et al. |
| 2006/0011326 A1 | 1/2006 | Yuval |
| 2006/0037177 A1 | 2/2006 | Blum et al. |
| 2006/0037345 A1 | 2/2006 | Kang et al. |
| 2006/0037351 A1 | 2/2006 | Kim et al. |
| 2006/0037742 A1 | 2/2006 | Kim et al. |
| 2006/0072289 A1 | 4/2006 | Rutledge et al. |
| 2006/0103687 A1 | 5/2006 | Chung et al. |
| 2006/0107682 A1 | 5/2006 | Park et al. |
| 2006/0123820 A1 | 6/2006 | Kim et al. |
| 2006/0130482 A1 | 6/2006 | Chino et al. |
| 2006/0131531 A1 | 6/2006 | Ohmori et al. |
| 2006/0144067 A1 | 7/2006 | Choi et al. |
| 2006/0168982 A1 | 8/2006 | Moon et al. |
| 2006/0168998 A1 | 8/2006 | Chin et al. |
| 2006/0191265 A1 | 8/2006 | Kang et al. |
| 2006/0237178 A1 | 10/2006 | Katoh et al. |
| 2006/0254762 A1 | 11/2006 | Tao et al. |
| 2006/0260638 A1 | 11/2006 | Fani et al. |
| 2007/0039350 A1 | 2/2007 | Takeuchi et al. |
| 2007/0041159 A1 | 2/2007 | Bate |
| 2007/0058346 A1 | 3/2007 | Yeh |
| 2007/0101989 A1 | 5/2007 | Strathman |
| 2007/0230135 A1 | 10/2007 | Feger et al. |
| 2008/0004375 A1 | 1/2008 | Kondo et al. |
| 2008/0012437 A1 | 1/2008 | Kabata et al. |
| 2008/0017219 A1 | 1/2008 | Franklin |
| 2008/0037927 A1 | 2/2008 | Kurihara et al. |
| 2008/0044704 A1 | 2/2008 | Kubo et al. |
| 2008/0055855 A1 | 3/2008 | Kamath et al. |
| 2008/0073058 A1 | 3/2008 | Ueyama |
| 2008/0080137 A1* | 4/2008 | Otsuki ............... H01L 23/3672 361/697 |
| 2008/0121373 A1 | 5/2008 | Wang et al. |
| 2008/0121374 A1 | 5/2008 | Wang et al. |
| 2008/0135211 A1 | 6/2008 | Yassour |
| 2008/0149304 A1 | 6/2008 | Slaughter |
| 2008/0173435 A1 | 7/2008 | Schubert et al. |
| 2008/0190110 A1 | 8/2008 | Chino et al. |
| 2008/0290087 A1 | 11/2008 | Ben-Shmuel et al. |
| 2009/0004074 A1 | 1/2009 | Tonkovich et al. |
| 2009/0004520 A1 | 1/2009 | Hirakata |
| 2009/0013700 A1 | 1/2009 | Unezaki et al. |
| 2009/0016019 A1 | 1/2009 | Bandholz et al. |
| 2009/0021270 A1 | 1/2009 | Bandholz et al. |
| 2009/0045191 A1 | 2/2009 | Ben-Shmuel et al. |
| 2009/0045967 A1 | 2/2009 | Bandholz et al. |
| 2009/0050293 A1 | 2/2009 | Kuo |
| 2009/0058748 A1 | 3/2009 | Cohen |
| 2009/0071624 A1 | 3/2009 | Zhang et al. |
| 2009/0085454 A1 | 4/2009 | Li et al. |
| 2009/0087298 A1 | 4/2009 | Shibata |
| 2009/0087639 A1 | 4/2009 | Li et al. |
| 2009/0087640 A1 | 4/2009 | Li et al. |
| 2009/0141450 A1 | 6/2009 | Sakata et al. |
| 2009/0161312 A1 | 6/2009 | Spearing et al. |
| 2009/0166001 A1 | 7/2009 | Vanderspurt et al. |
| 2009/0236333 A1 | 9/2009 | Ben-Shmuel et al. |
| 2009/0236334 A1 | 9/2009 | Ben-Shmuel et al. |
| 2009/0236335 A1 | 9/2009 | Ben-Shmuel et al. |
| 2009/0249612 A1 | 10/2009 | Fullerton et al. |
| 2009/0251238 A1 | 10/2009 | Fullerton et al. |
| 2009/0251239 A1 | 10/2009 | Fullerton et al. |
| 2009/0251240 A1 | 10/2009 | Fullerton et al. |
| 2009/0251241 A1 | 10/2009 | Fullerton et al. |
| 2009/0251242 A1 | 10/2009 | Fullerton et al. |
| 2009/0251243 A1 | 10/2009 | Fullerton et al. |
| 2009/0251244 A1 | 10/2009 | Fullerton et al. |
| 2009/0251245 A1 | 10/2009 | Fullerton et al. |
| 2009/0251246 A1 | 10/2009 | Fullerton et al. |
| 2009/0251247 A1 | 10/2009 | Fullerton et al. |
| 2009/0251248 A1 | 10/2009 | Fullerton et al. |
| 2009/0251249 A1 | 10/2009 | Fullerton et al. |
| 2009/0251251 A1 | 10/2009 | Fullerton et al. |
| 2009/0251253 A1 | 10/2009 | Fullerton et al. |
| 2009/0251254 A1 | 10/2009 | Fullerton et al. |
| 2009/0251255 A1 | 10/2009 | Fullerton et al. |
| 2009/0251256 A1 | 10/2009 | Fullerton et al. |
| 2009/0251259 A1 | 10/2009 | Fullerton et al. |
| 2009/0251260 A1 | 10/2009 | Fullerton et al. |
| 2009/0251261 A1 | 10/2009 | Fullerton et al. |
| 2009/0251262 A1 | 10/2009 | Fullerton et al. |
| 2009/0251263 A1 | 10/2009 | Fullerton et al. |
| 2009/0251264 A1 | 10/2009 | Fullerton et al. |
| 2009/0251265 A1 | 10/2009 | Fullerton et al. |
| 2009/0251351 A1 | 10/2009 | Fullerton et al. |
| 2009/0272404 A1 | 11/2009 | Kim |
| 2009/0273422 A1 | 11/2009 | Fullerton et al. |
| 2009/0273424 A1 | 11/2009 | Fullerton et al. |
| 2009/0278642 A1 | 11/2009 | Fullerton et al. |
| 2009/0284336 A1 | 11/2009 | Fullerton et al. |
| 2009/0295521 A1 | 12/2009 | Fullerton et al. |
| 2009/0302985 A1 | 12/2009 | Fullerton et al. |
| 2009/0306249 A1 | 12/2009 | Lavin et al. |
| 2009/0314474 A1 | 12/2009 | Kimbara et al. |
| 2009/0316365 A1 | 12/2009 | Lin |
| 2009/0321045 A1 | 12/2009 | Hernon et al. |
| 2009/0321047 A1 | 12/2009 | Chen |
| 2010/0006564 A1 | 1/2010 | Ben-Shmuel et al. |
| 2010/0006565 A1 | 1/2010 | Ben-Shmuel et al. |
| 2010/0045412 A1 | 2/2010 | Fullerton et al. |
| 2010/0045413 A1 | 2/2010 | Fullerton et al. |
| 2010/0045414 A1 | 2/2010 | Fullerton et al. |
| 2010/0045415 A1 | 2/2010 | Fullerton et al. |
| 2010/0045416 A1 | 2/2010 | Fullerton et al. |
| 2010/0085713 A1 | 4/2010 | Balandin et al. |
| 2010/0089549 A1 | 4/2010 | Su et al. |
| 2010/0115785 A1 | 5/2010 | Ben-Shmuel et al. |
| 2010/0149862 A1 | 6/2010 | Ishiwata et al. |
| 2010/0204560 A1 | 8/2010 | Salahieh et al. |
| 2010/0212656 A1 | 8/2010 | Qiu et al. |
| 2010/0224479 A1 | 9/2010 | Moosmuller et al. |
| 2010/0231339 A1 | 9/2010 | Fullerton et al. |
| 2010/0236236 A1 | 9/2010 | Mankame et al. |
| 2010/0252648 A1 | 10/2010 | Robinson |
| 2010/0294467 A1 | 11/2010 | Varanasi et al. |
| 2010/0294475 A1 | 11/2010 | Rush et al. |
| 2010/0307593 A1 | 12/2010 | Thimsen et al. |
| 2010/0314985 A1 | 12/2010 | Premysler |
| 2011/0017728 A1 | 1/2011 | Ben-Shmuel et al. |
| 2011/0031236 A1 | 2/2011 | Ben-Shmuel et al. |
| 2011/0031240 A1 | 2/2011 | Ben-Shmuel et al. |
| 2011/0036110 A1 | 2/2011 | Fujimoto et al. |
| 2011/0074362 A1 | 3/2011 | Midorikawa |
| 2011/0087380 A1 | 4/2011 | Noureldin |
| 2011/0087475 A1 | 4/2011 | Noureldin |
| 2011/0103055 A1 | 5/2011 | Carroll |
| 2011/0106504 A1 | 5/2011 | Noureldin |
| 2011/0114631 A1 | 5/2011 | Dammura et al. |
| 2011/0120539 A1 | 5/2011 | Minano et al. |

(56) References Cited

U.S. PATENT DOCUMENTS

| | | |
|---|---|---|
| 2011/0154836 A1 | 6/2011 | Ben-Shmuel |
| 2011/0167849 A1 | 7/2011 | Kobayashi et al. |
| 2011/0168376 A1 | 7/2011 | Keite-Telgenbuscher et al. |
| 2011/0174462 A1 | 7/2011 | Arik et al. |
| 2011/0186868 A1 | 8/2011 | Watari et al. |
| 2011/0192182 A1 | 8/2011 | Noda et al. |
| 2011/0198406 A1 | 8/2011 | Zhadanovsky |
| 2011/0198979 A1 | 8/2011 | Shum et al. |
| 2011/0204763 A1 | 8/2011 | Shum et al. |
| 2011/0204779 A1 | 8/2011 | Shum et al. |
| 2011/0204780 A1 | 8/2011 | Shum et al. |
| 2011/0220072 A1 | 9/2011 | Seybold |
| 2011/0226460 A1 | 9/2011 | Sommer |
| 2011/0247358 A1 | 10/2011 | Wada et al. |
| 2011/0280019 A1 | 11/2011 | Zimmer et al. |
| 2011/0290457 A1 | 12/2011 | Vanderspurt et al. |
| 2011/0291792 A1 | 12/2011 | Lu |
| 2011/0296860 A1 | 12/2011 | Honda |
| 2011/0296861 A1 | 12/2011 | Honda |
| 2011/0302943 A1 | 12/2011 | Honda |
| 2011/0302948 A1 | 12/2011 | Honda |
| 2011/0302949 A1 | 12/2011 | Honda |
| 2012/0031272 A1 | 2/2012 | Rubit et al. |
| 2012/0048504 A1 | 3/2012 | Park et al. |
| 2012/0049242 A1 | 3/2012 | Atanackovic et al. |
| 2012/0071870 A1 | 3/2012 | Salahieh et al. |
| 2012/0086022 A1 | 4/2012 | Veerasamy et al. |
| 2012/0086023 A1 | 4/2012 | Veerasamy et al. |
| 2012/0087127 A1 | 4/2012 | Veerasamy et al. |
| 2012/0088319 A1 | 4/2012 | Veerasamy et al. |
| 2012/0105186 A1 | 5/2012 | Kim et al. |
| 2012/0111553 A1 | 5/2012 | Tsoi et al. |
| 2012/0118530 A1 | 5/2012 | Yamashita et al. |
| 2012/0123232 A1 | 5/2012 | Najarian et al. |
| 2012/0143280 A1 | 6/2012 | Hasulak |
| 2012/0174650 A1 | 7/2012 | Ariessohn et al. |
| 2012/0193085 A1 | 8/2012 | Whittle et al. |
| 2012/0198874 A1 | 8/2012 | Yamashita et al. |
| 2012/0230913 A1 | 9/2012 | Johnston et al. |
| 2012/0234032 A1 | 9/2012 | Yamashita et al. |
| 2012/0256532 A1 | 10/2012 | Fullerton et al. |
| 2012/0256715 A1 | 10/2012 | Fullerton et al. |
| 2012/0260685 A1 | 10/2012 | Honda |
| 2012/0267077 A1 | 10/2012 | Dede |
| 2012/0267361 A1 | 10/2012 | Ben-Shmuel et al. |
| 2012/0279690 A1 | 11/2012 | Seybold et al. |
| 2012/0284969 A1 | 11/2012 | Fullerton et al. |
| 2012/0285188 A1 | 11/2012 | Honda |
| 2012/0285660 A1 | 11/2012 | Poltorak |
| 2012/0286912 A1 | 11/2012 | Fullerton et al. |
| 2012/0286913 A1 | 11/2012 | Fullerton et al. |
| 2012/0293952 A1 | 11/2012 | Herring et al. |
| 2012/0299175 A1 | 11/2012 | Tran |
| 2012/0319808 A1 | 12/2012 | Fullerton et al. |
| 2012/0319809 A1 | 12/2012 | Fullerton et al. |
| 2012/0320667 A1 | 12/2012 | Ishiwata et al. |
| 2012/0326254 A1 | 12/2012 | Ishiwata et al. |
| 2012/0326821 A1 | 12/2012 | Fullerton et al. |
| 2013/0009851 A1 | 1/2013 | Danesh |
| 2013/0042893 A1 | 2/2013 | Ariessohn et al. |
| 2013/0048506 A1 | 2/2013 | Chen |
| 2013/0055756 A1 | 3/2013 | Tsutsumi et al. |
| 2013/0056460 A1 | 3/2013 | Ben-Shmuel et al. |
| 2013/0083960 A1 | 4/2013 | Kostrzewski et al. |
| 2013/0118550 A1 | 5/2013 | Sahin |
| 2013/0119054 A1 | 5/2013 | Ben-Shmuel et al. |
| 2013/0128407 A1 | 5/2013 | Fullerton et al. |
| 2013/0129919 A1 | 5/2013 | Veerasamy et al. |
| 2013/0133859 A1 | 5/2013 | Glover et al. |
| 2013/0139766 A1 | 6/2013 | Lombard |
| 2013/0141198 A1 | 6/2013 | Fullerton et al. |
| 2013/0145612 A1 | 6/2013 | Busch et al. |
| 2013/0155687 A1 | 6/2013 | Zimmer et al. |
| 2013/0162136 A1 | 6/2013 | Baldwin et al. |
| 2013/0186076 A1 | 7/2013 | Zhou et al. |
| 2013/0199031 A1 | 8/2013 | Fullerton et al. |
| 2013/0206165 A1 | 8/2013 | Busnaina et al. |
| 2013/0222097 A1 | 8/2013 | Fullerton et al. |
| 2013/0227736 A1 | 8/2013 | Dragonuk et al. |
| 2013/0227737 A1 | 8/2013 | Prest |
| 2013/0252373 A1 | 9/2013 | Siau et al. |
| 2013/0255750 A1 | 10/2013 | Escher et al. |
| 2013/0255752 A1 | 10/2013 | Escher et al. |
| 2013/0255753 A1 | 10/2013 | Escher et al. |
| 2013/0258595 A1 | 10/2013 | Tuckerman |
| 2013/0286666 A1 | 10/2013 | Bakk |
| 2013/0299148 A1 | 11/2013 | Hernon et al. |
| 2013/0305522 A1 | 11/2013 | Fullerton et al. |
| 2013/0309778 A1 | 11/2013 | Lowe et al. |
| 2013/0312787 A1 | 11/2013 | Suzuki |
| 2013/0340976 A1 | 12/2013 | Kamiyama et al. |
| 2013/0341744 A1 | 12/2013 | Ishiwata et al. |
| 2014/0008119 A1 | 1/2014 | Brandt |
| 2014/0030124 A1 | 1/2014 | Hoj et al. |
| 2014/0034743 A1 | 2/2014 | Zhadanovsky |
| 2014/0037277 A1 | 2/2014 | Kominami et al. |
| 2014/0043615 A1 | 2/2014 | Hagopian et al. |
| 2014/0047862 A1 | 2/2014 | Tamura et al. |
| 2014/0050465 A1 | 2/2014 | Kominami et al. |
| 2014/0058197 A1 | 2/2014 | Salahieh et al. |
| 2014/0072855 A1 | 3/2014 | Schaefer |
| 2014/0091697 A1 | 4/2014 | Shum |
| 2014/0092596 A1 | 4/2014 | Deutsch et al. |
| 2014/0098542 A1 | 4/2014 | Zimmer et al. |
| 2014/0126213 A1 | 5/2014 | Pattekar et al. |
| 2014/0174503 A1 | 6/2014 | Broessel et al. |
| 2014/0266849 A1 | 9/2014 | Suorsa |
| 2014/0266850 A1 | 9/2014 | Suorsa |
| 2014/0268730 A1 | 9/2014 | Lui et al. |
| 2014/0268750 A1 | 9/2014 | Lui et al. |
| 2014/0300437 A1 | 10/2014 | Fullerton et al. |
| 2014/0340870 A1 | 11/2014 | Premysler |
| 2014/0345152 A1 | 11/2014 | Ben-Shmuel et al. |
| 2014/0360699 A1 | 12/2014 | van Schoor et al. |
| 2015/0003007 A1 | 1/2015 | MacDonald et al. |
| 2015/0022298 A1 | 1/2015 | Fullerton |
| 2015/0048913 A1 | 2/2015 | Fullerton et al. |
| 2015/0051679 A1 | 2/2015 | Hasulak |
| 2015/0055340 A1 | 2/2015 | Maeda et al. |
| 2015/0068703 A1 | 3/2015 | de Bock et al. |
| 2015/0076241 A1 | 3/2015 | Zhadanovsky |
| 2015/0140190 A1 | 5/2015 | Cully et al. |
| 2015/0176464 A1 | 6/2015 | Hotta et al. |
| 2015/0176848 A1 | 6/2015 | Jung et al. |
| 2015/0219319 A1 | 8/2015 | Li et al. |
| 2015/0222074 A1 | 8/2015 | Kitabayashi |
| 2015/0300715 A1 | 10/2015 | Jeon |
| 2015/0301281 A1 | 10/2015 | Findley |
| 2015/0305158 A1 | 10/2015 | Findley |
| 2015/0311374 A1 | 10/2015 | Atanackovic et al. |
| 2015/0318088 A1 | 11/2015 | Fullerton |
| 2015/0327404 A1 | 11/2015 | Wang et al. |
| 2015/0332163 A1 | 11/2015 | Schroff |
| 2015/0342093 A1 | 11/2015 | Poltorak |
| 2015/0361364 A1 | 12/2015 | Horizoe et al. |
| 2015/0366006 A1 | 12/2015 | Ben-Shmuel et al. |
| 2015/0375869 A1 | 12/2015 | Vanderspurt et al. |
| 2015/0376087 A1 | 12/2015 | Molinier et al. |
| 2015/0376088 A1 | 12/2015 | Molinier et al. |
| 2015/0377541 A1 | 12/2015 | Yoshikawa et al. |
| 2016/0025385 A1 | 1/2016 | Auringer et al. |
| 2016/0076743 A1 | 3/2016 | Deutsch et al. |
| 2016/0088769 A1 | 3/2016 | Hsiao |
| 2016/0097597 A1 | 4/2016 | Ishizaka |
| 2016/0160362 A1 | 6/2016 | Thimsen et al. |
| 2016/0178250 A1 | 6/2016 | Jeung et al. |
| 2016/0185686 A1 | 6/2016 | Molinier et al. |
| 2016/0192961 A1 | 7/2016 | Ginggen et al. |
| 2016/0201956 A1 | 7/2016 | Tamura et al. |
| 2016/0216043 A1 | 7/2016 | Gomez et al. |
| 2016/0218737 A1 | 7/2016 | Ignomirello |
| 2016/0252278 A1 | 9/2016 | Goicochea et al. |
| 2016/0262262 A1 | 9/2016 | Findley |
| 2016/0263888 A1 | 9/2016 | Hatsui et al. |

(56) References Cited

U.S. PATENT DOCUMENTS

| | | |
|---|---|---|
| 2016/0264495 A1 | 9/2016 | Molinier et al. |
| 2016/0269099 A1 | 9/2016 | Auricchio, Jr. et al. |
| 2016/0276979 A1 | 9/2016 | Shaver et al. |
| 2016/0320149 A1 | 11/2016 | Poltorak |
| 2016/0322933 A1 | 11/2016 | Escher et al. |
| 2016/0324212 A1 | 11/2016 | Cameron |
| 2016/0324217 A1 | 11/2016 | Cameron |
| 2016/0325055 A1 | 11/2016 | Cameron |
| 2016/0330999 A1 | 11/2016 | Cameron |
| 2016/0331022 A1 | 11/2016 | Cameron |
| 2016/0331023 A1 | 11/2016 | Cameron |
| 2016/0331024 A1 | 11/2016 | Cameron |
| 2016/0331025 A1 | 11/2016 | Cameron |
| 2016/0331026 A1 | 11/2016 | Cameron |
| 2016/0331027 A1 | 11/2016 | Cameron |
| 2016/0331034 A1 | 11/2016 | Cameron |
| 2016/0331035 A1 | 11/2016 | Cameron |
| 2016/0331036 A1 | 11/2016 | Cameron |
| 2016/0331037 A1 | 11/2016 | Cameron |
| 2016/0331859 A1 | 11/2016 | Cameron |
| 2016/0334119 A1 | 11/2016 | Cameron |
| 2016/0334847 A1 | 11/2016 | Cameron |
| 2016/0337141 A1 | 11/2016 | Cameron |
| 2016/0337362 A1 | 11/2016 | Cameron |
| 2016/0337444 A1 | 11/2016 | Cameron |
| 2016/0356751 A1 | 12/2016 | Blackley |
| 2016/0360791 A1 | 12/2016 | Blackley |
| 2016/0361452 A1 | 12/2016 | Blackley |
| 2016/0361677 A1 | 12/2016 | Blackley |
| 2016/0361678 A1 | 12/2016 | Blackley |
| 2016/0361972 A1 | 12/2016 | Blackley |
| 2016/0363332 A1 | 12/2016 | Blackley |
| 2016/0363339 A1 | 12/2016 | Blackley |
| 2016/0363567 A1 | 12/2016 | Blackley |
| 2016/0363570 A1 | 12/2016 | Blackley |
| 2016/0363572 A1 | 12/2016 | Blackley |
| 2016/0363582 A1 | 12/2016 | Blackley |
| 2016/0363917 A1 | 12/2016 | Blackley |
| 2016/0367925 A1 | 12/2016 | Blackley |
| 2016/0367926 A1 | 12/2016 | Blackley |
| 2016/0367927 A1 | 12/2016 | Blackley |
| 2016/0369400 A1 | 12/2016 | Maxwell et al. |
| 2016/0370335 A1 | 12/2016 | Blackley |
| 2016/0370337 A1 | 12/2016 | Blackley |
| 2016/0370340 A1 | 12/2016 | Blackley |
| 2016/0371590 A1 | 12/2016 | Blackley |
| 2017/0009274 A1 | 1/2017 | Abate et al. |
| 2017/0016131 A1* | 1/2017 | Wang .................. C25D 5/34 |
| 2017/0018000 A1 | 1/2017 | Cameron |
| 2017/0020188 A1 | 1/2017 | Cameron |
| 2017/0020195 A1 | 1/2017 | Cameron |
| 2017/0020196 A1 | 1/2017 | Cameron |
| 2017/0020197 A1 | 1/2017 | Cameron |
| 2017/0027229 A1 | 2/2017 | Cameron |
| 2017/0042230 A1 | 2/2017 | Cameron |
| 2017/0042231 A1 | 2/2017 | Cameron |
| 2017/0042614 A1 | 2/2017 | Salahieh et al. |
| 2017/0042615 A1 | 2/2017 | Salahieh et al. |
| 2017/0046357 A1 | 2/2017 | Cameron |
| 2017/0046738 A1 | 2/2017 | Cameron |
| 2017/0055588 A1 | 3/2017 | Cameron |
| 2017/0086496 A1 | 3/2017 | Cameron |
| 2017/0086497 A1 | 3/2017 | Cameron |
| 2017/0086503 A1 | 3/2017 | Cameron |
| 2017/0086504 A1 | 3/2017 | Cameron |
| 2017/0086505 A1 | 3/2017 | Cameron |
| 2017/0091853 A1 | 3/2017 | Cameron |
| 2017/0092106 A1 | 3/2017 | Cameron |
| 2017/0093960 A1 | 3/2017 | Cameron |
| 2017/0093981 A1 | 3/2017 | Cameron |
| 2017/0097197 A1* | 4/2017 | Poltorak .................. F28F 1/40 |
| 2017/0104426 A1 | 4/2017 | Mills |
| 2017/0119058 A1 | 5/2017 | Cameron |
| 2017/0130997 A1 | 5/2017 | Honda |
| 2017/0135407 A1 | 5/2017 | Cameron |
| 2017/0135408 A1 | 5/2017 | Cameron |
| 2017/0135409 A1 | 5/2017 | Cameron |
| 2017/0135410 A1 | 5/2017 | Cameron |
| 2017/0135411 A1 | 5/2017 | Cameron |
| 2017/0135412 A1 | 5/2017 | Cameron |
| 2017/0136193 A1 | 5/2017 | Cameron |
| 2017/0136194 A1 | 5/2017 | Cameron |
| 2017/0136301 A1 | 5/2017 | Cameron |
| 2017/0175711 A1 | 6/2017 | Burkle |
| 2017/0181474 A1 | 6/2017 | Cameron |
| 2017/0181475 A1 | 6/2017 | Cameron |
| 2017/0182267 A1 | 6/2017 | Cameron |
| 2017/0185364 A1 | 6/2017 | Cameron |
| 2017/0191706 A1 | 7/2017 | Ogawa et al. |
| 2017/0205150 A1 | 7/2017 | Safford Smith et al. |
| 2017/0210896 A1 | 7/2017 | Nakasugi et al. |
| 2017/0229375 A1 | 8/2017 | Haj-Hariri et al. |
| 2017/0249417 A1 | 8/2017 | Gosieski, Jr. et al. |
| 2017/0252701 A1* | 9/2017 | Nosrati .................. A61M 1/3417 |
| 2017/0296266 A1 | 10/2017 | Salahieh et al. |
| 2017/0303580 A1 | 10/2017 | Cameron et al. |
| 2017/0303589 A1 | 10/2017 | Cameron et al. |
| 2017/0303590 A1 | 10/2017 | Cameron et al. |
| 2017/0303591 A1 | 10/2017 | Cameron et al. |
| 2017/0303592 A1 | 10/2017 | Cameron et al. |
| 2017/0303593 A1 | 10/2017 | Cameron et al. |
| 2017/0303594 A1 | 10/2017 | Cameron et al. |
| 2017/0308889 A1 | 10/2017 | Cameron et al. |
| 2017/0309091 A1 | 10/2017 | Cameron et al. |
| 2017/0325494 A1 | 11/2017 | Cameron et al. |
| 2017/0332702 A1 | 11/2017 | Cameron et al. |
| 2018/0001561 A1 | 1/2018 | Hascher et al. |
| 2018/0010784 A1 | 1/2018 | Kim et al. |
| 2018/0017345 A1 | 1/2018 | Poltorak |
| 2018/0046215 A1 | 2/2018 | Gosieski, Jr. et al. |
| 2018/0073713 A1 | 3/2018 | Pattekar et al. |
| 2018/0102442 A1 | 4/2018 | Wang et al. |
| 2018/0136850 A1 | 5/2018 | Ignomirello |
| 2018/0142581 A1 | 5/2018 | Jeong et al. |
| 2018/0173251 A1 | 6/2018 | Blackley |
| 2018/0196605 A1 | 7/2018 | Ignomirello |
| 2018/0198517 A1 | 7/2018 | Auricchio et al. |
| 2018/0202324 A1 | 7/2018 | Bak et al. |
| 2018/0202396 A1 | 7/2018 | Zhang |
| 2018/0205097 A1 | 7/2018 | Park et al. |
| 2018/0207863 A1 | 7/2018 | Porter et al. |

\* cited by examiner $l_f$

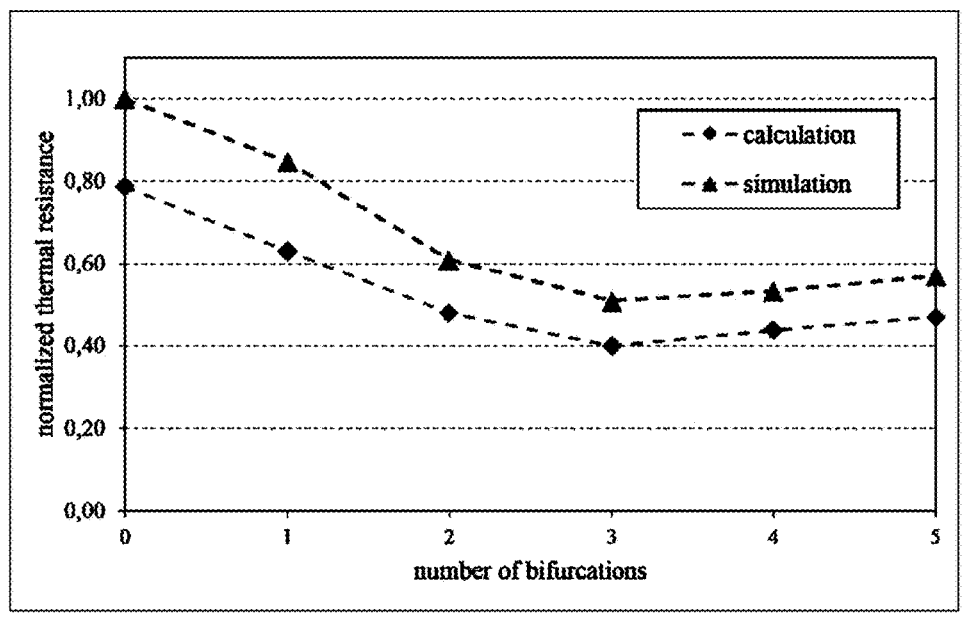
Fig. 26
Prior Art
| Heat sink | 1 | 2 | 3 | 4 | 5 |
|---|---|---|---|---|---|
| Number of branches | 5 | 6 | 7 | 8 | 9 |
| Normalized thermal resistance | 1.10 | 1.06 | 1.00 | 1.06 | 1.12 |
Fig. 27
Prior Art
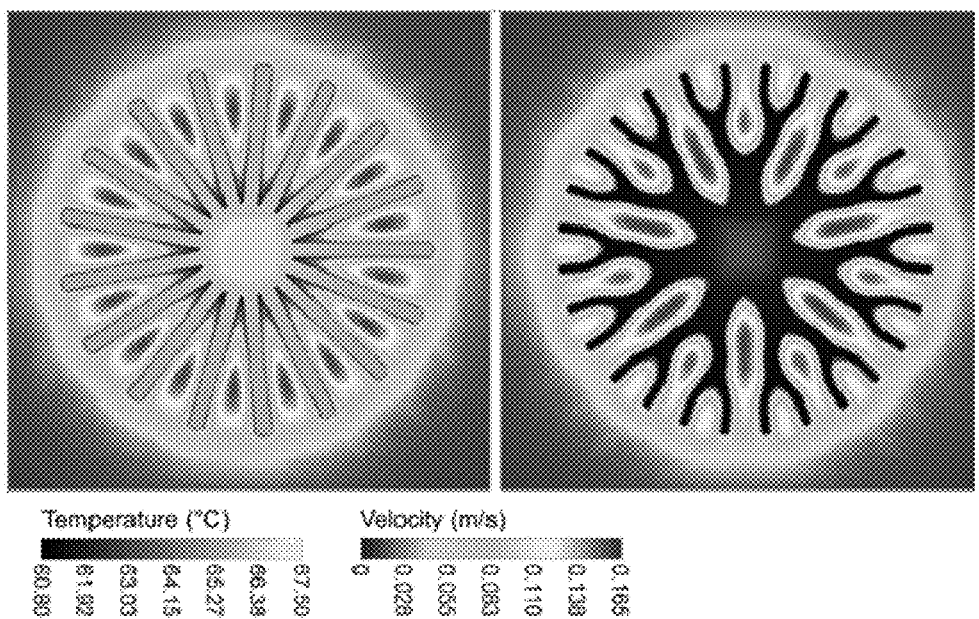
Fig. 28
Prior Art Increasing heat transfer coefficient

MULTI-FRACTAL HEATSINK SYSTEM AND METHOD

CROSS REFERENCE TO RELATED APPLICATIONS

The present application claims benefit of priority from U.S. Provisional Patent Application Ser. No. 62/533,421, filed Jul. 17, 2017, the entirety of which is expressly incorporated herein by reference. This application is also related to U.S. Patent Application Ser. No. 61/331,103, filed May 4, 2010, Ser. No. 13/106,640, filed May 12, 2011, Ser. No. 14/817,962, filed Aug. 4, 2015, Ser. No. 14/984,756, filed Dec. 30, 2015, Ser. No. 15/205,906, filed Jul. 8, 2016, 62/361,253, filed Jul. 12, 2016, and Ser. No. 15/648,065, filed Jul. 12, 2017, each of which is expressly incorporated herein by reference in its entirety.

FIELD OF THE INVENTION

This invention relates to the field of heat sinks or devices that transfer heat between a heat source and a fluid, and more particularly to heat sink designs exploiting fractal geometry principles.

BACKGROUND OF THE INVENTION

All references cited herein are expressly incorporated by reference in their entirety, for their respective teachings regarding elements known in the art, as if explicitly recited herein fully. These teachings represent features and description of the invention, and are intended to support the description of the invention in various combinations, permutations, and subcombinations. It is noted that, in general, the references are applied to support the improvement of the heat sink technology discussed herein. In other cases, the technology hereof is employed to improve the systems and methods set forth in the incorporated references, whether or not these represent heat sink technologies. In particular, references for various shapes and configurations include all such shapes described, in addition to those enumerated.

A heat sink is a term for a component or assembly that transfers heat generated within a solid material to a fluid (gas or liquid) medium, such as air or a cooling liquid. A heat sink is typically designed to increase the surface area in contact with the cooling fluid or gas surrounding it, such as the air. Approach air velocity, choice of material, fin (or other protrusion) design and surface treatment are some of the design factors which influence the thermal resistance, i.e., thermal performance, of a heat sink. See, en.wikipedia.org/wiki/Heat_sink.

Heat sinks operate by removing heat from an object to be cooled into the surrounding air, gas or liquid through convection and radiation. Convection occurs when heat is either carried passively from one point to another by fluid motion (forced convection) or when heat itself causes fluid motion (free convection). When forced convection and free convection occur together, the process is termed mixed convection. Radiation occurs when energy, for example in the form of heat, travels through a medium or through space and is ultimately absorbed by another body. Thermal radiation is the process by which the surface of an object radiates its thermal energy in the form of electromagnetic waves. Infrared radiation from a common household radiator or electric heater is an example of thermal radiation, as is the heat and light (IR and visible EM waves) emitted by a glowing incandescent light bulb. Thermal radiation is generated when heat from the movement of charged particles within atoms is converted to electromagnetic radiation.

Heat transfer is the exchange of thermal energy between physical systems. The rate of heat transfer is dependent on the temperatures of the systems and the properties and states of the intervening medium through which the heat is transferred. The three fundamental modes of heat transfer are conduction, convection, and radiation. Heat transfer, the flow of energy in the form of heat, is a process by which a system changes its internal energy. The direction of heat transfer is from a region of high temperature to a region of lower temperature, and is governed by the Second Law of Thermodynamics. Heat transfer changes the internal energy of the respective systems, and occurs in a direction that increases the entropy of the collection of systems. Thermal equilibrium is reached when all involved bodies and the surroundings reach the same temperature. Thermodynamic and mechanical heat transfer is calculated with the heat transfer coefficient, the proportionality between the heat flux and the thermodynamic driving force for the flow of heat. See, Daniel Arovas, Lecture Notes on Thermodynamics and Statistical Mechanics (A Work in Progress), Department of Physics, University of California, San Diego, Nov. 14, 2013.

The fundamental modes of heat transfer are: Advection (the transport mechanism of a fluid from one location to another, and is dependent on motion and momentum of that fluid); Conduction or diffusion (the transfer of energy between objects that are in physical contact); Convection (The transfer of energy between an object and its environment, due to fluid motion); and Radiation (The transfer of energy by the emission of electromagnetic radiation in the infrared part of the spectrum).

Heat conduction occurs as hot, rapidly moving or vibrating atoms and molecules interact with neighboring atoms and molecules, transferring some of their energy (heat) to these neighboring particles. Conduction tends to be the most significant means of heat transfer within a solid or between solid objects in thermal contact. Heat transfer between the heat source and heat sink, as well as through the heat sink, are conductive transfer. Advection operates by transferring matter with its thermal energy, over space. Convective heat transfer, or convection, is the transfer of heat from one place to another by the movement of fluids, a process that is essentially the transfer of heat via mass transfer, and usually combines effects of heat conduction within the fluid (diffusion) and heat transference by bulk fluid flow streaming.

Convective cooling is sometimes described as Newton's law of cooling: The rate of heat loss of a body is proportional to the temperature difference between the body and its surroundings. Convective cooling deviates from this "law", and is not linearly dependent on temperature gradients, and in some cases is strongly nonlinear.

radiative transfer between two objects is described by and T is the absolute temperature (in Kelvin or Rankine).

Radiance or spectral radiance is a measure of the quantity of radiation that passes through or is emitted. Radiant barriers are materials that reflect radiation, and therefore reduce the flow of heat from radiation sources. The effectiveness of a radiant barrier is indicated by its reflectivity, which is the fraction of radiation reflected. A material with a high reflectivity (at a given wavelength) has a low emissivity (at that same wavelength), and vice versa. At any specific wavelength, reflectivity=1−emissivity.

A heat sink tends to decrease the maximum temperature of the exposed surface, because the power is transferred to a larger volume. This leads to a possibility of diminishing return on larger heat sinks, since the radiative and convective dissipation tends to be related to the temperature differential between the heat sink surface and the external medium. Therefore, if the heat sink is oversized, the efficiency of heat shedding is poor. If the heat sink is undersized, the object may be insufficiently cooled, the surface of the heat sink dangerously hot, and the heat shedding not much greater than the object itself absent the heat sink.

A heat sink transfers thermal energy from a higher temperature to a lower temperature fluid or gas medium, by a process such as radiation, convection, and diffusion. The fluid medium is frequently air, but can also be water or in the case of heat exchangers, oil, and refrigerants. Fourier's law of heat conduction, simplified to a one-dimensional form in the direction x, shows that when there is a temperature gradient in a body, heat will be transferred from the higher temperature region to the lower temperature region. The rate at which heat is transferred by conduction, $q_k$, is proportional to the product of the temperature gradient and the cross-sectional area through which heat is transferred:

$$q_k = kA\frac{dT}{dx} \quad (1)$$

where $q_k$ is the rate of conduction, k is a constant which depends on the heat-conducting material, A is the surface area through which the heat is conducted, and dT/dx is the temperature gradient, i.e., the rate of change of temperature with respect to distance (for simplicity, the equation is written in one dimension). Thus, according to Fourier's law (which is not the only consideration by any means), heat sinks benefit from having a large surface area exposed to the medium into which the heat is to be transferred.

When dust settles on a heat sink, the area changes (typically increases, but by coating a microstructured surface, the area may decrease), and the constant k will typically decrease, since the dust is not an optimized heat transfer material, and often is a heat insulating material. The result is significant loss of heat sink efficiency. The tendency of a surface to accumulate dust is therefore a factor in its efficient use as a heat transfer surface with respect to a flowing medium.

Consider a heat sink in a duct, where air flows through the duct, and the heat sink base is higher in temperature than the air.

Fourier's law of heat conduction, simplified to a one-dimensional form in the x-direction, shows that when there is a temperature gradient in a body, heat will be transferred from the higher temperature region to the lower temperature region. Assuming conservation of energy, for steady-state conditions, and applying the convection-cooling law, also known as the Newton's law of cooling, gives the following set of equations.

$$Q = mc_{p,in}(T_{air,out} - T_{air,in}), \quad (2), (3), (4)$$

$$Q = \frac{T_{hs} - T_{air,av}}{R_{hs}}, \text{ where } T_{air,av} = \frac{T_{air,out} + T_{air,in}}{2}$$

and Q is the first derivative of the thermal energy over time $$-Q = \frac{dQ}{dt}$$

Using the mean air temperature is an assumption that is valid for relatively short heat sinks. When compact heat exchangers are calculated, the logarithmic mean air temperature is used. m is the first derivative of mass over time, i.e., the air mass flow rate in kg/s.

The above equations show that when the airflow through or around the heat sink decreases, this results in an increase in the average air temperature. This in turn increases the heat sink base temperature. And additionally, the thermal resistance of the heat sink will also increase. The net result is a higher heat sink base temperature. The inlet air temperature relates strongly with the heat sink base temperature. Therefore, if there is no air or fluid flow around the heat sink, the energy dissipated to the air cannot be transferred to the ambient air. Therefore, the heat sink functions poorly.

The fractal or branching architecture may be compelled by the thermal transfer design, or other design constraint. For example, a fractal antenna may also serve as a heat sink, with the fractal features not critically optimized as comparted to other designs with respect to heat shedding. See, Casanova, Joaquin J., Jason A. Taylor, and Jenshan Lin. "Design of a 3-D fractal heat sink antenna." Antennas and Wireless Propagation Letters, IEEE 9 (2010): 1061-1064. See also, Dannelley, Daniel. Enhancement of extended surface heat transfer using fractal-like geometries. Diss. The University of Alabama TUSCALOOSA, 2013; and Lee, S. R., Li, Z. G., Wang, B. G., Chiou, H. S., 2005, "An Application of the Fractal Theory in the Design of Heat Sink for Precision Measurement Instrument," Key Engineering Materials, 295-296, pp. 717-722.

If a heat sink is initially optimized, the accretion of dust at the surface will de-optimize the air flows and heat conductivity of heat sink fins, and also decrease efficiency on that basis. On the other hand, the surface may be optimized to efficiently operate over a range of dust conditions, such that the clean surface is not necessarily the design target. Various methods have been proposed for removing dust from heat sink fins, including vibration. See, U.S. 20070058346; 20080121373; 20080121374; 20090272404; U.S. Pat. Nos. 6,544,309; 5,566,377; 8,203,840; 8,400,766), air jets, and the like. See also, U.S. Pat. No. 6,679,272; US20060260638; WO2008086479A2; US 20130206165; U.S. Pat. Nos. 6,276,370; 7,614,406; 7,238,085; 5,834,871; US 20050003737; U.S. Pat. No. 6,002,588; US 20080017219; US 20130312787; US 20050003737.

In a heat sink shedding heat to a flowing medium, assuming that the local energy released and acoustic emissions are insignificant with respect to the shed heat load, a local turbulence will increase the heat transfer efficiency. See, thermal.ferrotec.com/technology/thermoelectric-reference-guide/thermalref05/; www.thermalsoftware.com/optimum_sink_fan.pdf. Dust accumulation can increase local turbulence, and in turbulent flow zones, the dust accumulation may not be uniform.

A heat sink may have impaired efficiency when: (a) pin fins have a lot of surface area, but the pins are so close together that air has a hard time flowing through them; (b) aligning a heat sink so that the fins are not in the direction of flow; (c) aligning the fins horizontally for a natural convection heat sink. Whilst a heat sink is stationary and there are no centrifugal forces and artificial gravity, air that is warmer than the ambient temperature always flows upward, given essentially-still-air surroundings; this is convective cooling.

The most common heat sink material is aluminum. Chemically pure aluminum is not used in the manufacture of heat sinks, but rather alloys en.wikipedia.org/wiki/Aluminium_alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively. The aforementioned values are dependent on the temper of the alloy. Copper is also used since it has around twice the conductivity of aluminum, but is three times as heavy as aluminum. Copper is also around four to six times more expensive than aluminum, but this is market dependent. Aluminum has the added advantage that it is able to be extruded, while copper cannot. Copper heat sinks are machined and skived. Another method of manufacture is to solder the fins into the heat sink base. Diamond is another possible heat sink material, typically limited in use by cost and fabrication issues. With a thermal conductivity value of 2000 W/m·K, it exceeds that of copper by a factor of five. In contrast to metals, where heat is conducted by delocalized electrons, lattice vibrations are responsible for diamond's very high thermal conductivity. For thermal management applications, the outstanding thermal conductivity and diffusivity of diamond are essential. CVD diamond may be used as a sub-mount for high-power integrated circuits and laser diodes.

Composite materials also can be used. Examples are a copper-tungsten pseudoalloy en.wikipedia.org/wiki/Copper-tungsten, AlSiC (Silicon-Carbide in aluminum matrix, en.wikipedia.org/wiki/AlSiC, Dymalloy (diamond in copper-silver alloy matrix, en.wikipedia.org/wiki/Dymalloy), and E-material (beryllium oxide particles in a beryllium matrix, hen.wikipedia.org/wiki/E-Material). Such materials are often used as substrates for chips, as their thermal expansion coefficient can be matched to ceramics and semiconductors.

Fin efficiency is one of the parameters which make a higher thermal conductivity material important. A fin of a heat sink may be considered to be a flat plate with heat flowing in one end and being dissipated into the surrounding fluid as it travels to the other. As heat flows through the fin, the combination of the thermal resistance of the heat sink impeding the flow and the heat lost due to convection, the temperature of the fin and, therefore, the heat transfer to the fluid, will decrease from the base to the end of the fin. This factor is called the fin efficiency and is defined as the actual heat transferred by the fin, divided by the heat transfer were the fin to be isothermal (hypothetically the fin having infinite thermal conductivity). Equations 5 and 6 are applicable for straight fins.

$$\eta_f = \frac{\tanh(mL_c)}{mL_c}, mL_c = \sqrt{\frac{2h_f}{kt_f}L_f} \qquad (5), (6)$$

Where $h_f$ is the heat transfer coefficient (en.wikipedia.org/wiki/Heat_transfer_coefficient) of the fin (Air: 10 to 100 W/(m²·K), Water: 500 to 10,000 W/(m²·K)); k is the thermal conductivity (en.wikipedia.org/wiki/Thermal_conductivity) of the fin material (Aluminum: 120 to 240 Watt/m²K)); $L_f$ is the fin height (m); and $t_f$ is the fin thickness (m).

Another parameter that concerns the thermal conductivity of the heat sink material is spreading resistance. Spreading resistance occurs when thermal energy is transferred from a small area to a larger area in a substance with finite thermal conductivity. In a heat sink, this means that heat does not distribute uniformly through the heat sink base. The spreading resistance phenomenon is shown by how the heat travels from the heat source location and causes a large temperature gradient between the heat source and the edges of the heat sink. This means that some fins are at a lower temperature than if the heat source were uniform across the base of the heat sink. This non-uniformity increases the heat sink's effective thermal resistance.

A pin fin heat sink is a heat sink that has pins that extend from its base. The pins can be, for example, cylindrical, elliptical or square/geometric polygonal. A second type of heat sink fin arrangement is the straight fin. These run the entire length of the heat sink. A variation on the straight fin heat sink is a cross cut heat sink. A straight fin heat sink is cut at regular intervals but at a coarser pitch than a pin fin type.

In general, heat sink performance is correlated with surface area. However, this is not always true, since the actual heat dissipation is influenced by thermal gradients and convective flow, each of which is independent of surface area per se. The concept of a pin fin heat sink is to try to pack as much surface area into a given volume as possible, and often has low orientation dependence. (Because of convective flow, orientation with respect to the gravitational vector is often an issue in heat sinks).

T. Kordyban, "Hot air rises and heat sinks—Everything you know about cooling electronics is wrong", ASME Press, NY 1998 compares performance of a pin fin and a straight fin heat sink of similar dimensions. Although the pin fin has 194 cm² surface area while the straight fin has 58 cm², the temperature difference between the heat sink base and the ambient air for the pin fin is 50° C. For the straight fin it was 44° C. or 6° C. better than the pin fin. Pin fin heat sink performance is significantly better than straight fins where the fluid flows axially along the pins rather than only tangentially across the pins.

Another configuration is the flared fin heat sink; its fins are not parallel to each other, but rather diverge with increasing distance from the base. Flaring the fins decreases flow resistance and makes more air go through the heat sink fin channel; otherwise, more air would bypass the fins. Slanting them keeps the overall dimensions the same, but offers longer fins. Forghan, et al. have published data on tests conducted on pin fin, straight fin and flared fin heat sinks. See, Forghan, F., Goldthwaite, D., Ulinski, M., Metghalchi, M., Experimental and Theoretical Investigation of Thermal Performance of Heat Sinks, ISME, May. 2001. They found that for low approach air velocity, typically around 1 m/s, the thermal performance is at least 20% better than straight fin heat sinks. Lasance and Eggink also found that for the bypass configurations that they tested, the flared heat sink performed better than the other heat sinks tested. See, Lasance, C. J. M and Eggink, H. J., A Method to Rank Heat Sinks in Practice: The Heat Sink Performance Tester, 21st IEEE SEMI-THERM Symposium 2001.

The heat transfer from the heat sink is mediated by two effects: conduction via the coolant, and thermal radiation. The surface of the heat sink influences its emissivity; shiny metal absorbs and radiates only a small amount of heat, while matte black is a good radiator. In coolant-mediated heat transfer, the contribution of radiation is generally small. A layer of coating on the heat sink can then be counterproductive, as its thermal resistance can impair heat flow from the fins to the coolant. Finned heat sinks with convective or forced flow will not benefit significantly from being colored. In situations with significant contribution of radiative cooling, e.g., in case of a flat non-finned panel acting as a heat sink with low airflow, the heat sink surface finish can play an important role. Matte-black surfaces will radiate much more efficiently than shiny bare metal. The importance of radiative vs. coolant-mediated heat transfer increases in situations with low ambient air pressure (e.g., high-altitude operations) or in vacuum (e.g., satellites in space). See, Fourier, J. B., 1822, Theorie analytique de la chaleur, Paris; Freeman, A., 1955, translation, Dover Publications, Inc., NY; Kordyban, T., 1998, supra.; Bandon Munis, "Heat Sink Selection", Thermal Management of Electronics, Mechanical Engineering Department, San Jose State University [Aug. 6, 2006], www.sjsu.edu/people/nicole.okamoto/courses/me_146/Heat%20Sink.ppt; http://portal.unimap.edu.my/portal/page/portal30/Lecturer%20Notes/kejuruteraan_mikroelektronik/semester%202%20sidang%20akademik%2020132014/emt%20230%20thermodynamics%20in%20electronic1/chapter%207%20thermal%20management%20heat%20sink.ppt; Sergent, J. and Krum, A., 1998, Thermal management handbook for electronic assemblies, First Edition, McGraw-Hill; Incropera, F. P. and DeWitt, D. P., 1985, Introduction to heat transfer, John Wiley and sons, NY; Forghan, F., Goldthwaite, D., Ulinski, M., Metghalchi, M., 2001, Experimental and Theoretical Investigation of Thermal Performance of Heat Sinks, ISME May; Lasance, C. J. M and Eggink, H. J., 2001, A Method to Rank Heat Sinks in Practice: The Heat Sink Performance Tester, 21st IEEE SEMI-THERM Symposium; ludens.cl/Electron/Thermal.html; Lienard, J. H., IV & V, 2004, A Heat Transfer Textbook, Third edition, MIT; Saint-Gobain, 2004, 22 Jul. 2008 assets.sealanddesign.com/files/thermacool-brochure.pdf; Jeggels, Y. U., Dobson, R. T., Jeggels, D. H., Comparison of the cooling performance between heat pipe and aluminium conductors for electronic equipment enclosures, Proceedings of the 14th International Heat Pipe Conference, Florianopolis, Brazil, 2007; Prstic, S., Iyengar, M., and Bar-Cohen, A., 2000, Bypass effect in high performance heat sinks, Proceedings of the International Thermal Science Seminar Bled, Slovenia, June 11-14; Mills, A. F., 1999, Heat transfer, Second edition, Prentice Hall; Potter, C. M. and Wiggert, D. C., 2002, Mechanics of fluid, Third Edition, Brooks/Cole; White, F. M., 1999, Fluid mechanics, Fourth edition, McGraw-Hill International; Azar, A, et al., 2009, Qpedia Thermal E-Magazine, January 2009 Issue; www.qats.com/cpanel/UploadedPdf/January20092.pdf. Several structurally complex heat sink designs are discussed in Hernon, US App. 2009/0321045.

The relationship between resistance to air flow and convection in heat sinks is discussed by Frigus Primore in "A Method for Comparing Heat Sinks Based on Reynolds Analogy," available at akemalhammar.fr/downloads/Reynolds analogy_heat_sinks.PDF. This article notes that for, plates, parallel plates, and cylinders to be cooled, it is necessary for the velocity of the surrounding fluid to be low in order to minimize mechanical power losses. However, larger surface flow velocities will increase the heat transfer efficiency, especially where the flow near the surface is turbulent, and substantially disrupts a stagnant surface boundary layer. Primore also discusses heat sink fin shapes and notes that no fin shape offers any heat dissipation or weight advantage compared with planar fins, and that straight fins minimize pressure losses while maximizing heat flow. Therefore, the art generally teaches that generally flat and planar surfaces are appropriate for most heat sinks.

Frigus Primore, "Natural Convection and Inclined Parallel Plates," www.engineeringclicks.com/natural-convection-and-inclined-parallel-plates/, discusses the use of natural convection (i.e., convection due to the thermal expansion of a gas surrounding a solid heat sink in normal operating conditions) to cool electronics. One of the design goals of various heat sinks is to increase the rate of natural convection, and using parallel plates often attains this result. Parallel plate heat sinks are traditionally considered the most efficient and attempts to define the optimal spacing and angle (relative to the direction of the fluid flow) of the heat sinks according to the equations in FIG. 1:

Optimum Plate Spacing $$S_{opt} = k_s \left(\frac{L}{dT}\right)^{0.25} \cos(\gamma)^{-0.25} \quad (1)$$

$$\gamma_{opt} = \operatorname{atan}\left(\frac{1H}{3W}\right) \quad \frac{H}{W} < \sqrt{3}$$

$$\gamma_{opt} = \frac{\pi}{4} - 0.508\left(\frac{H}{W}\right)^{-1.237} \quad \frac{H}{W} > \sqrt{3}$$

Total Heat Dissipation $$Q = k_v \cdot k_\gamma \cdot A_c \cdot H^{0.5} \cdot dT^{1.5} \quad (2)$$

$$k_\gamma = \sqrt{1 + \frac{1}{9}\left(\frac{H}{W}\right)^2} \quad \frac{H}{W} < \sqrt{3}$$

$$k_\gamma = 0.307 \cdot \left(\frac{H}{W}\right)^{-0.5} + 0.696 \cdot \left(\frac{H}{W}\right)^{-0.5} \quad \frac{H}{W} > \sqrt{3}$$

Applied Equation $$Q = \eta_v \cdot k_v \cdot k_\gamma \cdot A_c \cdot H^{0.5} \cdot dT_{ref}^{1.5}$$

$dT$=Temperature difference (K)

$A_c = W \cdot D$ $\eta_v$=Volumetric efficiency [--]

$$Q\text{=Heat dissipation }[W] \quad (3)$$

"Natural Convection and Chimneys," available at akemalhammar.fr/articels2/parallel_pl_lnc.html, Frigus Primore discusses the use of parallel plates in chimney heat sinks. One purpose of this type of design is to combine more efficient natural convection with a chimney. Primore notes that the design suffers if there is laminar flow (which creates a re-circulation region in the fluid outlet, thereby completely eliminating the benefit of the chimney) but benefits if there is turbulent flow which allows heat to travel from the parallel plates into the chimney and surrounding fluid.

Batten, Paul, et al. "Sub-Grid Turbulence Modeling for Unsteady Flow with Acoustic Resonance," available at www.researchgate.net/publication/269068673_Sub-grid_turbulence_modeling_for_unsteady_flow_with_a-coustic_resonance, discuss that when a fluid is flowing around an obstacle, localized geometric features, such as concave regions or cavities, create pockets of separated flow which can generate self-sustaining oscillations and acoustic resonance. The concave regions or cavities serve to substantially reduce narrow band acoustic resonance as compared to flat surfaces. This is beneficial to a heat sink in a turbulent flow environment because it allows for the reduction of oscillations and acoustic resonance, and therefore for an increase in the energy available for heat transfer.

Liu, S., et al., "Heat Transfer and Pressure Drop in Fractal Microchannel Heat Sink for Cooling of Electronic Chips," 44 Heat Mass Transfer 221 (2007), discuss a heat sink with a "fractal-like branching flow network." Liu's heat sink includes channels through which fluids would flow in order to exchange heat with the heat sink.

Y. J. Lee, "Enhanced Microchannel Heat Sinks Using Oblique Fins," IPACK 2009-89059, similarly discusses a heat sink comprising a "fractal-shaped microchannel based on the fractal pattern of mammalian circulatory and respiratory system." Lee's idea, similar to that of Liu, is that there would be channels inside the heat sink through which a fluid could flow to exchange heat with the heat sink. The stated improvement in Lee's heat sink is (1) the disruption of the thermal boundary layer development; and (2) the generation of secondary flows.

Pence, D. V., 2002, "Reduced Pumping Power and Wall Temperature in Microchannel Heat Sinks with Fractal-like Branching Channel Networks", Microscale Thermophys. Eng. 5, pp. 293-311, mentions heat sinks that have fractal-like channels allowing fluid to enter into the heat sink. The described advantage of Pence's structure is increased exposure of the heat sink to the fluid and lower pressure drops of the fluid while in the heat sink.

In general, a properly designed heat sink system will take advantage of thermally induced convection or forced air (e.g., a fan). In general, a turbulent flow near the surface of the heat sink disturbs a stagnant surface layer, and improves performance. In many cases, the heat sink operates in a non-ideal environment subject to dust or oil; therefore, the heat sink design must accommodate the typical operating conditions, in addition to the as-manufactured state.

Therefore, two factors appear to conflict in optimizing the configuration of an external heat sink: the surface configuration designed to disturb laminar flow patterns, create turbulence, and enhance convective heat transfer, and the desire to efficiently flow large volumes of heat transfer fluid (e.g., air), over the surfaces, which is enhanced by laminar (smooth) flow. Even in passive dissipative device, convective flow may be a significant factor, and reducing air flow volume and velocity by increasing the effective impedance can be counterproductive. On the other hand, in some cases, the amount of energy necessary to move the air is dwarfed by the problem to be solved. In many computing systems, the processors are thermally constrained, that is, the functioning of the processor is limited by the ability to shed heat. In such cases, innovative ways to improve the efficiency of heat transfer may yield significant benefit, even if in some regimes of operation, they impose certain inefficiencies.

Prior art heat sink designs have traditionally concentrated on geometry that is Euclidian, involving structures such as the pin fins, straight fins, and flares discussed above.

N J Ryan, D A Stone, "Application of the FD-TD method to modelling the electromagnetic radiation from heat sinks", IEEE International Conference on Electromagnetic Compatibility, 1997. 10th (1-3 Sep. 1997), pp: 119-124, discloses a fractal antenna which also serves as a heat sink in a radio frequency transmitter.

Lance Covert, Jenshan Lin, Dan Janning, Thomas Dalrymple, "5.8 GHz orientation-specific extruded-fin heat sink antennas for 3D RF system integration", 23 Apr. 2008 DOI: 10.1002/mop.23478, Microwave and Optical Technology Letters Volume 50, Issue 7, pages 1826-1831, July 2008 also provide a heat sink which can be used as an antenna.

Wang, Chien-Chang, Chen-I. Hung, and Wei-Hsin Chen. "Design of heat sink for improving the performance of thermoelectric generator using two-stage optimization." Energy 39, no. 1 (2012): 236-245 address various design parameters of a heat sink for dissipating heat from a thermoelectric module. See also Ledezma, G., Al M. Morega, and A. Bejan. "Optimal spacing between pin fins with impinging flow." Journal of heat transfer 118, no. 3 (1996): 570-577; Kobus, C. J., and T. Oshio. "Development of a theoretical model for predicting the thermal performance characteristics of a vertical pin-fin array heat sink under combined forced and natural convection with impinging flow." International Journal of heat and mass transfer 48, no. 6 (2005): 1053-1063; Khan, W. A., J. R. Culham, and M. M. Yovanovich. "Optimization of pin-fin heat sinks using entropy generation minimization." In Thermal and Thermomechanical Phenomena in Electronic Systems, 2004. ITHERM'04. The Ninth Intersociety Conference on, vol. 1, pp. 259-267. IEEE, 2004; Duan, Zhipeng, and Y. S. Muzychka. "Experimental investigation of heat transfer in impingement air cooled plate fin heat sinks." Journal of electronic packaging 128, no. 4 (2006): 412-418; Kobus, C. J., and T. Oshio. "Predicting the thermal performance characteristics of staggered vertical pin fin array heat sinks under combined mode radiation and mixed convection with impinging flow." International Journal of Heat and Mass Transfer 48, no. 13 (2005): 2684-2696; Yu, Enchao, and Yogendra Joshi. "Heat transfer enhancement from enclosed discrete components using pin-fin heat sinks." International Journal of Heat and Mass Transfer 45, no. 25 (2002): 4957-4966; Yu, Xiaoling, Jianmei Feng, Quanke Feng, and Qiuwang Wang. "Development of a plate-pin fin heat sink and its performance comparisons with a plate fin heat sink." Applied thermal engineering 25, no. 2-3 (2005): 173-182; Huang, Cheng-Hung, Jon-Jer Lu, and Herchang Ay. "A three-dimensional heat sink module design problem with experimental verification." International Journal of Heat and Mass Transfer 54, no. 7-8 (2011): 1482-1492; Li, Hung-Yi, Ming-Hung Chiang, and Kuan-Ying Chen. "Performance analysis of pin-fin heat sinks with confined impingement cooling." IEEE transactions on components and packaging technologies 30, no. 3 (2007): 383-389; Zhao, Z., and C. T. Avedisian. "Enhancing forced air convection heat transfer from an array of parallel plate fins using a heat pipe." International journal of heat and mass transfer 40, no. 13 (1997): 3135-3147; Khan, Waqar Ahmed, J. Richard Culham, and M. Michael Yovanovich. "Modeling of cylindrical pin-fin heat sinks for electronic packaging." Ieee Transactions On Components And Packaging Technologies: A Publication Of The Ieee Components, Packaging, And Manufacturing Technology Society 31, no. 3 (2008): 536; Peles, Yoav, Ali Koşar, Chandan Mishra, Chih-Jung Kuo, and Brandon Schneider. "Forced convective heat transfer across a pin fin micro heat sink." International Journal of Heat and Mass Transfer 48, no. 17 (2005): 3615-3627; Furukawa, Takahiro, and Wen-Jei Yang. "Reliability of heat sink optimization using entropy generation minimization." In 8th AIAA/ASME Joint Thermophysics and Heat Transfer Conference, p. 3216. 2002.

Li, Hung-Yi, Shung-Ming Chao, and Go-Long Tsai. "Thermal performance measurement of heat sinks with confined impinging jet by infrared thermography." International Journal of Heat and Mass Transfer 48, no. 25-26 (2005): 5386-5394 discusses use of infrared thermography to assess heat sink performance. According to the present technology, this may be used for real-time feedback and adaptive air flow control, e.g., nozzle positioning and air flow control. Indeed, while typically, the most efficient cooling will result from directing the air flow toward a hot spot, this is not necessarily the case, since the air flow effects are no-linear and interactive with other parameters. Therefore, a multiobjective optimization may be employed. Kanyakam, Siwadol, and Sujin Bureerat. "Multiobjective evolutionary optimization of splayed pin-fin heat sink." Engineering Applications of Computational Fluid Mechanics 5, no. 4 (2011): 553-565.

Perforations in heat sink fins are known. See, Shaeri, M. R., M. Yaghoubi, and K. Jafarpur. "Heat transfer analysis of lateral perforated fin heat sinks." Applied energy 86, no. 10 (2009): 2019-2029.

See, U.S. 20140098542; 20130309778; 20130286666; 20130155687; 20130042893; 20120174650; 20120031272; 20110280019; 20110226460; 20090045967; 20090021270; 20070041159; 20060072289; U.S. Pat. Nos. 8,784,540; 8,764,243; 8,602,599; 8,539,840; 8,506,674; 8,491,683; 7,696,890; 7,113,402; and 5,856,836.

SUMMARY OF THE INVENTION

In a preferred embodiment, a heat sink employed according to the present technology provides a branched network of elements. The network branching may be according to a fractal pattern, or have affine or self-similar characteristics at various scales. For example, there may be three levels within a hierarchy with two intervening branch points, e.g., a single base, with 2-4 first level branches, 4-16 second level branches and, possibly, 8-32 third level branches. The branching pattern may be uniform or non-uniform/asymmetric. For example, a branching node location and characteristics may be dependent on prior branching and a heat flow. The space-filling pattern may be defined based on various spatial characteristics and constraints.

In other cases, the structure is expressed in terms of iterations of an iterated function system, which may produce a structure which is not branched per se. See, en.wikipedia.org/wiki/Iterated function system.

For example, in a computer system, a power supply with a fan may be located near the heat sink. It will therefore create an environmental asymmetry, to which the design of the heat sink may respond. Likewise, the heat sink may be within a physical enclosure, and may have an asymmetric ventilation path, all leading to an asymmetric optimized design for the external heat sink shape and characteristics. Further, the branching itself may be asymmetric, such that a larger portion of the heat flow is transmitted down a larger branch, while a smaller portion is transmitted down a narrower branch. However, due to geometry, the ratio of surface area ($\sim 2\pi r$) to cross section area ($\sim \pi r^2$)$\approx(2/r)$ is smaller for the larger branch than the smaller one, leading to a greater heat dissipation efficiency for the smaller branch, just distal to the branching point, than the larger branch. Meanwhile, the larger branch more efficiently carries the heat load away from the branching point, and thus reduces competition for convective heat loss near the branching point with respect to a narrower branch. Therefore, a fractal design, with asymmetric branching, can optimize the heat dissipation of the heat sink over space. Further, because the branching may be defined algorithmically, the various environmental and spatial factors may all play a role in an iterative optimized design, herein referred to as a fractal heat sink.

According to the present technology, a fractal device is used to enhance heat transfer from a heat sink, as compared to a heat sink structure which seeks to maintain laminar flows, such as a parallel plate heat sink. According to a preferred embodiment the fractal nature is observed at two difference scale ranges, though, as discussed above, the turbulent flow heat transfer medium may interact with a non-fractal structure.

The large scale optimization may have distinct operating regimes from the small scale or texture scale, making the implementation of a single optimization algorithm challenging and, possibility, difficult to manufacture. The present technology may provide a second scale of optimization, addressing e.g., the surface configuration, such as texture, perforations, and micro-aerodynamic features. These texture scale features may also be of a fractal nature. The texture-scale optimization may involve features represented only within a single or two levels of size scale, though the underlying optimization may involve a higher number of iterations. Typically, the various fractal geometries will have different Hausdorff (fractal) dimensions.

While the two regimes may be provided with a smooth transition, it is also possible to provide an arbitrary or manufacturing-feasibility driven transition between the two different schemes of optimization. Of course, the composite heat sink may be modelled and optimized in toto, with modifications made to the design as may be appropriate.

The use of two (or more) different schemes (or algorithms) of optimization, both of which may be fractal/affine in nature (resulting in two or more fractal geometries with different Hausdorff dimensions), is referred to herein as a doubly-fractal or multi-fractal design. It is noted that the technology is not limited to designs in which each scale of optimization is per se fractal, and as such, one or both scale of features may be symmetric or non-iteratively defined, without departing from the essential elements of the technology.

In general, the optimal high level features, e.g., the branch point and branching ratios, proceed from a unitary base of the heat sink, while the optimal low level features, e.g., textures, proceed from the geometric boundaries of the terminal surfaces of the high level features.

When considered in a three dimensional space, with a flow of a heat transfer medium about the surfaces of the heat sink, a fractal (roughly self-similar over a range of scales) configuration can be implemented which optimizes for flow resistance, heat transfer efficiency, peak temperatures, acoustic emissions as a function of frequency, mass and/or cost of materials, predicted dust accumulation/cleanliness after extended operation (and self-cleaning efficiency), and other factors. The efficiency of heat transfer is dependent on various factors, such as temperature differential; therefore, one design aspect seeks to shed the most heat near the heat source (typically the base of the heat sink), and thus the thermal transfer medium flow rate may be highest at that region, with a high efficiency heat transfer material providing the heat flow path from the source to the shedding surface. On the other hand, at the margins of the device, the thermal differentials will be low, and therefore a higher surface area with lower flow rates may be more optimal. The high surface area may correspond to a region of reduced heat transfer medium flow rate, and possibly significantly higher flow impedance.

Heat transfer efficiency is a function of the heat sink temperature distribution, heat transfer medium temperature and heat capacity, heat sink aerodynamic properties, heat sink surface heat transfer properties, and heat transfer medium flow properties, etc.

The optimization may employ one or more cost function, applied during the design phase for the heat sink system, and/or to supply the operational parameters of the system in use. The heat sink is typically required to maintain the system within normal operational parameters, minimize temperature excursions (and associated thermal stresses), and to operate with minimum cost, e.g., fan operating power, and objectionable noise. Static design optimization-phase cost function parameters include size, cost, capacity, efficiency of operation, etc.

The present technology may provide a dual level fractal heat sink, having a spatial configuration with a fractal design, e.g., a multilevel branching design, and a surface pattern with a fractal design, typically of a different type from the spatial configuration fractal design. The surface fractal may be, for example, a perforation pattern in a thin plate, or a texture on a smooth surface. Typically, the fractal generative algorithm for the configuration will be non-interactive or minimally interactive with the surface fractal generative algorithm, though at the overlap or interface between the regimes, some interaction or hybridization may occur.

Existing heat sinks typically achieve the primary objective of maintaining the cooled system within their operating range and maintaining a sufficiently low thermal volatility. Therefore, the advantages sought by the present technology are decreased acquisition cost, operating cost, size, etc. Acquisition cost is a function of materials cost and fabrication. While fabrication cost can vary based on many factors, materials cost may be estimated based on commodities value, especially where the heat sink is typically formed of aluminum or copper. Thus, for a homogeneous heat sink, the material and mass of the heat sink sets a lower bound on the acquisition cost. The operating cost is typically set by the power consumed in causing the heat transfer medium to flow, e.g., a blower or fan for air flowing over the heat sink. Therefore, the heat sink according to the present technology may provide a design with lower mass and lower operating energy cost. Lower energy cost may be achieved by providing a lower thermal impedance (absolute) for equivalent thermal performance. Lower materials cost can be achieved by providing a higher surface area or surface heat shedding efficiency per unit mass. The present technology therefore provides an optimized design for at least one of reduced fabrication cost and/or material cost, and improved operating efficiency.

One advantage of a fractal or iterated function system-based solution to this optimization is that it inherently avoids narrow band resonance because, both within the structure and for a heat transfer fluid interacting with the structure, distances are not simple linear or geometric integer multiples. Further, in a fractal branched architecture (if the structure is itself branched), the cross section area tends to increase with distance from the root, similar to an animal vascular system, thus increasing the efficiency as the system increases in size.

The second level fractal serves a different purpose from the first level, and typically has a different scale range, fractal pattern, and purpose. The second level modifies the surface texture to enhance heat transfer. The texture increases radiative and convective heat transfer. The fractal texture is efficient as it tends to reduce surface-to-surface radiative recapture, surface boundary layers, and acoustic emissions. If the scale range of the first and second levels are generally non-overlapping, they may be separately optimized, and the generative algorithms may be independently defined. Alternately, they may be coupled.

Optimization of the surface configuration of the heat sink may be dependent on temperature differential with respect to the cooling medium; local cooling medium characteristics (heat capacity, density, temperature, viscosity); flow vector (direction, rate); radiative absorption and dissipation; noise/acoustic emission; fluid flow resistance; source/control over flow; change over time due to debris; and dynamic changes in heat load.

The optimization of the gross geometry of the heat sink is defined by mechanical constraints; convective and forced cooling fluid flow patterns including intake and exhaust, and flow patterns; heat sink material characteristics; thermally induced changes in shape (may be intentional); branching and/or spatial morphology pattern, etc.

The entire structure has a maximum size on the order of centimeters or meters, and a minimum controlled feature size of tens of microns or mm, therefore, the device has a scale range of at most $\sim 10^4$ ($\sim 2^{13}$) (meter scale with 10 μm scale features) and a minimum $\sim 10^1$ ($2^3$) (cm scale with mm scale features). A fractal-type arrangement typically operates over a range of $>2^1$-$2^2$, and the fractal algorithm can be constrained to optimize the entire scale range. However, such an algorithm may generate designs that cannot be manufactured in a cost-effective manner, or impose strict requirements and tolerances for marginal gains. On the other hand, significant purposes of the fractal geometry may be achieved by employing fractal design principles over a subset of the scale range. Likewise, in many instances, the benefits may be achieved using approximately fractal designs, rather than requiring implementation strictly according to a fractal formula. For example, it may be found that the effects of compliance with a fractal design formula over certain scales are less important than uncontrolled air humidity or temperature. If the uncontrolled variables dwarf the controlled ones, then it is likely that, over that range, strict compliance with the formula is non-essential. Note that, if the structure deviates from the generating formula over a scale range, that any smaller scale range should be optimized based on the actual configuration, and not the theoretical one.

The resulting structure therefore has many different factors which influence optimization, some of which overlap. Indeed, there is no limit of two levels of optimization, and rather there may be multiple levels. Because each level requires a scale range (e.g., $2^1$ to $2^4$), and the transition between scales should be discrete (in order to define two separate optimizations rather than a single continuum), it is seen that a typical system would be limited to 2-4 levels of size ranges. For example, in a medium scale, between the gross morphology and average heat distribution over space, and the surface texture and aerodynamic effects for convective heat transfer, a middle scale may be provided which optimizes convective channeling of the heat transfer fluid proximate to the heat sink structure. As discussed above, each level may be asymmetric, symmetric, or arbitrary (e.g., human heuristic), and may have an optimized transition between levels, a smoothed transition or an abrupt transition.

The surface texture (small scale features) may be mapped onto the morphology (large scale features), and as such, only at the terminal branches of the heat sink do the scales of a dual scale heat sink overlap, in which case the mapping algorithm for applying the texture can account for the termini (without requiring interactive modification of the morphology). In the case of a >2 scale level design, each scale transition can be blended or fit. Typically, in the transition region, the changeover will be defined more by functionally defined prohibitions than by blending rules. For example, a transition zone that creates unnecessary turbulence in air flow without contributing materially to heat transfer would be disallowed, while a piecewise fit approximation that does not cause large heat transfer efficiency discontinuities would be permitted, even if not formally optimized according to an algorithm.

Typically, a design in accordance with the present technology will display a change in pattern within at least one particular scale range, as opposed to a uniform pattern mapped on a lower scale structure. Of course, in an embodiment with two or more scale ranges, only a single such scale range should represent a fractal (affine or self-similar, or iterated function system) design, and the others may be defined by different paradigms. Indeed, according to one embodiment, characteristics of one or more scale range is predefined, and a self-optimizing algorithm with fractal characteristics is run to optimize the further design with the predetermined scale range characteristics as a limit or constraint. Thus, for example, a surface texture, which may be defined by a manufacturing process, may be selected as the highest scale feature. Underlying this texture is an arrangement of surfaces and the radiative and convective heat transfer to the surfaces, while at the lowest level is the mechanical constraints of the heat source, heat transfer fluid flow patterns, fan (if any), intake, exhaust, adjacent structures, etc. In this case, the lowest level and the highest level both have significant constraints which are not controlled by any fractal algorithm, and therefore the purpose of the algorithm is to optimize the heat transfer and efficiency issues between the constraints.

According to another example, a textured surface coating is applied to a base structure with a smooth surface, wherein the texturing is mildly dependent on the shape of the underlying surface. In this case, the algorithm that defines the smooth surface configuration is also dependent on the characteristics of the surface coating and its application technology. However, by controlling the underlying surface morphology, the surface texture is also modified, resulting in spatial variations in texture in addition to the spatial variations in symmetry/shape. An example of such a surface texture material is wrinkle (crinkle) paint, whose resulting texture is dependent on coating thickness underlayer, drying, etc. For example, a wrinkle paint may be formed of a high thermal transfer material, such as copper powder. The coating need not be formed over the entire heat sink, and thus it may be selectively applied to regions where the higher surface area and flow disruption are beneficial. Typically, the wrinkle paint would result in a high flow impedance, and therefore is preferred to be applied on low surface velocity or "hot" portions of the device, where the high surface area and/or turbulent flow may be beneficial in spite of the lower flow efficiency. On the other hand, in regions with lower thermal differentials, a smooth surface may be preferred. Indeed, the algorithm for defining the morphology of the heat sink may be dependent on the resulting characteristics of deposition process of a coating on the heat sink; that is, the shape of the heat sink may be optimized for the deposition process for the coating, to intentionally apply an uneven coating thickness.

In a design according to the present technology, the small and large scale features may be overlapping or non-overlapping. That is, in some cases, there is a gap between the smallest scale features addressed by the large scale feature definitions, and the largest feature addressed by the small scale feature definitions, in which case these may be non-interactive or weakly interactive, and may be defined separately or purely sequentially. On the other hand, where the scales overlap or are nearly contiguous, it may be desirable to optimize both scales to avoid a discontinuity at the boundary, which may require a dual-optimization.

The heat sink may be designed to work in conjunction with a variable fan structure, which may vary in speed/air volume, impingement direction(s), etc. Further, because the heat dissipation efficiency is a function of temperature differential, the design may have an oscillating fan that exposes different portions of the heat sink to air flows over time, with the result that temperatures in various portions of the heat sink also oscillate. While such a design will optimally be larger than a static heat sink, it may also display higher energy efficiency at low loads, while having a higher peak dissipation capacity.

The fluid flow process, especially under dynamically changing conditions, can be complex. For example, the flow can cause turbulent flow around the heat exchange elements, which induce complex pressure differentials, vibrations, and inertial flow patterns. Dynamically changing the flow rate or flow pattern can help distribute the turbulent dynamics over various regions of the heat sink surface. Thus, the entire surface of the heat sink need not be subject to continual high fluid flow rates, and only a small portion of the surface at any given time might be subject to a "jet" of fluid flow, thus reducing the energy disadvantage. The jet may be strategically focused on portions of the heat sink. When the jet (or more generally, high flow rate stream) is focused or directed at the hot portion of the heat sink, higher convective heat transfer will occur. However, discontinuous high flow rates may be advantageous, since a reduced fluid flow on a region will tend to cause a diffusive heat transfer to the heat transfer material underlying the cooled surface, and thus lead to higher efficiency heat transfer when the jet or stream returns. Meanwhile, the jet or stream can be directed to other portions of the heat sink. This, in turn, causes dynamic temperature gradients within the heat sink, which can be controlled to cause pulsatile heating at the periphery of the heat sink, especially in a branched network. Thus, for example, in a fractal branched heat sink, the stream of fluid can be controlled to permit various regions of the heat sink to undergo heating and cooling cycles, such that the hot spots on the heat sink are dynamically controlled to be selectively cooled.

A model of the process may be employed as part of the design of the heat sink or thermal transfer structure, or as a part of a control system for its operation. Available control parameters include heat transfer medium characteristics (e.g., in air, density, humidity, liquid [water] droplets, etc.), bulk flow rate, bulk flow vector, inhomogeneous flow characteristics (e.g., jets, asymmetries, spiral flows, vibrations and resonances, turbulence, etc.), structural configuration (e.g., spacings and angles, aperture patency, etc.), internal heat flow control (e.g., microchannels, heat pipes, continuity of heat flow paths, etc.), radiative characteristics, surface roughness, etc.

The control system, which e.g., controls a fan speed or other or more complex system, may be dependent on sensors, such as thermal sensors (thermistors, thermocouples, bipolar junctions, etc.), thermal cameras, passive infrared sensors, optical cameras reading thermally responsive coatings on the heat sink, or the like, may be used to monitor internal and/or surface temperatures of the heat sink, and adaptively supply coolant as appropriate. Sensors may also be used to detect surface contamination of the heat sink, and a need for removal of the contamination, which may be by the fluid jet, vibrational excitation, or other means. The heat sink design may, in turn, be optimized for the limited degrees of freedom available to a dynamically adjustable fluid flow control system, for example exposing small area hotter portions of the heat sink to high-flow cooler heat transfer medium, while exposing large area cooler portions of the heat sink surface to lower flow rate, potentially warmer medium (but, below the surface temperature). Likewise, in cases where the heat transfer medium is heated past the equilibrium point of the nearby heat sink structures, it should be shed from the heat sink, while heat transfer medium cooler than the equilibrium point of the nearby structures should be directed to those structures to provide additional cooling, where the flow does not reduce efficiency. This may be altered dynamically, by providing flow dampers to control exhaust paths of the heat transfer fluid through the heat sink structure, which will typically be an asymmetric 3D structure, which will typically include fluid flow channels or spaces.

The fluid flow over the heat sink surface can also cause acoustic resonance, which in the case of a heat sink having a fractal geometry, can be, in the aggregate, a broadband resonance. In many cases, acoustic emissions from a heat sink system are undesirable, and should be minimized. However, in some cases, certain acoustic emissions are acceptable, and may be specifically exploited to cause a thinning or disruption of the surface boundary layer of heart transfer medium, thus increasing heat transfer efficiency. When an acoustic resonance occurs, this increases the bulk flow of heat transfer medium particles, and as such may increase mixing at the interface. Turbulence near the interface will typically directly disrupt the boundary layer. In each case, this may be exploited to improve the heat transfer efficiency. It is noted that, in a contained system, a number of options are available to reduce net acoustic emissions, even when internal sounds are generated. According to one option, acoustic filters are employed, which are typically passive. According to another option, active noise cancellation is employed, in which the phase and amplitude of acoustic vibrations at a location, which is typically constructed to be a port representing a node having homogeneous acoustic properties, is predicted based on an acoustic sensor, e.g., a microphone. An actuator is then driven which seeks to reduce the net acoustic emissions at the port. Advantageously, this actuator is configured to increase or reinforce interface acoustic effects, so that the active noise cancellation itself serves to increase heat transfer by reducing or disrupting the surface boundary layer of the heat transfer medium.

The heat transfer medium flow can be controlled or provided in a pulsatile or oscillating manner, causing inertial transfer of energy to medium or debris on the surface, resulting in separation from the underlying heat exchange surface. The flow can also cause stress and strain on debris coating on the surface, causing separation along the surface plane. The time varying flow can effectively remove the accumulated surface debris. A static flow in some cases could also reduce accumulation, but it is noted that the static flow is presumed to be associated with the accumulation conditions, and maintenance of sufficient continuous flow conditions to remove accumulation may consume excess energy, noise, and abrasion of the heat exchange surfaces.

Confined liquid heat sinks limit flow of cooling liquid within a tube or channel. (Unconfined liquids may be sprayed over an open heat transfer surface). The cross section area of the channels, and fluid flow rate, is relatively constant in the aggregate as the fluid travels through the branched channels. However, when one considers the logistics of a typical design, the flow channels are either planar or the design is radially symmetric.

In a planar configuration, a base of the heat sink interfaces with the heat source, and the fluid flows through the structure above the heat source to withdraw heat. See, Escher, W., B. Michel, and D. Poulikakos "Efficiency of optimized bifurcating tree-like and parallel microchannel networks in the cooling of electronics." International Journal of Heat and Mass Transfer 52.5 (2009): 1421-1430; Wang et al., "Flow and Thermal Characteristics of Offset Branching Network," 12 Aug. 2009, International Journal of Thermal Science, Vol. 49, Pages 272-280; Yongping, Chen, et al. "Characteristics of Heat and Fluid Flow in Fractal Tree-like Channel Heat Sink [J]." Acta Aeronautica Et Astronautica Sinica 3 (2010): 008; Xu, Peng, et al. "Thermal characteristics of tree-shaped microchannel nets with/without loops." International Journal of Thermal Sciences 48.11 (2009): 2139-2147; Ghodoossi, L., "Thermal and hydrodynamic analysis of a fractal microchannel network", Energy Conversion and Management 46 (2005) 771-788; Liu, Shutian, Yongcun Zhang, and Peng Liu. "Heat transfer and pressure drop in fractal microchannel heat sink for cooling of electronic chips." Heat and Mass Transfer 44.2 (2007): 221-227; Alharbi, Ali Y., Deborah V. Pence, and Rebecca N. Cullion. "Thermal characteristics of microscale fractal-like branching channels." Journal of Heat Transfer 126.5 (2004): 744-752; S. Salakij et al., "Modeling in situ vapor extraction during convective boiling in fractal-like branching microchannel networks", International Journal of Heat and Mass Transfer 60 (2013) 700-712; Apreotesi, Mario A., "Microscale Thermal Management Utilizing Vapor Extraction from a Fractal-like Branching Heat Sink", M.S. Thesis, University of Oregon (2007), Hong, F. J., et al. "Conjugate heat transfer in fractal-shaped microchannel network heat sink for integrated microelectronic cooling application." International Journal of Heat and Mass Transfer 50.25 (2007): 4986-4998; Lee, Yong-Jiun, Poh-Seng Lee, and Siaw-Kiang Chou. "Enhanced microchannel heat sinks using oblique fins." ASME 2009 InterPACK Conference collocated with the ASME 2009 Summer Heat Transfer Conference and the ASME 2009 3rd International Conference on Energy Sustainability, American Society of Mechanical Engineers, 2009; Senn, S. M., and D. Poulikakos "Laminar mixing, heat transfer and pressure drop in tree-like microchannel nets and their application for thermal management in polymer electrolyte fuel cells." Journal of Power Sources 130.1 (2004): 178-191; Xiangqi, Wang. "New approaches to micro-electronic component cooling." PhD diss., 2007 (National University of Singapore); U.S. Pat. No. 6,688,381; US 2008037927; U.S. Pat. Nos. 6,333,852; 7,256,751. The temperature gradient within the heat sink having a planar flow plane would generally be decreasing with distance away from the interface, with the bulk material in and near the fluid flow plane largely isothermal.

The present technology may be applied to both external surface heat dissipation devices, and/or to confined heat transfer fluid heat sinks.

In a radially symmetric arrangement, typically a constant cross section branched solid heat sink (e.g., extruded), see e.g., U.S. Pat. No. 4,715,438; US 20080080137, US 20090050293; U.S. Pat. Nos. 8,295,046; 2,535,721, may be placed within a shell or confinement, and a contained fluid permitted to contact the exposed surfaces. In this case, the fluid path is not highly constrained, and the operating temperature may be unstable, for example due to nearly adiabatic movement of fluid masses as a result of density and viscosity differences of the heated fluid. An extruded heat sink is generally a suboptimal shape, since the more distal portions of the structure a constant higher surface by lower thermal gradient. Indeed, due to possible adiabatic movement of hot fluid, in some cases the fluid can heat portions of the heat sink. A "structurally complex" heat sink is provided in US 20090321045, but without branching networks and without optimized regional heterogeneity. In a closed, vacuum or filtered system, typically no accumulation of dust, debris or precipitate on the heat exchanger surface occurs.

Most heat sinks are designed using a linear or exponential relationship of the heat transfer and dissipating elements. According to the present technology, fractal geometry paradigms are employed, which are those which have self-similar characteristics over a range of scales. This self-similarity may be symmetric or asymmetric, and may involve branching or subdivision. Some fractals are random fractals, which are also termed chaotic or Brownian fractals and include random noise components. In deterministic fractal geometry, a self-similar structure results from the repetition of a design or motif (or "generator") using a recursive algorithm, on a series of different size scales. As a result, certain types of fractal images or structures appear to have self-similarity over a broad range of scales. In a symmetric design, the self-similar features may be identical and have well-defined scales, while in an asymmetric design, no two ranges within the design are identical or purely scaled. As discussed above, the heat sink according to the present technology need not be a pure fractal, and thus may violate a generative function, and yet still operate according to the design principles.

One definition of a fractal is "a rough or fragmented geometric shape that can be split into parts, each of which is (at least approximately) a reduced-size copy of the whole." Mandelbrot, B. B. (1982). A recursive algorithm may describe the structure, causing self-similarity. See, The Fractal Geometry of Nature. W.H. Freeman and Company. ISBN 0-7167-1186-9; en.wikipedia.org/wiki/Fractal. In practical implementations, the scale of the smallest features, which remain true to the generating algorithm, may be 3-25 iterations of the algorithm. An "approximately" fractal structure is one that has various deviations from theoretical, such as a limited number of iterations of the generative algorithm, perturbations and artifacts of implementation, or intentional bias. Fractal theory is related to chaos theory. See, en.wikipedia.org/wiki/Chaos_theory. See, Sui, Y., Teo, C. J., Lee, P. S., Chew, Y. T., & Shu, C. (2010). Fluid flow and heat transfer in wavy microchannels. International Journal of Heat and Mass Transfer, 53(13), 2760-2772; Garibaldi, Dott Ing Pietro. Single-phase natural circulation loops: effects of geometry and heat sink temperature on dynamic behavior and stability. Diss. Ph. D. Thesis, 2008; Fichera, A., and A. Pagano. "Modelling and control of rectangular natural circulation loops." International journal of heat and mass transfer 46.13 (2003): 2425-2444; Fichera, Alberto, et al. "A modeling strategy for rectangular thermal convection loops." World Congress. Vol. 15. No. 1. 2002; Crane, Jackson T. Radial parallel plate flow with mechanical agitation. Diss. Massachusetts Institute of Technology, 2013.

This fractal nature is useful in a heat sink because the rate at which heat is transferred from a surface, either through convection or through radiation, is typically related to, and increasing with, the surface area. Of course, due to limitations in the technology used to build these heat sinks, engineering compromise is expected. However, a feature of an embodiment of the designs proposed herein is that vortices induced by fluid flow over a heat transfer surface will be chaotically distributed over various elements of the surface, thus disrupting the stagnant surface boundary layer and increasing the effective surface area available for heat transfer, while avoiding acoustic resonance which may be apparent from a regular array of structures which produce vortices and turbulence.

Further, a large physical surface area to volume ratio, which is generally useful in heat sink design, can still be obtained using the fractal model. In addition, fractal structures provide a plurality of concave regions or cavities, providing pockets of separated flow which can generate self-sustaining oscillations and acoustic resonance. These pockets serve to reduce the acoustic resonance in turbulent flowing fluid (as compared to flat or Euclidian surfaces), thus allowing for more effective heat transfer between the fractal structure and the surrounding fluid, thereby making the fractal structure ideal for a heat sink.

U.S. Pat. No. 7,256,751 (Cohen), discusses fractal antennas. In the background of this patent, Cohen discusses Kraus' research, noting that Euclidian antennas with low area (and therefore low perimeter) exhibit very low radiation resistance and are thus inefficient. Cohen notes that the advantages of fractal antennas, over traditional antennas with Euclidian geometries, is that they can maintain the small area, while having a larger perimeter, allowing for a higher radiation resistance. Also, Cohen's fractal antenna features non-harmonic resonance frequencies, good bandwidth, high efficiency, and an acceptable standing wave ratio.

In the instant technology, this same wave theory may be applied to fractal heat sinks, especially with respect to the interaction of the heat transfer fluid with the heat sink. Thus, while the heat conduction within a solid heat sink is typically not modeled as a wave (though modern thought applies phonon phenomena to graphene heat transport), the fluid surrounding the heating certainly is subject to wave phenomena, complex impedances, and indeed the chaotic nature of fluid eddies may interact with the chaotic surface configuration of the heat sink.

The efficiency of capturing electric waves in a fractal antenna, achieved by Cohen, in some cases can be translated into an efficiency transferring heat out of an object to be cooled in a fractal heat sink as described herein. See, Boris Yakobson, "Acoustic waves may cool microelectronics", Nano Letters, ACS (2010). Some physics scholars have suggested that heat can be modeled as a set of phonons. Convection and thermal radiation can therefore be modeled as the movement of phonons. A phonon is a quasiparticle characterized by the quantization of the modes of lattice vibration of solid crystal structures. Any vibration by a single phonon is in the normal mode of classical mechanics, meaning that the lattice oscillates in the same frequency. Any other arbitrary lattice vibration can be considered a superposition of these elementary vibrations. Under the phonon model, heat travels in waves, with a wavelength on the order of 1 μm. In most materials, the phonons are incoherent, and, therefore, on macroscopic scales, the wave nature of heat transport is not apparent or exploitable.

The thermodynamic properties of a solid are directly related to its phonon structure. The entire set of all possible phonons combine in what is known as the phonon density of states which determines the heat capacity of a crystal. At absolute zero temperature (0° K or −273° C.), a crystal lattice lies in its ground state, and contains no phonons. A lattice at a non-zero temperature has an energy that is not constant, but fluctuates randomly about some mean value. These energy fluctuations are caused by random lattice vibrations, which can be viewed as a gas-like structure of phonons or thermal phonons. However, unlike the atoms which make up an ordinary gas, thermal phonons can be created and destroyed by random energy fluctuations. In the language of statistical mechanics this means that the chemical potential for adding a phonon is zero. For a more detailed description of phonon theory, see the Wikipedia article thereon available at en.wikipedia.org/wiki/Phonon.

In certain materials, such as graphene, phonon transport phenomena are apparent at macroscopic levels, which make phonon impedance measurable and useful. Thus, if a graphene sheet were formed to resonate at a particular phonon wavelength, the resonant energy would not be emitted. On the other hand, if the graphene sheet were configured using a fractal geometry, the phonon impedance would be well controlled over a broad range of wavelengths, with sharp resonances at none, leading to an efficient energy dissipation device.

One aspect of the technology therefore employs a thermally responsive technology, such as a memory metal actuator (which may be passive or active), or other active or passive element, to change the configuration of the heat sink under various conditions. It is noted that in an automotive radiator, a thermostat is provided to shunt flow around the radiator when the engine is cool. This is distinguished herein, in various alternate ways. For example, a variable geometry heat sink according to the present technology may have an external surface exposed to an unconstrained heat transfer medium, such as air. See, Baurle, R. A., and D. R. Eklund. "Analysis of dual-mode hydrocarbon scramjet operation at Mach 4-6.5." Journal of Propulsion and Power 18.5 (2002): 990-1002; Cockrell Jr, Charles E. "Technology Roadmap for Dual-Mode Scramjet Propulsion to Support Space-Access Vision Vehicle Development." (2002); Boudreau, Albert H. "Hypersonic air-breathing propulsion efforts in the air force research laboratory." AIAA 3255.1 (2005): 10; Kay, Ira W., W. T. Peschke, and R. N. Guile. "Hydrocarbon-fueled scramjet combustor investigation." Journal of Propulsion and Power 8.2 (1992): 507-512; Jackson, K., et al. "Calibration of a newly developed direct-connect high-enthalpy supersonic combustion research facility." AIAA paper (1998): 98-1510; Donbar, J., et al. "Post-test analysis of flush-wall fuel injection experiments in a scramjet", AIAA Paper 3197 (2001): 2001; Gruber, Mark, et al. "Newly developed direct-connect high-enthalpy supersonic combustion research facility." Journal of Propulsion and Power 17.6 (2001): 1296-1304; Andrews, Earl H. "Scramjet development and testing in the United States", AIAA paper 1927 (2001): 2001; Palac, Donald T., Charles J. Trefny, and Joseph M. Roche, Performance Evaluation of the NASA GTX RBCC Flowpath, NASA, Glenn Research Center, 2001; 2003/0155110; 2004/0187861; 2005/0245659; 2009/0016019; 2009/0321047; 2010/0089549; 2010/0236236, 2010/0252648; 2011/0174462; 2012/0293952; 2014/0360699; U.S. Pat. Nos. 4,654,092; 4,931,626; 5,371,753; 5,483,098; 5,548,481; 5,510,598; 6,128,188; 6,330,157; 6,689,486; 7,080,989; 7,778,029; 8,228,671; 8,385,066; JP 03-070162; JP 04-291750; JP 61-098565; JP 63-006915; WO 99/04429.

For example, a thermodynamic model of the system, encompassing at least the heat source, the heat sink, the thermal transfer medium, and a device to induce thermal transfer medium flow, may determine, under each set of conditions, the optimal configuration. For example, at low loads, the heat sink may operate passively, without flows induced by an active device to induce flow in the thermal transfer medium. In such a case, radiative heat transfer may be important, as well as thermally-induced convection. Under high loads, the active device to induce flow in the thermal transfer medium may induce maximum flows, and the heat sink configured for minimal turbulence with laminar flows where possible. In intermediate states, the system may assume a configuration which is optimized according to a cost function, which may involve the effect of heat/temperature on the heat source, energy consumed by the active device to induce flow in the thermal transfer medium, noise resulting from induced flow, etc. This allows efficient use of an "oversized" heat sink, since the heat sink characteristics are variably controlled. In these intermediate states of configuration, efficiency may be improved by allowing the heat sink to assume a variable configuration. Since the optimum heat sink configuration depends on, e.g., ambient temperature, humidity, atmospheric pressure, heat load, air flow rate, gravitational vector with respect to the heat sink, etc., the model should explore the range of combinations of the device to induce thermal transfer medium flow, the variable geometry, and to a lesser extent, control over the heat source. An example of the later is that for a given power dissipation, it may be more efficient to have thermal cycles reaching a maximum temperature than a constant temperature. During the cycles, the geometry may change. Indeed, if the system is not in a static steady state, the geometry may optimally change during or in anticipation of temperature changes. An example here is that as the heat source produces a heat peak, the heat diffuses over time through a solid heat sink material. There is a lag, and so the temperature of the heat source is different that the temperature of the heat sink, and the heat sink itself has variations in temperature at different positions. Typically, there is a single actuator which controls the entire heat sink, though this is not a limitation, and there may be multiple actuators to control different parts of the heat sink independently or semi-independently. The device to induce thermal transfer medium flow may have a variable flow rate, and also may have multiple independently controlled portions. However, as the heat begins to peak, the device to induce thermal transfer medium flow may also increase activity. This, in turn, can reduce the temperature of various portions of the heat sink, depending on the relationship of the device to induce thermal transfer medium flow and the variable geometry heat sink. Thus, the entire system may operate in a phased cyclic or dynamic manner, with asynchronous maxima and minima of the various functions.

In practice, a heat sink may be provided for a microprocessor having multiple cores. Under low load, the device to induce thermal transfer medium flow may be off, or at a low flow rate. The heat sink in this case optimally has the greatest spread for radiative and passive convective cooling. In case of a higher load, the processor itself may have the option of distributing the load over multiple cores, and spatially spreading the heat dissipation, or concentrating the load in a single core which may get hot. Since temperature differentials increase heat flow, the concentrated heat source may selectively transfer heat to sub-portion of the heat sink, and thus that portion may be able to efficiently shed the heat under the passive or low energy cost state.

As the load further increases, the processor as a whole typically becomes thermally limited, and as a result, the entire die or processor complex is treated as a unitary source, spreading heat to all elements of the heat sink. Initially, the temperature is low, and the system would seek to operate in the most efficient state of the device to induce thermal transfer medium flow. This may include laminar flow over the heat dissipating elements of the heat sink.

In the next regime, the heat increases, and as a result, the device to induce thermal transfer medium flow must increase its flow rate. At this point, a compromise may be made, between minimum energy cost (and thus a minimization of the energy to drive the device to induce thermal transfer medium flow), and effective heat dissipation. In this regime, the heat sink may be configured to induce turbulence in the medium flow around it. This, in turn, increases the resistance to flow, but reduces the boundary layer effect. Advantageously, in this regime, a fractal physical relationship of element of the heat sink may act to reduce peak acoustic emission with respect to frequency. Likewise, by avoiding sharp acoustic resonances, there may be a more effective transfer of heat with lower losses as acoustic energy. Further, the interaction of the elements of the heat sink may be further optimized to achieve higher efficiency.

Finally, at maximum heat load, presumably at the limit of the heat sink, the system enters a maximum heat dissipation mode. For example, this mode is one traditionally analyzed as the maximum capacity of the heat sink and device to induce thermal transfer medium flow system, and as such would typically assume or nearly assume a traditional optimized geometry. However, both due to the fact that the system may include fractal geometry elements for other regimes of operation, and because these may be exploited to gain efficiencies over traditional symmetric and regular geometries, the maximum heart dissipation configuration may be somewhat different than a parallel plate heat sink, for example.

Not all regions of the heat sink need to operate within the same regime at the same time, and even under a steady state heat load, may vary cyclically, randomly or chaotically (over a relevant timescale). The term "chaotically" is intended to assume its technical meaning under chaos and fractal theory, and not adopt a lay interpretation. On the other hand, "randomly" is intended to encompass true randomness, pseudorandom variations, and deterministic changes that over the relevant timescale have statistical characteristics that model randomness within an acceptable margin of error, the acceptability relating to achieving a suitable regime of operation. For example, because some attributes of turbulent flow are random, even though they are more technically chaotic, the random features may be used to advantage. For example, the device to induce thermal transfer medium flow may be subject to a tinsel type flow disruptor, which in some regimes appears to be a random variation in air flow speed, direction, vortex, etc. While this may increase noise, it also can create persistent disruptions in boundary layers, over time, even on smooth and regular heat sink elements. That is, the heat sink geometry and/or the device to induce thermal transfer medium flow, may have fractal or chaotic tendencies.

The geometry may involve branching elements, to increase surface area of the elements. An actuator may be used to alter angles or even to open and close branches. For example, a heat sink formed of a shape memory alloy (SMA) (such as Nitinol), may be produced by an additive manufacturing process, e.g., a 3D printer or 2.5D printer. Such a device may be thermally processed to have characteristic shape changes at temperature transitions, and indeed, the composition of the alloy may be controlled during fabrication to produce a variety of transition temperatures. Therefore, a 3D heat sink may be provided which inherently changes shape through a series of transitions as the temperature is increased and decreased. In this embodiment, the changes tend to be monotonic with increasing temperature, though by engineering the angles and physical configuration, the actual physical shape and heat dissipation properties may assume a non-monotonic function. Note that in this embodiment, it is generally preferred that only the branch points are formed of SMA, and the bulk be formed of a high thermal conductivity material, such as copper and/or silver, or to a lesser extent, aluminum. The dynamic operation may be applied to the lower level fractal arrangement, while the second level may remain static.

Actuators, which may be SMA, solenoids, bimetal, magnetic, or otherwise, may be provided and controlled to change the position of repositionable elements. Control can be exercised which independent of temperature. Typically, the number of controlled elements is constrained due to manufacturing and control feasibility issues. The actuators may alter a spacing, angle, position, or engagement of heat sink elements, or air flow impinging on the elements. When a set of regularly spaced and sized elements are controlled according to a constant or spectrally-defined distribution, this can be controlled to operate within highly predictable regimes. On the other hand, if the elements are not regularly sized and spaced, or are controlled in irregular manner, the resulting fluid dynamics will likely require a statistical flow (e.g., Monte Carlo) analysis, rather than permitting simplifying static function/linear response presumptions. This is will especially be the case if the thermal time-constants of the heat flow from the heat source, to the heat sink, and then to the heat transfer fluid, are near or within the range of time-constants of the turbulence or chaotically varying flows of the heat transfer fluid. Typically, the thermal heat transfer time-constants are longer than the turbulent or chaotic variation time-constants, and therefore meeting this presumption requires either generating low frequency turbulent or chaotic variations of the heat transfer fluid medium, or making the heat sink (and perhaps other elements) with short time-constants, such as using short/thin/small elements, using phonon transport phenomena, or other means.

Controlled shape or morphology of the heat sink typically operates at the largest size scales of the heat sink. However, it is also possible to control surface configuration (e.g., texture) at a small scale, such as using holes to facilitate heat exchange, or bimetallic elements that bend or snap at predefined temperatures, deployable cylinders, or other small-scale features that typically alter aerodynamic properties of a surface. For example, it may be desirable for terminal branches of a hierarchical branched heat sink to have a turbulence, which increases with temperature. In that case, a cool heat sink surface is smooth, and offers low resistance to heat transfer fluid flow, low noise, but low effect on heat dissipation. At high temperatures, one wishes to ensure intimate contact of the relatively cooler heat transfer fluid with the heat sink, which can be increased by disrupting the laminar flow patterns, for example by having surface features that protrude into the fluid stream. While this increases noise and resistance to fluid, it also offers higher heat transfer capability, especially if the pressure inducing flow of the heat transfer fluid is increased.

An adaptively controlled system may be implemented, which may power dissipation, thermal, air flow, acoustic, and other sensors to control a configuration of the heat sink itself, or air flow surrounding the heat sink. For example, a FLIR One Gen 3 imager (FLIR Systems, Wilsonville Oreg.) may be used to monitor heat sink temperatures. As the temperature of a region of the heat sink rises, adaptive steps are taken to selectively cool that region, without substantially heating other regions in a manner that would reduce net heat transfer. In some cases, the heat sink is regioselective, and therefore the adaptivity must also address where the hot spot is, and how best to cool that spot. In addition, cool spots of the heat sink may be addressed by reducing air flow or other effects, to better use the full volume of the heat sink, under the full range of conditions. In other cases, the IR imager is too expensive. In that case, for example, an optic imager and liquid crystal temperature indicators may be employed. Alternately, thermal sensors, such as thermistors, bipolar junctions, thermocouples, bimetal indicators, or the like may be used to assess local or regional temperature conditions. These sensors may be selectively located at nodes of the design. While selective air jet impingement is one option for controlled cooling of the heat sink, more typically the cost and energy cost of the air supply is a factor, and therefore the design includes a fan or centrifugal blower, whose sole control is fan speed. However, in conjunction with the heat sink, and especially a fractal-shaped heat sink, the air flow will induce flow perturbations around the heat sink elements, which will be detectable as vibrations, i.e., sounds, resulting from turbulence or resonance. An array of microphones can assist in locating the source of the sounds. In the typical design, the heat sink combined with the heat source has a reproducible het distribution pattern, though this may change over time due to particulate or grease accumulation, ambient temperature, humidity, illumination (radiation load), and other effects. Therefore, the fan speed may be controlled not only dependent on the temperature of the device to be cooled, but also on the power required to operate the fan (which may follow a non-linear and/or non-monotonic function due to the aerodynamic effects), and a control signal dependent on acoustic emissions. For example, in some modes of operation, it may be desirable to suppress acoustic emissions, even at risk of less efficient operation. Therefore, when the acoustic emissions are detected, the fan speed is changed (typically increased, by potentially decreased if within the margin of safety), to reduce the undesirable acoustic emissions. In other modes of operation, maximization of heat transfer efficacy is preferred, and the fan operated at speeds which create turbulence around hot elements of the heat sink, and thus increase heat transfer at those locations by reducing the surface boundary layer. Because the typical response is repeatable, a lookup table or algorithm, or other predictive model, employed to determine, in a given operating state (e.g., power dissipation, environmental conditions, etc.), what the temperature profile of the heat sink elements will be. Then, a fan speed is determined that will best achieve the objective. This objective is, for example, acoustically responsive, to control the acoustic emissions. Acoustic feedback is useful because at a given time, the exact acoustic response may be non-deterministic due to fouling of surfaces, air flow imperfections, etc. In some cases, the system may take advantage of acoustic masking, and thus produce non-objectionable noise under the circumstances. See, U.S. Pat. No. 7,974,714. It is noted that vibrational air movement may also be induced by vibrating the heat sink. This may be induced by displacing the heat sink as a whole, or vibrating portions of the heat sink, such as with an electromagnetic device or piezoelectric device.

The time-constant(s) of the thermal transfer medium flow may be much shorter than the relevant thermal time-constants of the heat source and heat sink, and the purpose of the turbulent or chaotic disruption is to alter the convective heat transfer characteristics of the heat sink, such as reducing the boundary layers or making them dynamically changing over time and space.

Another aspect of the technology involves planar heat sinks, such as used in antenna designs. In this case, the present technology may have corresponding effect to that discussed above, especially where a device to induce thermal transfer medium flow is provided to cool a generally planar heat sink system. It is noted that any heat sink in actuality must be considered in three dimensions, and the fact that it may have expanses of a thin uniform thickness layer does not defeat use of three dimensional analysis to understand its functioning and optimization. In the case of a printed circuit board-type heat sink, a variable geometry or printed traces on a rigid circuit board is typically infeasible. On the other hand, if the circuit board is not rigid, or the traces not simply copper sheet intimately adhered to the substrate, it may be feasible to apply dynamically varying design principles to profited-type circuit boards.

Similarly, where a planar heat sink structure serves a secondary purpose, such as an antenna, the physical configuration may be constrained by this other purpose. However, the device to induce thermal transfer medium flow is typically not so constrained, and therefore provides a controllable variable. Further, in many cases, the requirement for "thinness" of a 2D heat sink does not preclude texturing or perforation on an exposed surface, which itself may have a fractal geometry on a small scale.

In some cases, a variable geometry may be achieved by altering flow characteristics of thermal transfer medium flow and, for example, a deflector may be controlled to change a direction of impingement. Advantageously, a surface of a heat sink can have anisotropic features, which respond differently to different flow direction. Thus, the efficiency of the fan can be optimized other than by fan speed alone, to provide another control variable. This may have particular importance where the fan itself is highly constrained, and cannot simply be made oversized, or where energy efficiency is an overriding concern.

The technology is not limited to a cooling gas, and may encompass liquids. Typically, cooling liquids are recycled, and therefore operate within a physically closed system. Use of a fractal branching fluid networks is known, but various principles discussed above, such as variable geometry, variations in flow rate over different regimes of operation, different directions of flow over surfaces, and intentional induction of chaotic flow patterns may be adopted.

Many fractal designs are characterized by concave regions or cavities. See, for example, FIGS. 2 and 3. While sets of concavities may be useful in improving aerodynamics and fluid dynamics to increase turbulence, if they are disposed in a regular array, they will likely produce an acoustic resonance, and may have peaks in a fluid impedance function. On the other hand, the multiscale nature of a fractal geometric design will allow the system to benefit from the concavities, while avoiding a narrowly tuned system.

Benefits of a fractal heat sink for the purpose of dissipating heat, over a traditional heat sink having a Euclidian geometry may include: (1) the fractal heat sink has a greater surface area, allowing for more exposure of the hot device to the surrounding air or liquid and faster dissipation of heat; and (2) due to the plethora of concave structures or cavities in fractal structures, the fractal heat sink is better able to take advantage of turbulent flow mechanics than a traditional heat sink, resulting in heat entering and exiting the heat sink more quickly (3) acoustic properties, especially in forced convection systems. The technology provides, according to various embodiments, a heat sink to cool an object through conduction (diffusion), convection and radiation. (See, en.wikipedia.org/wiki/Heat_transfer.)

With respect to conduction, the present technology observes that when heat energy is conducted by phonon transport, wave phenomena are pertinent, and thus a fractal branching network can advantageously be used to reduce reflections at discontinuities and decrease complex impedance. Further, a fractal geometry may assist in optimizing the cross-section area and surface area (for radiation and convective transfer) under given constraints.

With respect to convection, fractal geometry may provide acoustic benefits, by distributing acoustic energy across a wide band, and thus ensuring "whiteness" of a noise spectrum and absence of sharp resonances. Further, fractal geometry may provide high or maximum surface area, and produce turbulent cooling medium flows to reduce boundary later effects. Depending on the constraints imposed, fractal geometry may also provide chimneys or defined flow paths through a network of elements, and thus control an impedance of coolant flow, though generally, a fractal branching network will produce higher flow impedance than corresponding smooth regular surfaces. In some cases, a textured surface or configuration (as might be achieved by fractal geometry) can actually increase laminar flow some distance away from the surface, by creating a controlled disturbed intermediate layer.

With respect to radiation, fractal geometry can avoid parallel surfaces, which can limit radiative dissipation. For example, a parallel plate heat sink will radiatively transfer heat between the plates, and thus limit the effectiveness of radiation from the bulk of the surfaces as an effective dissipation mechanism. On the other hand, irregular angles and surface branches may help to avoid reabsorption of thermal radiation by the elements of the heat sink, and thus enhance radiative dissipation.

For the smallest heat sink elements, on the order of 10-1000 nm, the focus of the heat transfer may be on radiation rather than convection. Electron emission and ionization may also be relevant. Larger heat sink elements, approximately >1 mm in size, will generally rely on convection as the primary form of heat transfer. In a fractal geometry system, elements spanning these regimes may be provided in a single system.

The heat sink may comprise a heat exchange device with a plurality of heat exchange elements having a fractal variation therebetween. A heat transfer fluid, such as air, water, or another gas or liquid, is induced to flow through the heat exchange device. The heat transfer fluid has turbulent portions. The fractal variation in the plurality of heat exchange elements substantially reduces the narrow band acoustic resonance resulting from fluid flow around the heat sink elements as compared to a heat sink having a linear or Euclidian geometric variation between the plurality of heat exchange elements. The turbulent flow also disturbs the stagnant surface boundary layer, leading to more efficient heat transfer, but generally reduced flow rates for the same motive force. Note that, since turbulence dissipates energy, under some conditions, the heat added to the system by inducing the heat transfer fluid flow can be a significant factor.

When a heat transfer fluid (air, gas or liquid) is induced to flow over a surface, there may be turbulence in the fluid. The fractal shape of the heat sink would generally provide a range of physical size parameters, and thus for any given flow rate, would typically induce turbulent flow over some portion of a fractal geometry array. Notably, because the flow for a given heat sink may vary over a range of speeds, and the temperature and viscosity of the fluid varies over a range of conditions, fractal geometry facilitates optimization over a range of parameters.

In fluid dynamics, turbulence or turbulent flow is a flow regime characterized by chaotic property changes. This includes low momentum diffusion, high momentum convection, and rapid variation of pressure and flow velocity in space and time. (See, en.wikipedia.org/wiki/Turbulence; www.scholarpedia.org/article/Turbulence) Flow, in which the kinetic energy dies out due to the action of fluid molecular viscosity, is called laminar flow. While there is no theorem relating the non-dimensional Reynolds number (Re) to turbulence, flows at Reynolds numbers larger than 5000 are typically (but not necessarily) turbulent, while those at low Reynolds numbers usually remain laminar. In Poiseuille flow, for example, turbulence can first be sustained if the Reynolds number is larger than a critical value of about 2040; moreover, the turbulence is generally interspersed with laminar flow until a larger Reynolds number of about 4000. In turbulent flow, unsteady vortices appear on many scales and interact with each other. Drag due to boundary layer skin friction increases. The structure and location of boundary layer separation often changes, sometimes resulting in a reduction of overall drag. Although laminar-turbulent transition is not governed by Reynolds number, the same transition occurs if the size of the object is gradually increased, or the viscosity of the fluid is decreased, or if the density of the fluid is increased. Turbulence is characterized by the following features: Irregularity: Turbulent flows are always highly irregular. For this reason, turbulence problems are normally treated statistically rather than deterministically. Turbulent flow is chaotic. However, not all chaotic flows are turbulent. Diffusivity: The readily available supply of energy in turbulent flows tends to accelerate the homogenization (mixing) of fluid mixtures. The characteristic, which is responsible for the enhanced mixing and increased rates of mass, momentum and energy transports in a flow, is called "diffusivity".

Rotationality: Turbulent flows have non-zero vorticity and are characterized by a strong three-dimensional vortex generation mechanism, known as vortex stretching. In fluid dynamics, they are essentially vortices subjected to stretching that is associated with a corresponding increase of the component of vorticity in the stretching direction due to the conservation of angular momentum. In general, the stretching mechanism implies thinning of the vortices in the direction perpendicular to the stretching direction due to volume conservation of fluid elements. Thus, the radial length scale of the vortices decreases and the larger flow structures break down into smaller structures. The process continues until the small scale structures are small enough that their kinetic energy can be transformed by the fluid's molecular viscosity into heat, i.e., molecular scale random motion. Turbulence is always rotational and three dimensional.

Dissipation: To sustain turbulent flow, a persistent source of energy supply is required because turbulence dissipates rapidly as the kinetic energy is converted into internal energy by viscous shear stress. It therefore becomes apparent that, because turbulent flow is chaotic, an optimization of heat sink geometry responsive to chaotic features can achieve efficiencies over a range of operating regimes, and at particular operating regimes.

Turbulence causes the formation of eddies of many different length scales. Most of the kinetic energy of the turbulent motion is contained in the large-scale structures. The energy "cascades" from these large-scale structures to smaller scale structures by an inertial and essentially inviscid mechanism. This process continues, creating smaller and smaller structures, which produces a hierarchy of eddies. Eventually this process creates structures that are small enough that molecular diffusion becomes important and viscous dissipation of energy finally takes place. The scale at which this happens is the Kolmogorov length scale.

Via this energy cascade, turbulent flow can be realized as a superposition of a spectrum of flow velocity fluctuations and eddies upon a mean flow. The eddies are loosely defined as coherent patterns of flow velocity, vorticity and pressure. Turbulent flows may be viewed as made of an entire hierarchy of eddies over a wide range of length scales and the hierarchy can be described by the energy spectrum that measures the energy in flow velocity fluctuations for each length scale (wavenumber). The scales in the energy cascade are generally uncontrollable and highly non-symmetric. Nevertheless, based on these length scales these eddies can be divided into three categories.

Integral length scales: Largest scales in the energy spectrum. These eddies obtain energy from the mean flow and also from each other. Thus, these are the energy production eddies, which contain most of the energy. They have the large flow velocity fluctuation and are low in frequency. Integral scales are highly anisotropic. The maximum length of these scales is constrained by the characteristic length of the apparatus.

Kolmogorov length scales: Smallest scales in the spectrum that form the viscous sub-layer range. In this range, the energy input from nonlinear interactions and the energy drain from viscous dissipation are in exact balance. The small scales have high frequency, causing turbulence to be locally isotropic and homogeneous.

Taylor microscales: The intermediate scales between the largest and the smallest scales which make the inertial subrange. Taylor microscales are not dissipative scale but pass down the energy from the largest to the smallest. Taylor microscales play a dominant role in energy and momentum transfer in the wavenumber space.

The Russian mathematician Andrey Kolmogorov proposed the first statistical theory of turbulence, based on the aforementioned notion of the energy cascade (an idea originally introduced by Richardson) and the concept of self-similarity (e.g., fractal relationships). For very high Reynolds numbers, the small scale turbulent motions are statistically isotropic (i.e., no preferential spatial direction could be discerned). In general, the large scales of a flow are not isotropic, since they are determined by the particular geometrical features of the boundaries (the size characterizing the large scales will be denoted as L). Kolmogorov introduced the second hypothesis: for very high Reynolds numbers the statistics of small scales are universally and uniquely determined by the kinematic viscosity (v) and the rate of energy dissipation (ε). With only these two parameters, the unique length (Kolmogorov length scale) that can be formed by dimensional analysis is $$\eta = \left(\frac{v^3}{\varepsilon}\right)^{1/4}.$$

A turbulent flow is characterized by a hierarchy of scales through which the energy cascade takes place. Dissipation of kinetic energy takes place at scales of the order of Kolmogorov length η, while the input of energy into the cascade comes from the decay of the large scales, on the order of L. These two scales at the extremes of the cascade can differ by several orders of magnitude at high Reynolds numbers. In between there is a range of scales (each one with its own characteristic length r) that has formed at the expense of the energy of the larger ones. These scales are very large compared with the Kolmogorov length, but still very small compared with the large scale of the flow (i.e., $\eta \ll r \ll L$).

Since eddies in this range are much larger than the dissipative eddies that exist at Kolmogorov scales, kinetic energy is essentially not dissipated in this range, and it is merely transferred to smaller scales until viscous effects become important as the order of the Kolmogorov scale is approached. Within this range inertial effects are still much larger than viscous effects, and it is possible to assume that viscosity does not play a role in their internal dynamics (for this reason this range is called "inertial range"). Kolmogorov theory is, at present, under revision. The theory implicitly assumes that the turbulence is statistically self-similar at different scales. This essentially means that the statistics are scale-invariant in the inertial range. However, there is evidence that turbulent flows deviate from this idealized behavior. (See, Davidson, P. A. (2004). Turbulence: An Introduction for Scientists and Engineers. Oxford University Press. ISBN 978-0-19-852949-1; scholarpedia.org; G. Falkovich, Scholarpedia, "Cascade and scaling"; Jin, Y.; Uth, M.-F.; Kuznetsov, A. V.; Herwig, H. (2 Feb. 2015). "Numerical investigation of the possibility of macroscopic turbulence in porous media: a direct numerical simulation study." Journal of Fluid Mechanics 766: 76-103. Bibcode:2015JFM . . . 766 . . . 76J. doi:10.1017/jfm.2015.9; G Falkovich and K. R. Sreenivasan. "Lessons from hydrodynamic turbulence," Physics Today, vol. 59, no. 4, pages 43-49 (April 2006); J. Cardy, G. Falkovich and K. Gawedzki (2008) Non-equilibrium statistical mechanics and turbulence. Cambridge University Press; P. A. Durbin and B. A. Pettersson Reif. Statistical Theory and Modeling for Turbulent Flows. Johns Wiley & Sons, 2001; T. Bohr, M. H. Jensen, G. Paladin and A. Vulpiani. Dynamical Systems Approach to Turbulence, Cambridge University Press, 1998; J. M. McDonough (2007). Introductory Lectures on Turbulence—Physics, Mathematics, and Modeling; Kolmogorov, Andrey Nikolaevich (1941). "The local structure of turbulence in incompressible viscous fluid for very large Reynolds numbers." Proceedings of the USSR Academy of Sciences (in Russian) 30: 299-303, translated into English by V. Levin: Kolmogorov, Andrey Nikolaevich (Jul. 8, 1991). Proceedings of the Royal Society A 434 (1991): 9-13. Bibcode: 1991RSPSA.434 . . . 9K. doi:10.1098/rspa.1991.0075; Kolmogorov, Andrey Nikolaevich (1941). "Dissipation of Energy in the Locally Isotropic Turbulence." Proceedings of the USSR Academy of Sciences (in Russian) 32: 16-18., translated into English by A. Kolmogorov (Jul. 8, 1991). Proceedings of the Royal Society A 434 (1980): 15-17. Bibcode:1991RSPSA.434 . . . 15K. doi:10.1098/rspa.1991.0076; G. K. Batchelor, The theory of homogeneous turbulence. Cambridge University Press, 1953.)

In a fanless (passive flow) design, the main design efficiency issues for a given material and capacity, are size, and thermal time-constant(s). Because such designs may operate over a range of ambient temperatures, they are typically over-provisioned for the normal operating case. The typical heat transfer medium flow rates available in such a design rarely reach a range to cause significant turbulence, and indeed, the design typically provides flow channels which seek to maintain laminar flow to ensure convective transfer over a large area of the heat sink with minimum acoustic emission that would arise from turbulence. In order to increase efficiency, the present technology increases surface area through patterning of surfaces, and seeks to diminish laminar flow boundary layer thickness by initiating vortices and other turbulent effects at relatively low flow rates as might be characteristic of passive thermally induced convection in a heat transfer fluid, such as air.

According to another aspect, the apertures serve to increase surface area at low flow rates, and increase turbulence at high flow rates, thus providing two distinct operational regimes.

According to these precepts, the heat sink design can maintain a thin boundary layer over a significant portion of the surface, over a wide range of heat transfer medium flow conditions. In typical prior art designs, the surfaces are subject to the same constraints, and at low flow rates, a thick boundary layer is present, at a design nominal flow rate, an optimum heat transfer efficiency is obtained, with a corresponding thin boundary layer, while at higher flow rates there is a loss of efficiency due to separation of the turbulent boundary layer from the surface, resonances and acoustic emissions, exponential increase in flow resistance, etc. Typically, a fan is provided, which may have a speed control, though in some cases the fan operates at constant speed. (Fixed fan speeds are useful, for example, in datacenter implementations, where the fans are provided to ensure unidirectional flow without risk of reverse flows).

On the other hand, according to the present technology, the optimum heat transfer conditions are distributed across a larger flow rate range, with the characteristic that the heat transfer efficiency can vary locally as a function of flow conditions. At peak load conditions, one naturally seeks relatively low flow impedance and high flow rates, but may also tolerate increased turbulence and accompanying noise.

With the mutilevel fractal design, multiscale turbulence is generated. Multiscale turbulence is a class of flows in which the chaotic motion of the fluid is forced at different length and/or time scales. See, en.wikipedia.org/wiki/Turbulence, en.wikipedia.org/wiki/Multiscale_turbulence. Laizet, S.; Vassilicos, J. C. (January 2009). "Multiscale Generation of Turbulence". Journal of Multiscale Modelling. 01 (01): 177-196. doi:10.1142/S1756973709000098; Mazzi, B.; Vassilicos, J. C. (10 Mar. 2004). "Fractal-generated turbulence". Journal of Fluid Mechanics. 502: 65-87. doi:10.1017/S0022112003007249.

This may be achieved by immersing in a moving fluid a body with a multiscale, often fractal-like, arrangement of length scales. This arrangement of scales can be either passive (Hurst, D.; Vassilicos, J. C. (2007). "Scalings and decay of fractal-generated turbulence". Physics of Fluids. 19 (3): 035103. doi:10.1063/1.2676448; Nagata, K.; Sakai, Y.; Inaba, T.; Suzuki, H.; Terashima, O.; Suzuki, H. (2013). "Turbulence structure and turbulence kinetic energy transport in multiscale/fractal-generated turbulence". Physics of Fluids. 25 (6): 065102. doi:10.1063/1.4811402, or active (Thormann, A.; Meneveau, C. (February 2014). "Decay of homogeneous, nearly isotropic turbulence behind active fractal grids". Physics of Fluids. 26 (2): 025112. doi: 10.1063/1.4865232). Three examples of multiscale generators, include a fractal cross grid, a fractal square grid and a fractal I grid. en.wikipedia.org/wiki/Turbulence.

with, where and are Reynolds numbers based, respectively, on initial/global conditions (such as free-stream velocity and the object's length scale) and local conditions (such as the RMS velocity and integral length scale).

Boschung, J., et al. "Streamlines in stationary homogeneous isotropic turbulence and fractal-generated turbulence." Fluid Dynamics Research 48.2 (2016): 021403.

Cafiero, Gioacchino, et al. "Flow field features of fractal impinging jets at short nozzle to plate distances." Experimental Thermal and Fluid Science 78 (2016): 334-344.

Cafiero, Gioacchino, Stefano Discetti, and Tommaso Astarita. "Flow field topology of submerged jets with fractal generated turbulence." Physics of Fluids 27.11 (2015): 115103.

Cafiero, Gioacchino, Stefano Discetti, and Tommaso Astarita. "Heat transfer enhancement of impinging jets with fractal-generated turbulence." International Journal of Heat and Mass Transfer 75 (2014): 173-183.

Cheskidov, Alexey, Charles R. Doering, and Nikola P. Petrov. "Energy dissipation in fractal-forced flow." Journal of mathematical physics 48.6 (2007): 065208.

Coffey, C. J., et al. "Mixing effectiveness of fractal grids for inline static mixers." Proof of Concept Report for the Attention of Imperial Innovations. www3.imperial.ac.uk/tmfc/papers/poc (2007).

Coppola, G., and A. Gomez. "Experimental investigation on a turbulence generation system with high-blockage plates." Experimental Thermal and Fluid Science 33.7 (2009): 1037-1048.

Dairay, T., M. Obligado, and J. C. Vassilicos. "Non-equilibrium scaling laws in axisymmetric turbulent wakes." Journal of Fluid Mechanics 781 (2015): 166-195.

Discetti, S., et al. "PIV study of fractal grid turbulence." 9th International Symposium on Particle Image Velocimetry—PIV. Vol. 11. 2011.

Fragner, Romain, et al. "Multi-scale high intensity turbulence generator applied to a high pressure turbulent burner." Flow, Turbulence and Combustion 94.1 (2015): 263-283.

Gomes-Fernandes, R., B. Ganapathisubramani, and J. C. Vassilicos. "Particle image velocimetry study of fractal-generated turbulence." Journal of Fluid Mechanics 711 (2012): 306-336.

Hampp, F., and R. P. Lindstedt. "Fractal Grid Generated Turbulence—A Bridge to Practical Combustion Applications." Fractal Flow Design: How to Design Bespoke Turbulence and Why. Springer International Publishing, 2016. 75-102.

Hearst, R. Jason, and Philippe Lavoie. "Decay of turbulence generated by a square-fractal-element grid." Journal of Fluid Mechanics 741 (2014): 567-584.

Hearst, R. Jason, and Philippe Lavoie. "Scale-by-scale energy budget in fractal element grid-generated turbulence." Journal of Turbulence 15.8 (2014): 540-554.

Hearst, Robert Jason, and Philippe Lavoie. "Velocity derivative skewness in fractal-generated, non-equilibrium grid turbulence." Physics of Fluids 27.7 (2015): 071701.

Hurst, D., and J. C. Vassilicos. "Scalings and decay of fractal-generated turbulence." Physics of Fluids 19.3 (2007): 035103.

Keylock, C. J., et al. "The flow structure in the wake of a fractal fence and the absence of an "inertial regime"." Environmental fluid mechanics 12.3 (2012): 227-250.

Krogstad, P-Å., and P. A. Davidson. "Freely decaying, homogeneous turbulence generated by multi-scale grids." Journal of Fluid Mechanics 680 (2011): 417-434.

Krogstad, Per-Åge. "Turbulent decay in the near field of multi-scale and conventional grids." International Journal of Heat and Fluid Flow 35 (2012): 102-108.

Laizet, S., and J. C. Vassilicos. "Multiscale generation of turbulence." Journal of Multiscale Modelling 1.01 (2009): 177-196.

Laizet, S., and J. C. Vassilicos. "Stirring and scalar transfer by grid-generated turbulence in the presence of a mean scalar gradient." Journal of Fluid Mechanics 764 (2015): 52-75.

Laizet, S., and J. Christos Vassilicos. "Direct numerical simulation of fractal-generated turbulence." *Direct and Large-Eddy Simulation VII* (2010): 17-23.

Laizet, S., E. Lamballais, and J. C. Vassilicos. "A numerical strategy to combine high-order schemes, complex geometry and parallel computing for high resolution DNS of fractal generated turbulence." *Computers & Fluids* 39.3 (2010): 471-484.

Laizet, Sylvain, and John Christos Vassilicos. "DNS of fractal-generated turbulence." *Flow, turbulence and combustion* 87.4 (2011): 673-705.

Laizet, Sylvain, and Ning Li. "Incompact3d: A powerful tool to tackle turbulence problems with up to O (105) computational cores." *International Journal for Numerical Methods in Fluids* 67.11 (2011): 1735-1757.

Laizet, Sylvain, et al. "Low Mach number prediction of the acoustic signature of fractal-generated turbulence." *International Journal of Heat and Fluid Flow* 35 (2012): 25-32.

Laizet, Sylvain, J. C. Vassilicos, and Claude Cambon. "Inter-scale energy transfer in decaying turbulence and vorticity—strain-rate dynamics in grid-generated turbulence." *Fluid Dynamics Research* 45.6 (2013): 061408.

Laizet, Sylvain, J. Nedić, and J. Christos Vassilicos. "The spatial origin of −5/3 spectra in grid-generated turbulence." *Physics of Fluids* 27.6 (2015): 065115.

Manshoor, Bukhari bin, F. C. G. A. Nicolleau, and S. B. M. Beck. "The fractal flow conditioner for orifice plate flow meters." *Flow measurement and Instrumentation* 22.3 (2011): 208-214.

Mazellier, Nicolas, and J. C. Vassilicos. "The turbulence dissipation constant is not universal because of its universal dependence on large-scale flow topology." *Physics of Fluids* 20.1 (2008): 015101.

Mazellier, Nicolas, and J. C. Vassilicos. "Turbulence without Richardson-Kolmogorov cascade." *Physics of fluids* 22.7 (2010): 075101.

Mazellier, Nicolas, Luminita Danaila, and Bruno Renou. "Multi-scale energy injection: a new tool to generate intense homogeneous and isotropic turbulence for premixed combustion." *Journal of Turbulence* 11 (2010): N43.

Mazzi, B., and John Christos Vassilicos. "Fractal-generated turbulence." *Journal of Fluid Mechanics* 502 (2004): 65-87.

Meldi, Marcello, Hugo Lejemble, and Pierre Sagaut. "On the emergence of non-classical decay regimes in multi-scale/fractal generated isotropic turbulence." *Journal of Fluid Mechanics* 756 (2014): 816-843.

Melina, G., P. J. K. Bruce, and J. C. Vassilicos. "Vortex shedding effects in grid-generated turbulence." *Physical Review Fluids* 1.4 (2016): 044402.

Nedić, J., et al. "Aeroacoustic performance of fractal spoilers." *AIAA J* 50.12 (2012): 2695-2710.

Nedic, Jovan. "Fractal-generated wakes." (2013).

Nicolleau, F. C. G. A. "Return to axi-symmetry for pipe flows generated after a fractal orifice." *Fluid Dynamics Research* 45.6 (2013): 061402.

Oberlack, Martin, and Andreas Rosteck. "New statistical symmetries of the multi-point equations and its importance for turbulent scaling laws." *Discrete Contin. Dyn. Syst. Ser. S* 3.3 (2010): 451-471.

Oberlack, Martin, and George Khujadze. "Fractal-generated turbulent scaling laws from a new scaling group of the multi-point correlation equation." *TSFP DIGITAL LIBRARY ONLINE*. Begel House Inc., 2009.

Othman, Mohd Fahmi, Bukhari Manshoor, and Amir Khalid. "Circle grid fractal plate as a turbulent generator for premixed flame: an overview." *IOP Conference Series: Materials Science and Engineering*. Vol. 50. No. 1. IOP Publishing, 2013.

Rakhshandehroo, G. Reza, et al. "Temporal variation of velocity components in a turbulent open channel flow: Identification of fractal dimensions." *Applied Mathematical Modelling* 33.10 (2009): 3815-3824.

S. Laizet, Y. Sakai, J. C. Vassilicos, "Turbulent flows generated/designed in multiscale/fractal ways: fundamentals and applications", 1ST UK-Japan Bilateral WorkshoP, 28-29 Mar. 2011, Department of Aeronautics, Imperial College London.

Schneemann, Jorge, et al. "Lift measurements in unsteady flow conditions." *Proceedings of EWEC*. 2010.

Seoud, R. E. E., and J. C. Vassilicos. "Passive multiscale flow control by fractal grids." *IUTAM Symposium on Flow Control and MEMS*. Springer Netherlands, 2008.

Seoud, R. E., and J. C. Vassilicos. "Dissipation and decay of fractal-generated turbulence." *Physics of Fluids* 19.10 (2007): 105108.

Stresing, R., et al. "Defining a new class of turbulent flows." *Physical review letters* 104.19 (2010): 194501.

Stresing, R., et al. "Stochastic Analysis of Turbulence n-Scale Correlations in Regular and Fractal-Generated Turbulence." *Progress in Turbulence III*. Springer, Berlin, Heidelberg, 2009. 49-52.

Stresing, Robert, and J. Peinke. "Towards a stochastic multi-point description of turbulence." *New Journal of Physics* 12.10 (2010): 103046.

Suzuki, Hiroki, et al. "Fractal analysis of turbulent mixing in fractal-generated turbulence by planar laser-induced fluorescence." *Physica Scripta* 2013.T155 (2013): 014062.

Sykes, R. I., and R. S. Gabruk. "Fractal representation of turbulent dispersing plumes." *Journal of Applied Meteorology* 33.6 (1994): 721-732.

Valente, P. C., and J. C. Vassilicos. "Dependence of decaying homogeneous isotropic turbulence on inflow conditions." *Physics Letters A* 376.4 (2012): 510-514.

Valente, P. C., and J. C. Vassilicos. "The energy cascade in grid-generated non-equilibrium decaying turbulence." *Physics of Fluids* 27.4 (2015): 045103.

Valente, P. C., and J. C. Vassilicos. "The non-equilibrium region of grid-generated decaying turbulence." *Journal of Fluid Mechanics* 744 (2014): 5-37.

Valente, P. C., and John Christos Vassilicos. "The decay of turbulence generated by a class of multiscale grids." *Journal of Fluid Mechanics* 687 (2011): 300-340.

Van Melick, P. A. J., and B. J. Geurts. "Flow through a cylindrical pipe with a periodic array of fractal orifices." *Fluid dynamics research* 45.6 (2013): 061405.

Vassilicos, J. Christos. "Dissipation in turbulent flows." *Annual Review of Fluid Mechanics* 47 (2015): 95-114.

Weitemeyer, Stefan, et al. "Multi-scale generation of turbulence with fractal grids and an active grid." *Fluid Dynamics Research* 45.6 (2013): 061407.

Zheng, H. W., F. C. G. A. Nicolleau, and N. Qin. "Detached eddy simulation for turbulent flows in a pipe with a snowflake fractal orifice." *New Approaches in Modeling Multiphase Flows and Dispersion in Turbulence, Fractal Methods and Synthetic Turbulence*. Springer Netherlands, 2012. 9-21.

Fractal grids can be used as mixers to design turbulent flows with low power losses and high turbulence intensities for intense yet economic mixing over a region of designed length and location. The fractal mixer may be provided ahead of a heat sink, to generate turbulence in the air flow impinging on the heat sink, or may be generate by the heat sink, such as by fractal-apertured surfaces which form the heat sink.

In this set of embodiments shown in FIGS. 15, and 34-27, the fractal grid (or in the case of FIG. 15, the 3D fractal filter), the fractal grid may be separate from, or integral with, the heat sink. A cooling fan may be provided adjacent to the heat sink, within a shroud, with a fractal grid within the flow path between the fan blades and the heat sink. In another embodiment, as shown in FIGS. 38-40, the fractal grid forms part of a heat dissipative plate which forms part of the heat sink, and interacts with a flow of air. In some cases, the optimum spatial configuration of the heat sink may change as a function of temperature. In that case, a shape memory alloy or bimetallic element may be provided as part of a support for the plate (or fin, or pin, or other structure), which changes a distance or angle as a function of temperature. In the case of a shape memory alloy, the change(s) will occur abruptly, and permits defining discrete temperature range(s) for particular configurations; in the case of bimetallic elements, the change occurs continually. See, en.wikipedia.org/wiki/Shape-memory_alloy; en.wikipedia.org/wiki/Bimetallic_strip. The effect of the fractal grids is to efficiently increase turbulence with lower blockage ratios, as compared to regular (non-fractal) patterns.

The prior fractal grids are typically regular and symmetric, but according to the present technology, need not be. For example, if the heat sink is an irregular fractal design, the optimal grid will not necessarily be regular and symmetric. Similarly, where the fractal pattern is provided as part of the heat sink, the optimal pattern characteristics will vary as a function of distance from the root or heat source or branch point/line/feature. Typically, the fractal nature will extend over a limited number of orders or scales. For example, the self-similarity may extend over a range of 2-12 orders, with each order being, for example, a factor of 1.1 to about 2. For example, in a 2 order design, the scale factor will tend toward 1.5-2, while in a higher order design, the scale factor will tend toward 1.2 to 1.8. Of course, the scale factor may be any such factor within the range, e.g., 1.1, 1.2, 1.3, 1.4, 1.5, 1.6, 1.7, 1.8, 1.9, ~2.0, and any value in between. Typically, the scales will be the same between orders in a regular symmetric design, but may in fact vary over order and regionally within the system. Often, the basic design is generated using an iterated function, however, in a practical manufactured system, some simplifications, quantized values, and estimates or approximations may be employed. Thus, a feasible manufactured produce may deviate somewhat from the algorithmically optimized design, without departing from the spirit or scope of the invention. For purposes of this disclosure, a design according to an algorithm is one which deviates less than 10% full scale from the algorithmic optimum, and which avoids altering the maximum heat transfer capacity by diminution of more than 20%, Similarly, in some cases, boundary constraints are not fully calculated by the generative algorithm, the produce may provide 50% of surfaces and configuration which correspond to the generative algorithm. For example, the coupling of a heat sink to a heat source will typically be constrained to provide a regular, solid interface region, and the algorithm would generally not seek to define the mechanical interface regions. Likewise, the surface texture or perforation pattern defined by an algorithm may be independent of spatial constraints, and therefore as the pattern approaches any such constraint, the conformance with the pattern may be attenuated or ceased.

According to the design, a gross morphology may be defined, and a surface configuration imposed on the gross morphology that increase efficiency in some significant way, with significantly defined here as being greater than 2.5% of the metric. However, the morphology and surface may be interactively optimized. For example, the morphology may provide relatively large channels for heat transfer medium flows. These channels may serve to direct the flow toward a fractal or multiscale pattern, which then alters the flow pattern at that pattern and in the flows downstream from that pattern. Similarly, the fractal or multiscale pattern may generate vibrations or noise, which can then couple with portions of the morphology. While in most cases, resonant vibration of the body of the heat sink is undesirable, in other cases this may be acceptable and indeed a means to increase efficiency. For example, in a branched design as shown in FIGS. 22 and 38-45, a vibration at the tips of the heat exchange elements may increase heat transfer efficiency, and this may be induced by fluid dynamic effects remote from the tips. Meanwhile, if the tips can be designed or controlled to vibrate in antiphase, the net acoustic and vibrational output may be mitigated.

The heat sink may have thermal and/or air flow sensors on the surface, to measure or estimate heat or heat transfer medium flow effects. These may be wired, wireless, or optical-detection designs. For example, under a certain load, a model-based controller may indicate that turbulent flows are desired at a certain region of the heat sink in order to meet operational goals, which may reflect heat source temperature, operating efficiency, etc. The sensors may be used to control fan speed, or in the case of a controllable or adaptive fractal grid or surface, certain characteristics or parameters of the grid or surface. For example, an open space ratio may be altered by a mechanical transducer. On the other hand, if the fractal or multiscale structure is provided near to a fan, the structures will interact. This interaction may be unpredictable or poorly predictable, and feedback may help stabilize and optimize the operation.

The system may employ a dynamically varying bulk flow of heat transfer medium, e.g., from a fan whose speed is substantially modulated, for example over a range of at least ±15%, more preferably ±20%, and most preferably ±50%. The goal of this variation is, with equivalent fan power consumption, to generate high peak flows that more efficiency shed heat from the surfaces than a static flow rate. Preferably, at the peak flow rate, turbulence occurs, while generally it will be significantly diminished, e.g., >10%, at the lower flow rate. While the fan can in theory be stopped, providing maximum ratio, in practice the startup current of the fan motor will reduce efficiency, and the cycle time may be rapid enough that waiting for the fan to stop rotating would be inefficient. The fan may run continuously or intermittently, or with changing speed over time, and a deflector may be provided to dynamically vary the flows with respect to the heat sink.

In general, at heat loads below 50% of peak, the system may be more efficient or quieter if it avoids turbulent flows, and adopts a more traditional heat sink operating regime at low heat loads. On the other hand, by increasing peak efficiency at high loads, the heat sink may be relatively smaller, lighter, higher capacity, or less expensive materials, than more traditional designs. In general, the present design heat sinks are mechanically more complex than traditional heat sinks, and may in some embodiments have control systems which are more complex. However, the relationship between heat sink complexity and cost may be weak. On the other hand, in the case of copper or more exotic materials, the material cost may be a significant factor, and outweigh mechanical complexity as a design or feasibility constraint.

The fractal or multiscale nature of the heat sink, at one of multiple levels, may be used to enhance the turbulent nature of flows, and therefore enhancing heat transfer, with low energy loss and reduced size as compared to the parallel plate design.

Therefore, the efficiency of heat transfer may be increased as compared to a heat exchange device having a linear or Euclidian geometric variation between several heat exchange elements, at least over certain regimes of operation. This is achieved by the efficient generation of turbulent flows, which disrupt the surface boundary layer of the heat sink, leading to enhanced heat transfer. The fractal design produces efficient multiscale turbulence at small size and low energy dissipation. The turbulent flow may be induced in the stream of heat transfer medium before reaching the heat sink, such as with a multiscale filter, which has the property of organizing the turbulence, as compared, for example, to a jet. See, Dimotakis, Paul E., and Catrakis, Haris J., "Turbulence, fractals, and mixing", GALCIT Report FM97-1, Jan. 17, 1997 (Turbulent flow, or turbulence, is found to have two important and interrelated properties. It is chaotic and it can transport, stir, and mix its constituents with great effectiveness. By chaotic, we mean that it is characterized by irregular temporal and spatial dynamics that are unstably related to its initial and boundary conditions. The Random House Dictionary of the English Language (1971), for example, offers as a definition of turbulent flow, "The flow of a fluid past an object such that the velocity at any fixed point in the fluid varies irregularly.")

The heat exchange device may include a highly conductive substance whose heat conductivity exceeds 850 W/(m·K). Examples of such superconductors include graphene, diamond, and diamond-like coatings. Alternatively, the heat exchange device may include carbon nanotubes. At such high thermal conductivities, phonon heat transport may be at play.

A heat sink according to the present technology may be manufactured, for example, as a 3D print or as a casting. Further, a cast design may be produced by an investment casting (e.g., lost wax or lost foam design) from a 3D printed form or template. Thus, in practice, a design is generated on a computer-aided design (CAD) system, which may, for example, employ algorithms to optimize the shape according to various criteria, such as size, weight, heat load, air flow, other convective heat transfer parameters, infrared radiation recapture, and other criteria. The design is then converted, by a computer assisted manufacturing (CAM) system, such as an additive manufacturing "3D" printer or 2.5D printer (layers), into a form. The form, if produced using a metal sintering or ceramic process, may itself be a heat sink, though more typically the form is a polymer, which can then be used to create a mold. The mold, in turn, can be used to create multiple templates, which can be used in a casting process. Relatively complex mechanical designs can thus be replicated in volume. The molded metal may be heterogeneous, resulting in a range of properties over different regions of the mold. As discussed above, a small-scale set of features may be provided by using a coating technology, especially one which provides self-organizing features. The distribution of the small-scale features may be controlled by the deposition technology, by the characteristics/shape of the surface upon which the coating is being applied, or by a spatially selective manufacturing process.

The design may result in a fractal shape, e.g., with branches or multiple levels of branches, with multiple characteristic scales, which may have some symmetries or repetitions, or be absent symmetries and repetitions. A design which is self-similar at various scales, is considered "fractal". Some fractals avoid exact replication of structures (e.g., having asymmetric structures), while others lack any such asymmetries (e.g., having symmetric structures). A design which adopts some of these characteristics, or functionally emulates some of these characteristics, is considered "fractal-like". A design representing an array of uniform, repeating elements of the same scale is generally considered non-fractal. In some cases, a branching array having multi-directional symmetry may in some cases be considered fractal-like. A multiscale fractal (i.e., with asymmetries within each scale range) with outwardly tapering branches will tend to carry and dissipate heat further from the heat source than a symmetric design, since by nature the larger cross section branches will carry heat further than their smaller, higher-surface-area-per mass cousin branches, and the asymmetry will tend to assure that some branches indeed have larger cross sections; however, this is not the only effect to be obtained. Since the fractal is typically generated by an iterative function system (IFS) responsive to its local environment, the fractal may be optimized by a steering function to steer heat flow to areas with highest convective heat loss, while avoiding heat flow toward branches which do not efficiently shed heat. Similarly, in a vacuum heat sink emitter, the heat loss tends to be radiative, and the optimization can address maximization of net radiative heat loss within the constrained environment.

A fractal heat sink design does not have to be limited to a single fractal algorithm. Multiple independent fractal algorithms can be used. One branching fractal algorithm may be used to control three-dimensional branching structure of the heat sink, while another fractal algorithm determines two-dimensional surface of the branches. For example, a two dimensional fractal structure may include holes arranged in a fractal pattern punctured in the blades to form, for example a Sierpinski carpet or another fractal pattern. Or such two-dimensional algorithm can control the texture of the blades in the branching structure. Alternatively, a two-dimensional fractal algorithm can control branching of channels for passing cooling fluid within the blades of the branching structure. Multiple fractal algorithms co-existing in one object are often found in nature. Thus a tree leaf may have one fractal algorithm that determines the shape of the leaf and another fractal algorithm that determines the branching of veins in the leaf. In a human or animal organ, one fractal algorithm may determine the shape of the organ; another fractal algorithm may determine the branching structure of blood vessels; yet another fractal algorithm determines distribution of lymphatic vessels; still another fractal algorithm determines distribution of nerves in the organ, etc. Some of these fractal systems may be competing for resources. In a tree leaf, for example, the larger the area of the leaf, the more sunlight the leaf can absorb for photosynthesis but, on the other hand, the larger the area, the more liquid the plant is going to lose through evaporation. Competing fractal algorithms may ultimately determine the shape of the leaf or morphology of an organ. Similarly, in designing a heat exchanger, multiple and competing fractal algorithms may be used, wherein an optimization may be sought across multiple parameters. For example, increasing surface area increases heat loss through convection and radiation. At the same time, it increases dust accumulation, which may depress heat loss through convection and radiation as compared to an optimized surface. This consideration militates in favor of designing a heat sink with three-dimensional branching structure following one fractal algorithm and puncturing holes, arranged in a fractal pattern, through the blades following another two-dimensional fractal algorithm.

Various variations on this heat sink will be apparent to skilled persons in the art. For example, the heat sink could include a heat transfer surface that is connected to the heat exchange device and is designed to accept a solid to be cooled. Alternatively, there could be a connector that is designed to connect with a solid to be cooled in at least one point. There may be at least three connectors serving to keep the solid and the heat sink in a fixed position relative to one another. Various connectors will be apparent to persons skilled in the art. For example, the connector could be a point connector, a bus, a wire, a planar connector or a three-dimensional connector. The heat sink may have a central aperture or void designed to accept a solid to be cooled. The heat sink may also be integral to the heat source, or attached by other means.

This heat sink is typically intended to be used to cool objects, and may be part of a passive or active system. Modern three-dimensional laser and liquid printers can create objects such as the heat sinks described herein with a resolution of features on the order of about 16 µm, making it feasible for those of skilled in the art to use such fabrication technologies to produce objects with a size below 25 cm. Alternatively, larger heat sinks, such as car radiators, can be manufactured in a traditional manner, designed with an architecture of elements having a fractal configuration. For example, a liquid-to-gas heat exchanger (radiator) may be provided in which segments of fluid flow conduit have a fractal relationship over three levels of recursion, i.e., paths with an average of at least two branches. Other fractal design concepts may be applied concurrently, as may be appropriate.

The heat sink may comprise a heat exchange device having a plurality of heat exchange elements having a fractal variation there-between, for cooling a solid interfaced with the heat sink. A heat transfer fluid having turbulent portions is induced to flow with respect to the plurality of heat exchange elements. The fractal variation in the plurality of heat exchange elements serves to substantially reduce narrow band resonance as compared to a corresponding heat exchange device having a linear variation between a plurality of heat exchange elements.

A preferred embodiment provides a surface of a solid heat sink, e.g., an internal or external surface, having fluid thermodynamic properties adapted to generate an asymmetric pattern of vortices over the surface over a range of fluid flow rates. For example, the range may comprise a range of natural convective fluid flow rates arising from use of the heat sink to cool a heat-emissive object. The range may also comprise a range of flow rates arising from a forced convective flow (e.g., a fan) over the heat sink.

The heat sink may cool an unconstrained or uncontained fluid, generally over an external surface of a heat sink, or a constrained or contained fluid, generally within an internal surface of a heat sink.

It is therefore an object of the present invention to provide a heat sink system comprising: a base structure configured to interface with a heat source; a heat exchange device configured to receive heat from the base structure, and emit the received heat from a heat exchange surface, into an external surrounding heat exchange medium, said heat exchange device having generally fractal geometry with multiple independent fractal algorithms.

It is another object to provide a heat sink comprising: a heat transmissive body, having a base configured to receive a heat load, and a three dimensional configuration having an external surface configured to transfer a heat load corresponding to the heat load received by the base to an external heat transfer fluid; and a multiscale pattern associated with the external surface, the multiscale pattern having at least three orders over a range of at least at least three, the multiscale pattern being distinct from the three dimensional configuration, wherein the multiscale pattern is configured to disrupt a flow of the external heat transfer fluid at the external surface to reduce a stagnant surface layer to facilitate heat transfer.

The heat sink may further comprise a fan, configured to induce the flow of the external heat transfer fluid.

The multiscale pattern may be integral with, or separate from the external surface. The multiscale pattern may comprise a fractal grid. The multiscale pattern may comprise a 3D fractal filter. The multiscale pattern may comprise a perforation pattern of the external surface. The multiscale pattern may comprise a fractal texture. The multiscale pattern may comprise a 3D relief pattern on the external surface. The multiscale pattern may be configured to induce a turbulent flow of the external heat transfer fluid prior to interacting with the external surface. The multiscale pattern may be configured to induce a turbulent flow of the external heat transfer fluid while interacting with the external surface.

The three dimensional configuration may have a multiscale pattern. The multiscale pattern may be defined by a first algorithm and the three dimensional configuration is defined by a second algorithm, the first and second algorithms being respectively independently defined. The multiscale pattern may be defined by a first fractal generative algorithm and the three dimensional configuration is defined by a second fractal generative algorithm, the first and second algorithms being respectively different. The three dimensional configuration may have a progression of at least two orders of branches, wherein an aggregate cross section area after the first order of branches is less than a cross section area prior to the first order of branches, and an aggregate cross section area after the second order of branches is less than a cross section area prior to the second order of branches. The three dimensional configuration and multiscale pattern may be optimized according to a Computational Flow Dynamics model of the external heat transfer fluid. The three dimensional configuration and multiscale pattern may be optimized using a genetic algorithm to supply parameters of a generative algorithm for each of the three dimensional configuration and the multiscale pattern.

It is another object to provide a heat sink comprising: a base configured to transfer a heat load; a heat transmissive body, having the base, and a three dimensional configuration corresponding to a first algorithm with a plurality of heat exchange surfaces; and a multiscale pattern associated with the plurality of plurality of heat exchange surfaces configured to transfer a heat load corresponding to the heat load transferred to the base, to a heat transfer fluid, the multiscale pattern corresponding to a second algorithm different from the first algorithm, wherein the first layout algorithm and the second layout algorithm are together optimized responsive to both a predicted heat transfer capacity over a range of heat transfer fluid flows.

It is a further object to provide a heat sink comprising: a base configured to transfer a heat load; a heat transmissive body, having the base, having a three dimensional configuration corresponding to a first algorithm; and a multiscale perforation or surface relief pattern of a surface of the heat transmissive body, configured to transfer the heat load to a heat transfer fluid, the multiscale pattern corresponding to a second algorithm, wherein the first layout algorithm and the second layout algorithm are optimized responsive to both a predicted heat transfer capacity over a range of heat transfer fluid flows.

It is another object to provide a heat sink comprising a thermally conductive body having a topologically branched three dimensional configuration defining a plurality of heat exchange surfaces configured to transfer a heat load from the thermally conductive body to a heat transfer fluid surrounding the plurality of heat exchange surfaces, the plurality of heat exchange surfaces each having a multiscale pattern, the multiscale pattern of a first surface of the heat exchange surfaces being configured to induce a turbulent flow of the heat transfer fluid at a second surface of the heat exchange surfaces over a range of heat transfer fluid flow conditions.

It is another object to provide a heat-exchange device, comprising a plurality of heat-exchange elements arranged in a three-dimensional space in a first fractal configuration, each said heat-exchange element having a surface texture arranged in a second fractal configuration. The first fractal configuration may be a 2D fractal extended in a third dimension. The first fractal configuration may be, e.g., an L-system (en.wikipedia.org/wiki/L-system); a Quadratic Koch Island (paulbourke.net/fractals/quadratic_koch_island_a/, Addison, Paul S., Fractals and Chaos: An illustrated course, Institute of Physics Publishing 1997), a Koch Snowflake (en.wikipedia.org/wiki/Koch snowflake), a modified Koch Snowflake, an Icosahedron flake en.wikipedia.org/wiki/N-flake), an Octahedron flake, a fractal canopy (en.wikipedia.org/wiki/Fractal_canopy), a fractal tree (e.g., en.wikipedia.org/wiki/H_tree), a fractal grid (e.g., en.wikipedia.org/wiki/List_of_fractals_by_Hausdorff_dimension), a Sierpinski Triangle (en.wikipedia.org/wiki/Sierpinski_triangle), a Sierpinski Carpet (en.wikipedia.org/wiki/Sierpinski_carpet), a Sierpinski tetrahedron, a Dodecaedron fractal (commons.wikimedia.org/wiki/Fractal, www.georgehart.com/rp/polyhedra-clusters/Polyhedra-Clusters.html), a Cantor set (en.wikipedia.org/wiki/Cantor_set), Cantor dust, 3D Cantor dust, a branching tree, or a Peano curve (en.wikipedia.org/wiki/Peano_curve). The second fractal configuration may comprise Cantor dust, a crinkled canopy (www.iasefmdrian.com/cricnkled-canopy-random-fractal), a Koch surface (robertdickau.com/kochsurface.html), or a Triangular Koch fractal surface, for example.

It is another object to provide a heat-exchange device configured to operate in a fluid medium, said heat-exchange device comprising a plurality of heat-exchange elements arranged in a three-dimensional space in a first fractal configuration, each respective heat-exchange element being perforated with a plurality of holes to allow the fluid medium to flow through the holes, the plurality of holes being arranged according to a second fractal pattern. The plurality of holes are arranged in a pattern corresponding to an Appolony Fractal (paulbourke.net/fractals/apollony/, paulbourke.net/papers/apollony/apollony.pdf), a Circle Inversion Fractal (en.wikipedia.org/wiki/List_of mathematical shapes), a Circle Packing Fractal (en.wikibooks.org/wiki/Fractals/Apollonian_fractals), Apollonian Gasket (en.wikipedia.org/wiki/Apollonian_gasket), a Sierpinski Carpet, and a Hex Fractal Carpet (erkdemon.blogspot.com/2009/12/hex-fractal-carpet.html, www.nahee.com/spanky/www/fractint/lsys/truefractal.html).

It is a further object to provide an electronic device having at least one electronic component generating excess heat and a heat-exchange device coupled to said electronic component to dissipate heat from the electronic component, said heat-exchange device comprising a plurality of heat-exchange elements arranged in a three-dimensional space in a first fractal configuration, each respective heat-exchange element having a surface texture arranged in a second fractal configuration.

It is a still further object to provide an electronic device having at least one electronic component generating excess heat and a heat-exchange device coupled to said electronic component and configured to operate in a fluid medium, to dissipate heat from the electronic component, said heat-exchange device comprising a plurality of heat-exchange elements arranged in a three-dimensional space in a first fractal configuration, each respective heat-exchange element being perforated with a plurality of holes arranged according to a second fractal pattern, configured to allow the fluid medium to flow through the holes.

It is another object to provide a method of operating an electronic device having at least one electronic component generating excess heat, the method comprising the steps of: conducting the heat away from said at least one electronic component generating excess heat to the heat-exchange device coupled to said at least one electronic component, said heat-exchange device comprising a plurality of heat-exchange elements arranged in a three-dimensional space in a first fractal configuration, each said heat-exchange element having a surface texture arranged in a second fractal configuration; and dissipating the excess heat from the heat-exchange elements into the environment.

Another object provides a method of operating an electronic device having at least one electronic component generating excess heat, the method comprising the steps of: conducting the heat away from said at least one electronic component generating excess heat to the heat-exchange device coupled to said at least one electronic component and configured to operate in a fluid medium, said heat-exchange device comprising a plurality of heat-exchange elements arranged in a three-dimensional space in a first fractal configuration, each respective heat-exchange element being perforated with a plurality of holes arranged according to a second fractal pattern configured to allow the fluid medium to flow through the holes; and dissipating the excess heat from the heat-exchange elements into the fluid medium.

It is a still further object to provide a method of dissipating heat, comprising: providing a heat transmissive body, having a base configured to receive a heat load, and a three dimensional configuration having an external surface configured to transfer a heat load corresponding to the heat load received by the base to an external heat transfer fluid; interacting a multiscale pattern associated with the external surface with a flow of the external heat transfer fluid, to generate turbulence in the a flow of the external heat transfer fluid and reduce a stagnant surface layer to facilitate heat transfer; and controlling the flow of the external heat transfer fluid based on at least one measurement corresponding to at least one of a heat transfer of the heat load to the external heat transfer fluid and a turbulence of the flow of the external heat transfer fluid. The controlling may be dependent on an acoustic emission, a correspondence of a temperature of the heat transmissive body to a computation flow dynamics model of heat transfer in the heat transmissive body, a thermodynamic parameter. The control can alter turbulence, and in particular may control the onset or occurrence of significant turbulence, the location of turbulence, and amount of turbulence, for example. On the other hand, the control can seek to avoid turbulence, and modify flow parameters to meet thermal criteria while avoiding objectionable noise. The control can also dynamically change turbulence, for example as a way to create concentrated surface forces as a way to dislodge particles on the surface of the heat sink. Further, by dynamically controlling turbulence, heat dissipation may be selectively increased in various regions of the heat sink at different times. The dynamic process may therefore locally reduce air flow to permit an increase in temperature, and then selectively increase the air flow, providing high efficiency heat dissipation due to the combination of higher temperature differential and reduced boundary layer thickness. This dynamic process may have a higher efficiency than a static process wherein the temperature differential between the heat sink surface and the heat transfer medium is stabilized at a low difference, and a uniform, distributed air flow leads to a uniformly relatively thicker boundary layer.

BRIEF DESCRIPTION OF THE DRAWINGS

FIGS. 25-26 shows a top view of heat sink simulation models corresponding to the prior art heat sink shown in FIG. 24 with different number of branches, and the approximately calculated thermal resistance trend for one branch and simulation results of the same branch of a branched heat sink.

FIGS. 27-28 shows simulation results of normalized thermal resistance for different numbers of branches, and a cross section view of a thermal model showing internal temperature and external air velocity for a plate and branched heat sink.

DETAILED DESCRIPTION OF THE PREFERRED EMBODIMENTS

Figure 1:
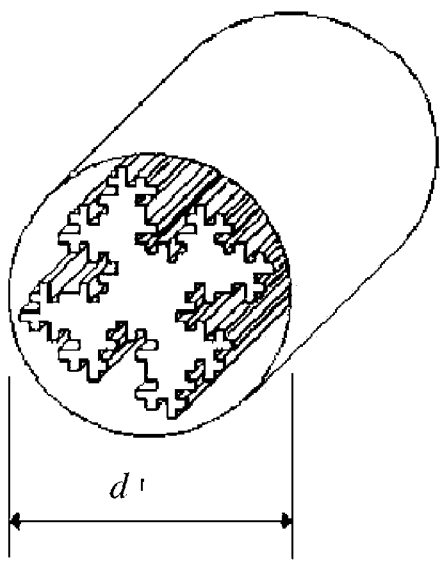
FIG. 1 illustrates a fractal heat sink that is an exemplary embodiment of the invention, in which the heat sink is based on a Quadratic Koch Island, or a fractal flow filter.
Figure 3:
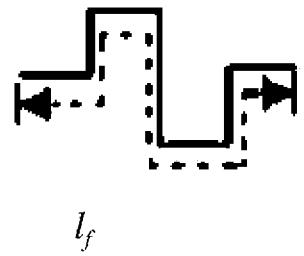
FIG. 3 illustrates the total length of all the fractal segments of a Quadratic Koch Island.
Figure 2A:
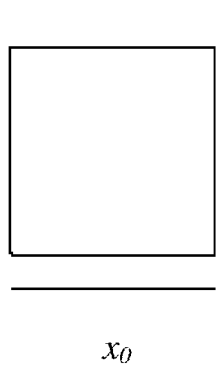
FIGS. 2A-2C illustrate the basis for the Quadratic Koch Island, a Quadratic Koch Island obtained after application of one iteration, and a Quadratic Koch Island obtained after application of several iterations.
Figure 2B:
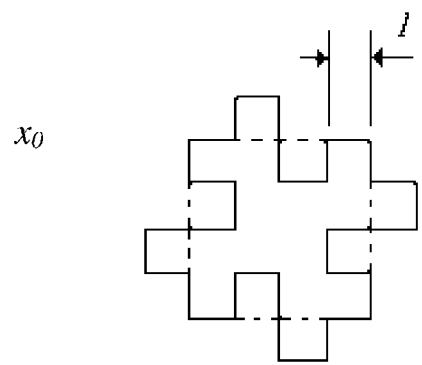
Figure 2C:
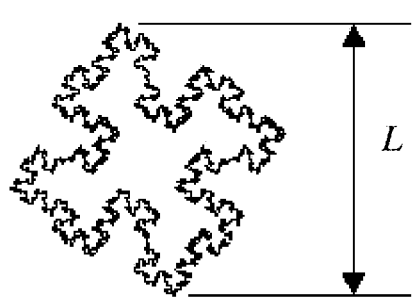

FIG. 1 illustrates a fractal heat sink that is an exemplary embodiment of the invention. In this embodiment, the heat sink is based on a Quadratic Koch Island. In a shorter length, this also represents a fractal flow filter. The Quadratic Koch Island may have a regular or irregular twist pattern within the shroud. FIG. 2A illustrates the basis for the Quadratic Koch Island. FIG. 2B illustrates a Quadratic Koch Island obtained after application of one iteration. FIG. 2C illustrates a Quadratic Koch Island obtained after application of several iterations. FIG. 3 illustrates the total length of all the fractal segments of a Quadratic Koch Island.

FIG. 2A illustrates a square with dimension $x_0$ that forms the basis for the Quadratic Koch Island. FIG. 2B illustrates a Quadratic Koch Island obtained after application of one fractal iteration on the square. The fractal with section lengths of l is applied to each side of the square in the first iteration. Similarly, after several such iterations, a Quadratic Koch Island as illustrated in FIG. 2C may be obtained.

FIG. 3 illustrates the length of the fractal $l_f$ which is the total length of all the fractal segments. The length of each fractal section, l(n), decreases with each iteration of the fractal. The fractal section length is described by eq. 7.

$$l(n) = \left(\frac{1}{4}\right)^n x_0 \qquad (7)$$

where, $x_0$ is the length of the side of the original square, n is the number of iterations, and $A_s$, the surface area, can be seen from eq. 7, the fractal section length decreases after each iteration. When the number of iterations becomes increasingly large, the section length tends towards being negligible.

Further, it may be mathematically shown that the overall length L of the fractal may be obtained from eq. 8.

$$L(n) = x_0\left(1 + \frac{2}{3}\left(1 - \frac{1}{4^n}\right)\right) \qquad (8)$$

where, $x_0$ is the length of the side of the original square and n is the number of iterations.

Similarly, it may be shown that the circumference C of the Quadratic Koch Island can be obtained from eq. 9.

$$C = 4(2^n x_0) \qquad (9)$$

where, $x_0$ is the length of the side of the original square and n is the number of iterations. It is evident that with each iteration, the circumference C increases. However, the cross-sectional area remains constant at $x_0^2$ since when a fractal area is added the same area is subtracted elsewhere.

The number of iterations corresponding to the Quadratic Koch Island may be greater than 5. Consequently, the heat exchange device functions as a compact heat exchanger. In other words, the heat exchange device has a large heat transfer area per unit exchanger volume. As a result, several advantages are obtained such as, but not limited to, reduction in space, weight, power requirements and costs. In another embodiment, the number of iterations corresponding to the Quadratic Koch Island may be less than or equal to 5. Consequently, the heat exchange device may function as a non-compact heat exchanger. The Quadratic Koch Island extended in the third dimension, as shown in FIG. 1, so that the cross-section remains a two-dimensional Quadratic Koch Island.

It may be shown with heat transfer analysis that heat transfer and heat transfer coefficient increase independently of each other with every application of the fractal. Further, the increase may be double, or greater, with every fractal iteration. In general, the increase in heat transfer is exponential following a trend of $2^n$. Moreover, pumping power increases linearly, at almost one and a half the rate. Pumping power is the power needed to pump the heat transfer fluid through the heat exchange device.

Figure 4A:
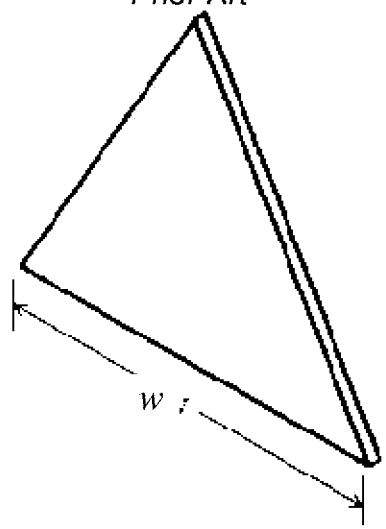
FIGS. 4A and 4B illustrate a basis for generating the modified Snowflake, and the modified Koch Snowflake.
Figure 4B:
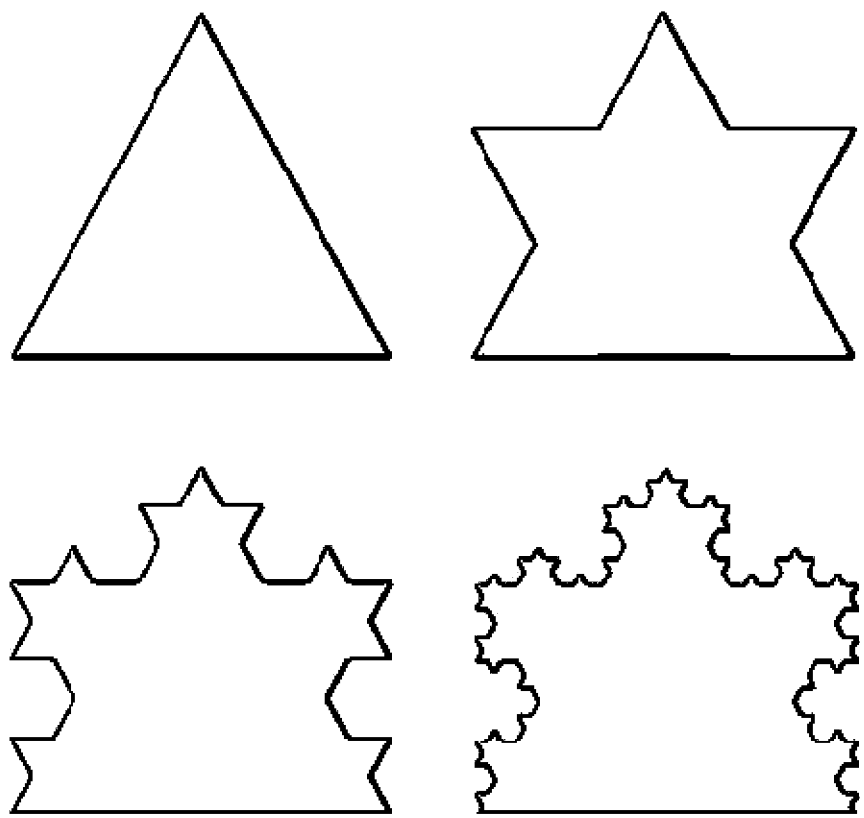
Figure 11:
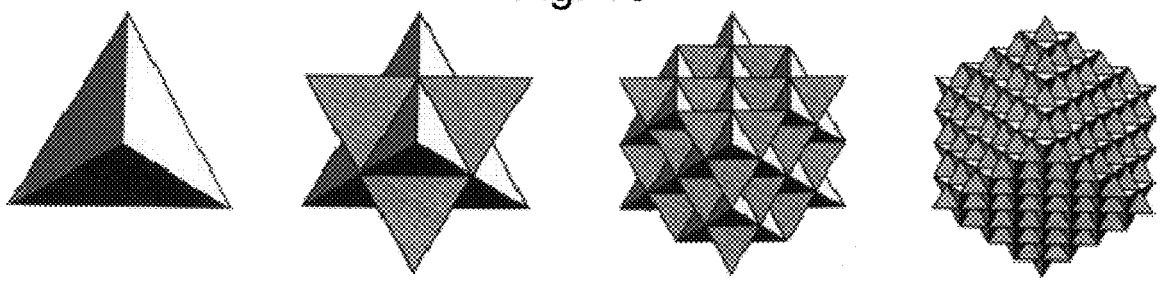
Figure 23:
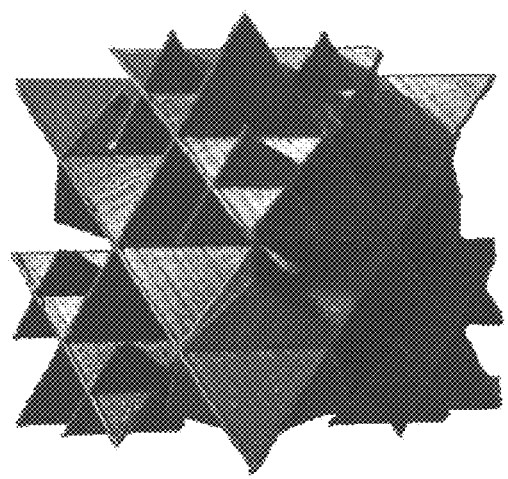
FIG. 23 shows a solid fractal mass with based on Serpinski's trangles, with a set of exposed surfaces.

FIG. 4A illustrates a basis for generating a modified Snowflake. FIG. 4B illustrates a fractal heat sink based on the modified Koch Snowflake of FIG. 4A, which has triangles of different scales. This design can be extended into three dimensions, as shown in FIGS. 11 and 23, which build upon pyramids.

The basis for generating the modified Snowflake is an equilateral triangle of width w, as illustrated in FIG. 4A. In the first iteration, two smaller equilateral triangles of width ⅓ of the base width w are added onto two sides of the base triangle. Similarly, by applying second and a third iteration, the modified Koch Snowflakes as illustrated in FIG. 4B may be obtained.

In general, for a self-similar object that can be decomposed into in self-similar elements with a magnification factor n, the fractal dimension is given by:

$$D = \frac{\log m}{\log n} = \frac{\log(\text{number of self-similar elements})}{\log(\text{magnification factor})}$$

The fractal dimension of the Koch snowflake is given by $$D = \frac{\log 4}{\log 3} \approx 1.26186$$

The surface area, $A_s(n)$, of the modified Koch Snowflake (including sidewalls) may be obtained from eq. 10.

$$A_s(n) = 2\left(wt + \frac{\sqrt{3}}{4}w^2\right) + \sum_1^n \left[\left(\frac{w}{3^n}\right)^2\left(\frac{\sqrt{3}}{2}\right) + \left(\frac{w}{3^n}\right)t\right]2^{2n-1} \qquad (10)$$

where, w is the width of the base triangle, n is the number of iterations, and t is the thickness of the modified Koch Snowflake (not labelled in FIG. 4B).

It is evident that the surface area of the modified Koch Snowflake increases with each iteration. More specifically, it may be observed that after 5 iterations there is an increase in surface area of about 58%.

Further, the mass of the modified Koch Snowflake may be obtained using eq. 11.

$$m(n) = \left\{\frac{\sqrt{3}}{4}w^2 + \sum_1^n\left[\left(\frac{w}{3^n}\right)^2\left(\frac{\sqrt{3}}{4}\right)\right]2^{2n-1}\right\}\rho t \qquad (11)$$

where, w, n, and t are as above, and p is the density of the material making up the modified Koch Snowflake.

It may be observed that the change in surface area with respect to the baseline case (i.e., n=0) is a function of width (w) and thickness (t). However, the change in mass with respect to the baseline is dependent on the number of iterations. The mass of a design according to the modified Koch Snowflake increases with each iteration. However, it converges to a maximum value of mass increase of approximately 40%.

A heat transfer effectiveness (ε) of a heat exchanger made approximately in a shape of the modified Koch Snowflake may be defined as the ratio of heat transfer achieved to heat transfer that would occur if the modified Koch Snowflake was not present. ε may be calculated from eq. 12.

$$\varepsilon = \frac{Q_c}{hA_s(T_b - T_\infty)} \qquad (12)$$

where, Q is the heat rate, h is the heat transfer coefficient, $A_s$ is the area, and T is the temperature.

Further, a heat-transfer efficiency (η) of a heat exchanger made approximately in a shape of the modified Koch Snowflake may be defined as the ratio of heat transfer achieved to the heat transfer that would occur if the entire modified Koch Snowflake was at the base temperature. η may be calculated from eq. 13, where, Q, h, As, and T are as above.

$$\eta = \frac{Q_c}{hA_s(T_b - T_\infty)} \quad (13)$$

The heat transfer effectiveness (E) increases with each iteration. The modified Koch Snowflake corresponding to three iterations may be used to form the heat exchange device. Accordingly, the heat transfer effectiveness (ε) may increase by up to 44.8%. Further, the increase in heat transfer effectiveness (ε) per mass may be up to 6%. The material used to make the modified Koch Snowflake may be aluminum. Consequently, heat transfer effectiveness (ε) per mass of approximately two times larger than that obtained using copper may be achieved.

Further, the heat transfer effectiveness (ε) per mass depends on the thickness the heat-exchange plate with a shape of the modified Koch Snowflake. The ratio of width (w) to thickness (t) corresponding to the modified Koch Snowflake may be 8. Accordingly, an increase in heat transfer effectiveness (ε) per mass of up to 303% may be achieved at the fourth iteration.

Figure 5A:
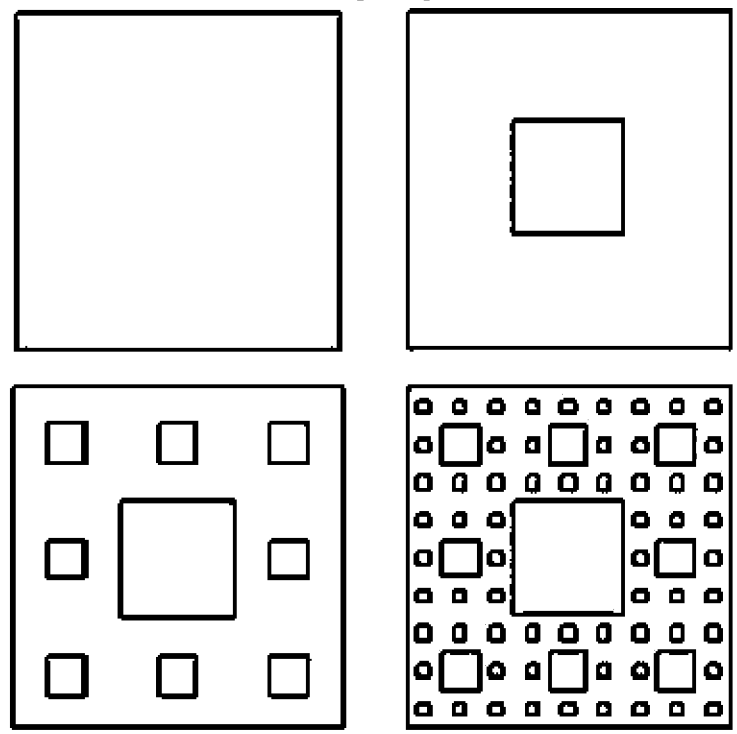
FIGS. 5A and 5B illustrates a fractal heat sink that based on a Sierpinski Carpet, and the basis for generating the Sierpinski Carpet.
Figure 5B:
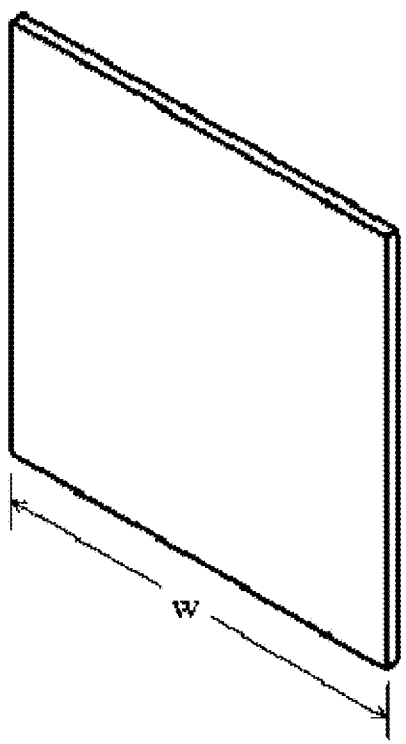

FIG. 5A illustrates a fractal heat sink that is based on a Sierpinski Carpet. FIG. 5B illustrates the basis for generating the Sierpinski Carpet. The Sierpinski Carpet is formed by iteratively removing material from a base geometry such as, but not limited to, a square as illustrated in FIG. 5B. In the first iteration, a square with ⅓ of the base width (w) is removed. Similarly, by performing second and third iterations, the Sierpinski Carpets as illustrated in FIG. 5A may be obtained.

The surface area, $A_s(n)$, of the Sierpinski Carpet (including sidewalls) may be obtained from eq. 14.

$$A_s(n) = 2w^2 + 3wt + \sum_{1}^{n} 8^{n-1}\left[2\left(\frac{w}{3^n}\right)^2 - 4\left(\frac{w}{3^n}\right)t\right] \quad (14)$$

where, w is the width of the base square, n is the number of iterations, and t is the thickness of the Sierpinski Carpet.

Starting from n=0, with each subsequent iteration, the surface area of the Sierpinski carpet initially reduces before reaching a minimum. However, after reaching the minimum, the surface area increases with each subsequent iteration. For example, at a width (w) of 0.0508 m an increase in surface area of 117% may be obtained after five iterations. Similarly, at a width (w) of 0.0254 m, a surface area increase of 265% may be obtained after five iterations.

Further, the mass of the Sierpinski Carpet may be obtained using eq. 15.

$$m(n) = \left\{w^2 - \sum_{1}^{n}\left[8^{n-1}\left(\frac{w}{3^n}\right)^2\right]\right\}\rho t \quad (15)$$

where w, n, and t are as above, and ρ is the density of the material making up the Sierpinski carpet.

It may be seen from eq. 15 that with each iteration, the mass of the Sierpinski carpet decreases. For example, after five iterations, there is a 45% mass reduction.

The heat transfer effectiveness (E) corresponding to the Sierpinski carpet increases with each iteration. The Sierpinski carpet corresponding to three iterations may be used to form the heat exchange device. Accordingly, in this case, the heat transfer effectiveness (ε) may increase by up to 11.4%. Further, the increase in heat transfer effectiveness (ε) per mass corresponding to the Sierpinski carpet may be up to 59%. The material used to make the Sierpinski carpet may be aluminum. Consequently, heat transfer effectiveness (ε) per mass of approximately two times larger than that obtained using copper may be achieved.

Further, the heat transfer effectiveness (ε) per mass corresponding to the Sierpinski carpet depends on the thickness of the corresponding to the Sierpinski carpet. The ratio of width (w) to thickness (t) corresponding to the Sierpinski carpet may be 8. Accordingly, a 303% increase in heat transfer effectiveness (ε) per mass may be achieved at the fourth iteration.

The heat sink may also comprise a heat exchange device which is structurally configured based on, but not limited to, one or more fractals selected from the group comprising: A "scale 2" and "scale 3" Mandelbox; Sierpinski tetrahedron; Fractal pyramid; Dodecahedron fractal; 3D quadratic Koch surface (type 1); 3D quadratic Koch surface (type 2); Jerusalem cube; Icosahedron fractal; Octahedron fractal; Von Koch surface; Menger sponge; 3D H-fractal; Mandelbulb; or any number of other 2D and 3D fractals and combinations thereof. 2D and 3D, as used herein, mean topologically two-dimensional and three-dimensional objects respectively.

Figure 6:
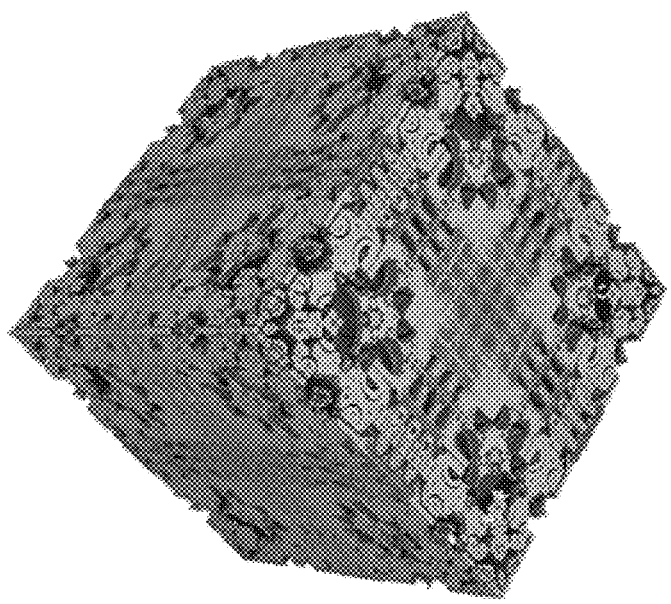
FIGS. 6-15 illustrate fractal heat sinks that based on a three-dimensional Mandelbox fractal, a Sierpinski tetrahedron, a Dodecaedron fractal, an Icosahedron flake, an Octahedron flake, a 3D Quadratic Koch, a Jerusalem cube, a von Koch surface, a Menger sponge, and a 3D H fractal, respectively.

FIG. 6 illustrates a fractal heat sink that is based on a three-dimensional Mandelbox fractal. In practice, the Mandelbox does not need to be complete, and may be cut to provide a suitable interface to a heat source. A Mandelbox is a box-like fractal object that has similar properties as that of the Mandelbrot set. It may be considered as a map of continuous, locally shape preserving Julia sets. Accordingly, the Mandelbox varies at different locations, since each area uses a Julia set fractal with a unique formula. The Mandelbox may be obtained by applying eq. 16 repeatedly to every point in space. That point v is part of the Mandelbox if it does not escape to infinity.

$$v = s*\text{ballFold}(r, f*\text{boxFold}(v)) + c \quad (16)$$

where boxFold(v) means for each axis a:
if v[a]>1 v[a]=2−v[a], else if v[a]<−1 v[a]=−2−v[a]
and ballFold(r, v) means for v's magnitude m:
if m<r in =m/r², else if m<1 m=1/m In an instance, using the values of s=2, r=0.5 and f=1 in eq. 12, the standard Mandelbox may be obtained.

Figure 15:
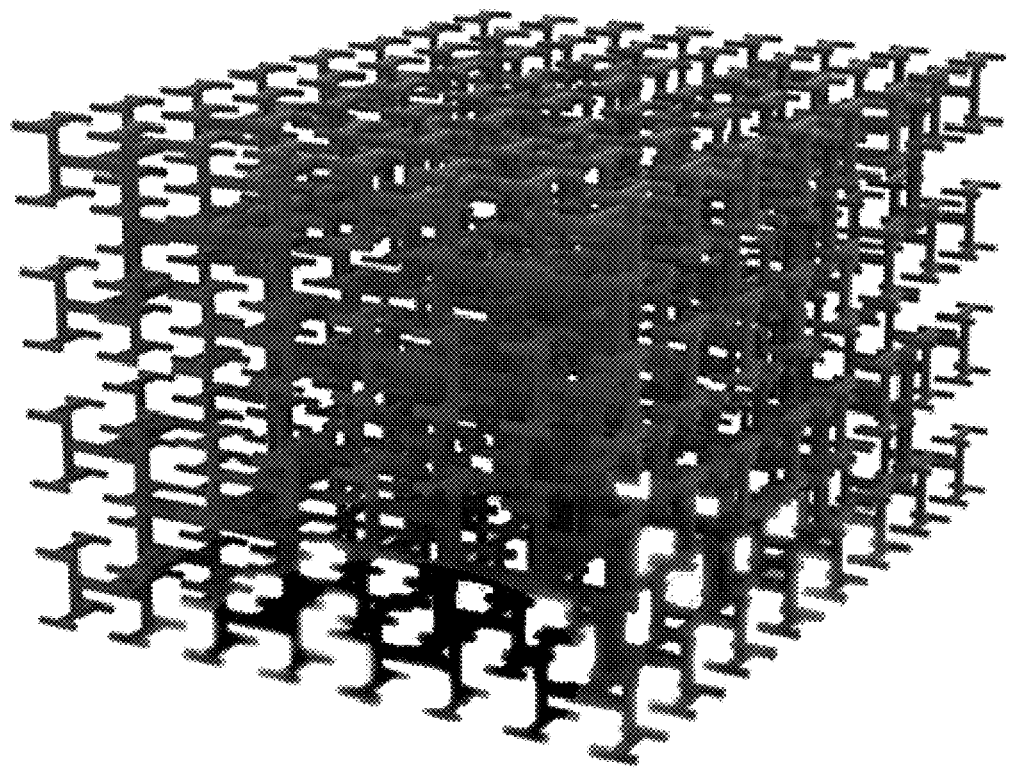

Because the Mandelbox is inherently a three-dimensional shape, it may be used in conjunction with a multiscale filter, such as a fractal grid or the device according to FIG. 15, to induce turbulent flows in the heat exchange fluid surrounding the Mandelbox. It is noted that the Mandexbox is a case where the surface texture and the morphology are defined by a single generative algorithm, and therefore the structure inherently possesses similarities in terms of fluid dynamical performance with other designs according to the present invention that employ distinct generative algorithms. A formal Mandelbox is difficult to manufacture, and optimizing internal configuration of a complete Mandelbox is also somewhat challenging. Therefore, the Mandelbox approach may be implemented as a surface configuration of a solid heat sink, to provide multiscale surface features while providing a dense core structure.

Figure 7:
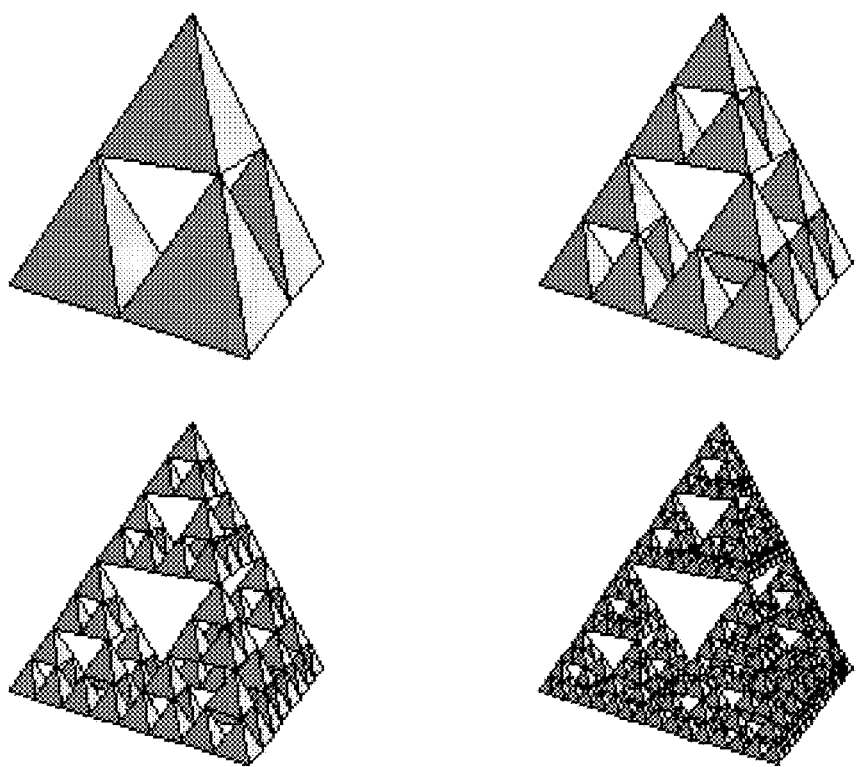

FIG. 7 illustrates a fractal heat sink that is based on a Sierpinski tetrahedron, over a range of orders. The Sierpinski tetrahedron, also called as tetrix, is a three-dimensional analogue of the Sierpinski triangle. The Sierpinski tetrahedron may be formed by repeatedly shrinking a regular tetrahedron to one half its original height, putting together four copies of this tetrahedron with corners touching, and then repeating the process. This is illustrated in FIG. 7 for the first four iterations. The Sierpinski tetrahedron constructed from an initial tetrahedron of side-length L has the property that the total surface area remains constant with each iteration.

The initial surface area of the (iteration-0) tetrahedron of side-length L is $L^2\sqrt{3}$. At the next iteration, the side-length is halved and there are 4 such smaller tetrahedra. Therefore, the total surface area after the first iteration may be calculated by eq. 17.

$$4\left(\left(\frac{L}{2}\right)^2 \sqrt{3}\right) = 4\frac{L^2}{2}\sqrt{3} = L^2\sqrt{3} \qquad (17)$$

This remains the case after each iteration. Though the surface area of each subsequent tetrahedron is ¼ that of the tetrahedron in the previous iteration, there are 4 times as many—thus maintaining a constant total surface area. However, the total enclosed volume of the Sierpinski tetrahedron decreases geometrically, with a factor of 0.5, with each iteration and asymptotically approaches 0 as the number of iterations increases.

Figure 8:
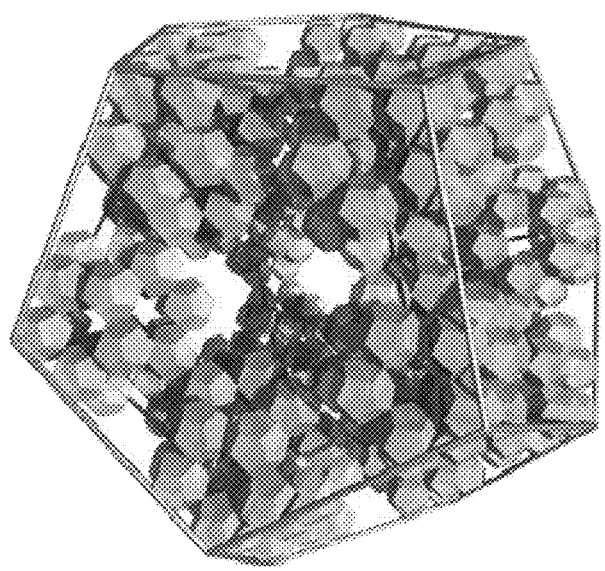

FIG. 8 illustrates a fractal heat sink that is based on a Dodecaedron fractal, also called a dodecahedron flake, which may be formed by successive flakes of twenty regular dodecahedrons, as exemplarily illustrated in FIG. 8 for a second iteration. Each flake is formed by placing a dodecahedron scaled by $1/(2+\varphi)$ in each corner, wherein $\varphi=(1+\sqrt{5})/2$.

Figure 9:
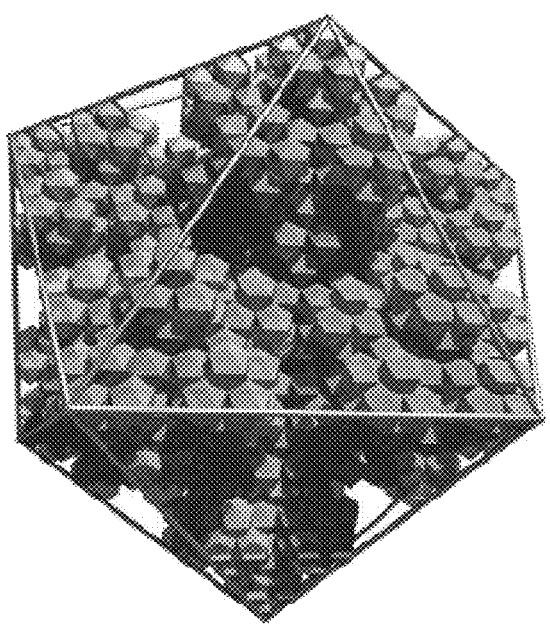

FIG. 9 illustrates a fractal heat sink that is based on an Icosahedron flake, showing octahedron flake, or Sierpinski octahedron, which may be formed by successive flakes of six regular octahedrons, as exemplarily illustrated in FIG. 9 for a third iteration. Each flake may be formed by placing an octahedron scaled by ½ in each corner. Each flake may be formed by placing an icosahedron scaled by $1/(2+\varphi)$ in each corner, wherein $\varphi=(1+\sqrt{5})/2$.

Figure 10:
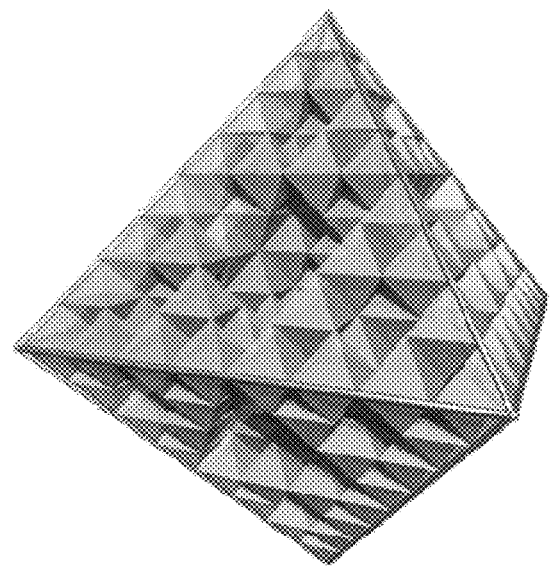

FIG. 10 illustrates a fractal heat sink that is based on an Octahedron flake. The heat absorption surface may be any face of the Octahedron flake, or the flake may be bisected and the resulting semi-Octahedron flake mounted to a surface for heat dissipation.

FIG. 11 illustrates a fractal heat sink that is based on a 3D Quadratic Koch. As exemplified in FIG. 11, the 3D Quadratic Koch may be obtained by growing a scaled down version of a triangular pyramid onto the faces of the larger triangular pyramid with each iteration. FIG. 11 illustrates the first four iterations.

Figure 12:
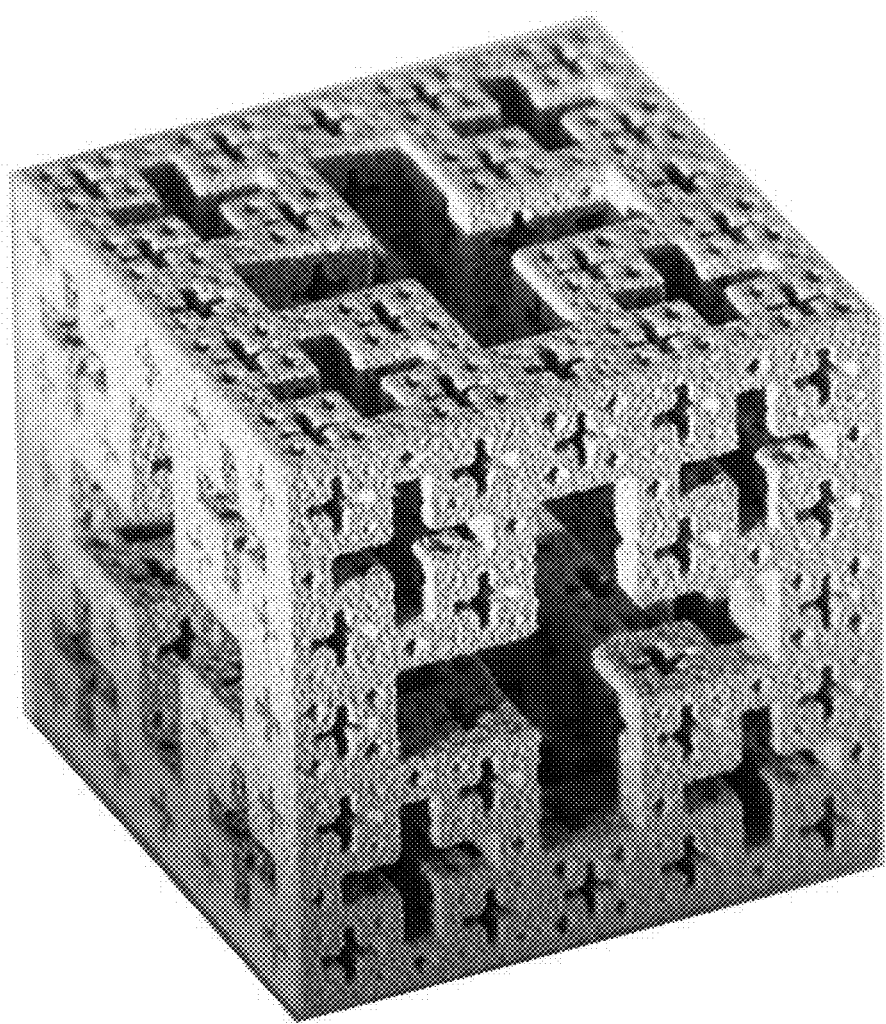

FIG. 12 illustrates a fractal heat sink that is based on a Jerusalem cube. The Jerusalem cube may be obtained by recursively drilling Greek cross-shaped holes into a cube. The Jerusalem Cube may be constructed as follows: (1) Start with a cube; (2) Cut a cross through each side of the cube, leaving eight cubes (of rank +1) at the corners of the original cube, as well as twelve smaller cubes (of rank +2) centered on the edges of the original cube between cubes of rank +1; and (3) Repeat the process on the cubes of rank 1 and 2. Each iteration adds eight cubes of rank one and twelve cubes of rank two, a twenty-fold increase.

Figure 13:
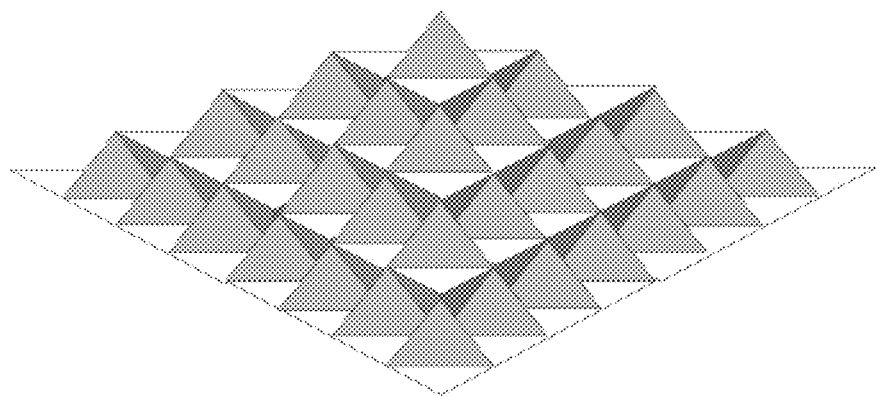

FIG. 13 illustrates a fractal heat sink that is based on a von Koch surface. The von Koch surface may be constructed by starting from an equilateral triangular surface. In the first iteration, the midpoints of each side of the equilateral triangular surface are joined together to form an equilateral triangular base of a hollow triangular pyramid. This process is repeated with each iteration.

Figure 14:
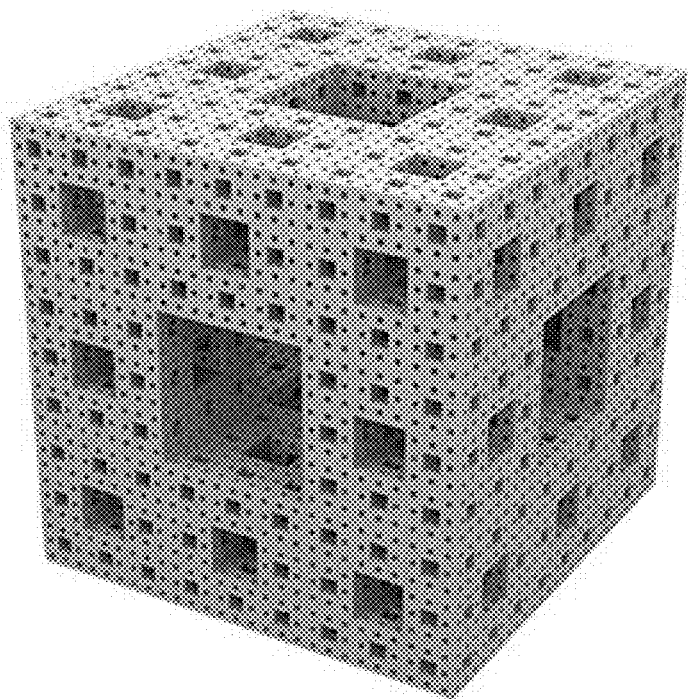

FIG. 14 illustrates a fractal heat sink that is based on a Menger sponge. The Menger sponge may be constructed as follows: (1) Begin with a cube (first image); (2) Divide every face of the cube into 9 squares, like a Rubik's Cube. This will sub-divide the cube into 27 smaller cubes; (3) Remove the smaller cube in the middle of each face, and remove the smaller cube in the very center of the larger cube, leaving 20 smaller cubes (second image). This is a level-1 Menger sponge (resembling a Void Cube); and (4) Repeat steps 2 and 3 for each of the remaining smaller cubes, and continue to iterate until a desired scale is reached.

FIG. 15 illustrates a fractal heat sink that is based on a 3D H fractal. As noted above, according to some embodiments, this structure is used to induce turbulent flow, and it not itself a heat sink; in other embodiments, the 3D frame is both a turbulence generating structure and a heat sink. The 3D H fractal is based on an H-tree which may be constructed by starting with a line segment of arbitrary length, drawing two shorter segments at right angles to the first through its endpoints, and continuing in the same vein, reducing (dividing) the length of the line segments drawn at each stage by $\sqrt{2}$. Further, by adding line segments on the direction perpendicular to the H tree plane, the 3D H fractal may be obtained.

The heat sink may comprise a heat exchange device which is structurally configured based on a Mandelbulb (not shown). The Mandelbulb is a three-dimensional analogue of the Mandelbrot set. The Mandelbulb may be defined as the set of those C in $\mathbb{R}^3$ for which the orbit of <0, 0, 0> under the iteration $v \vdash \rightarrow v^n + c$ is bounded, where the "nth power" of the vector $v=\langle x, y, z\rangle$ in $\mathbb{R}^3$ is given by eq. 17.

$$v^n := r^n \langle \sin(n\theta)\cos(n\phi), \sin(n\theta)\sin(n\phi), \cos(n\theta)\rangle \qquad (17)$$

Where $r=\sqrt{x^2+y^2+z^2}$, $\phi=\arctan(y/x)=\arg(x+yi)$, and $\theta=\arctan(\sqrt{x^2+y^2}/z)=\arccos(z/r)$.

As with the Mandelbox, the surface texture and the morphology of the Sierpinski tetrahedron, Dodecaedron fractal, Icosahedron flake, Octahedron flake, 3D Quadratic Koch, Jerusalem cube, von Koch surface, Menger sponge, 3D H fractal, and Mandelbulb structures are each defined by a single generative algorithm. The 3D fractal (multiscale) structure may be coupled in use with an external multiscale element (or the same or a different multiscale 2D or 3D structure) which interacts with the heat transfer fluid to induce turbulent flows, or may be provided as a surface configuration of an independently defined heat sink morphology. For example, a 3D multiscale structure may be self-organizing on a surface, provided as a section of a formal shape, or the design principles used to generate the morphology using the basic surface configuration and other mechanical limits as constraints in the generative algorithm.

Figure 16:
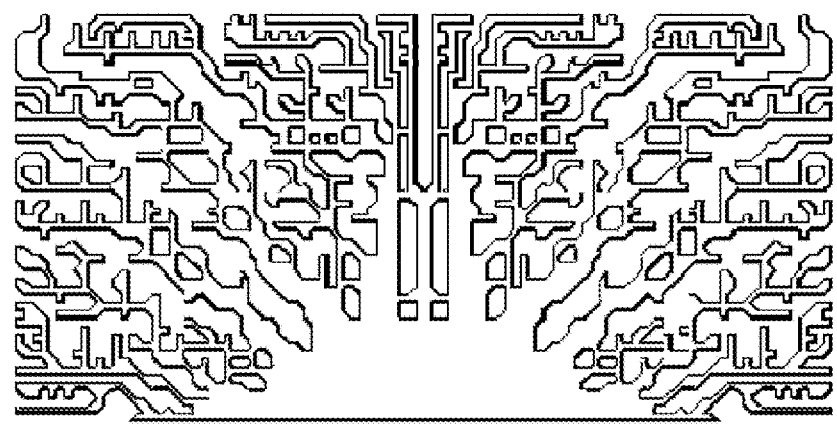
FIGS. 16-17 show a face and perspective view of a prior art extruded heat sink having an irregular design.
Figure 17:
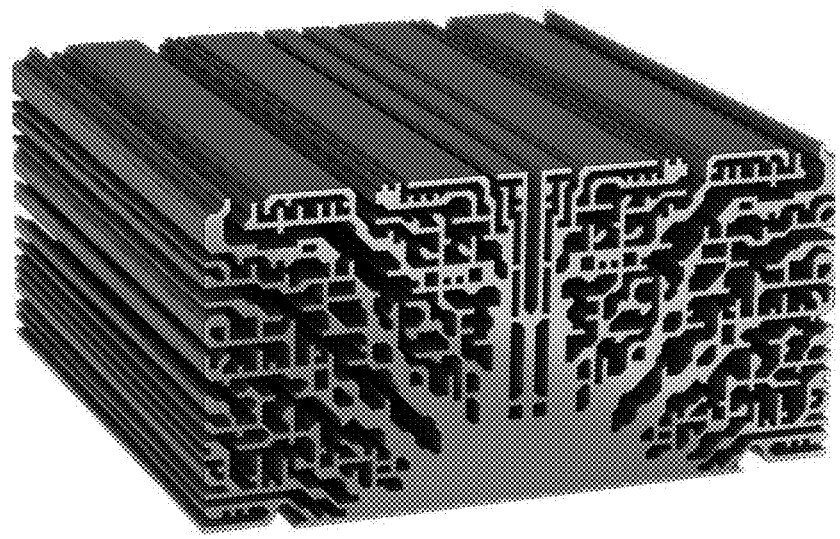
Figure 18:
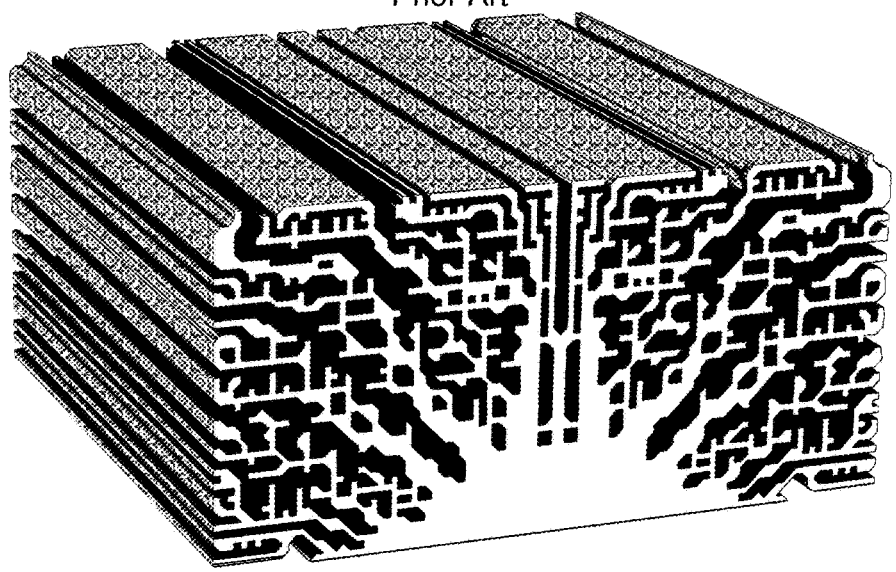
FIG. 18 shows the design according to FIGS. 16 and 17 with a fractal surface pattern.

FIGS. 16-17 show a face and perspective view of a prior art extruded heat sink having an irregular design. FIG. 18 shows the design according to FIGS. 16 and 17 with a fractal surface pattern. In similar manner, the present technology permits heat exchange surfaces to be modified with a surface texture or perforation patterns that interact with heat exchange fluid flows, and over a range of flows, induce turbulence.

Figure 19:
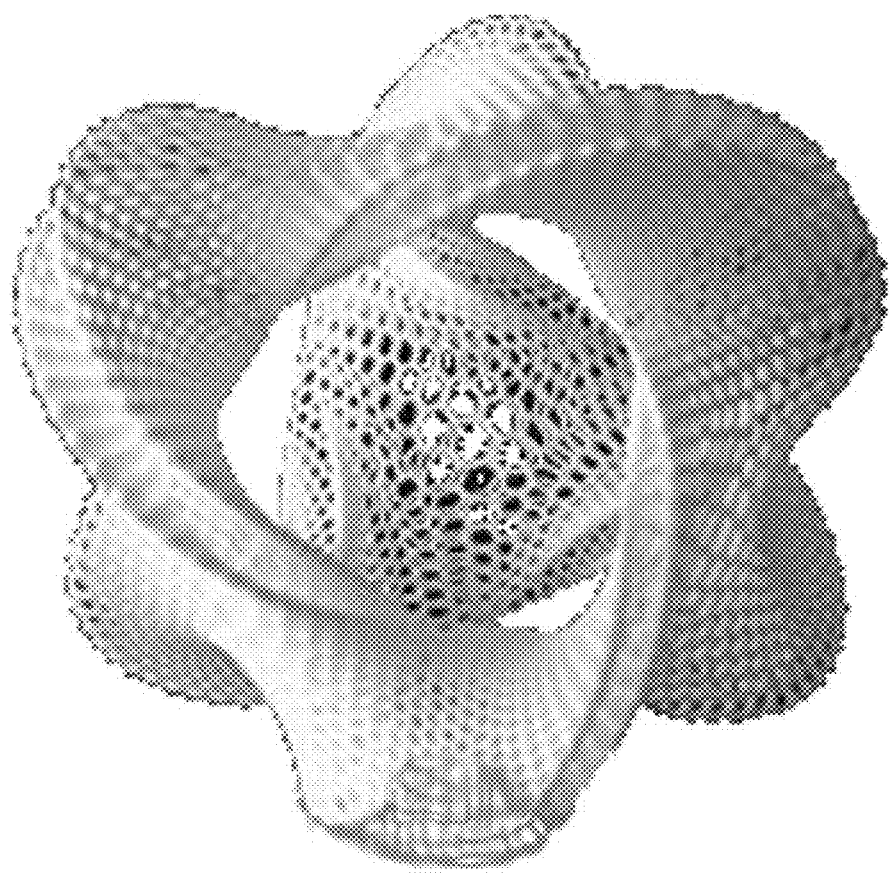
FIGS. 19-21 illustrate various three dimensional fractal-like structures, which may be used to induce turbulence in a flowing heat transfer medium, or may act as heat sinks for a heat source, which may be located centrally or eccentrically within the respective structure.
Figure 20:
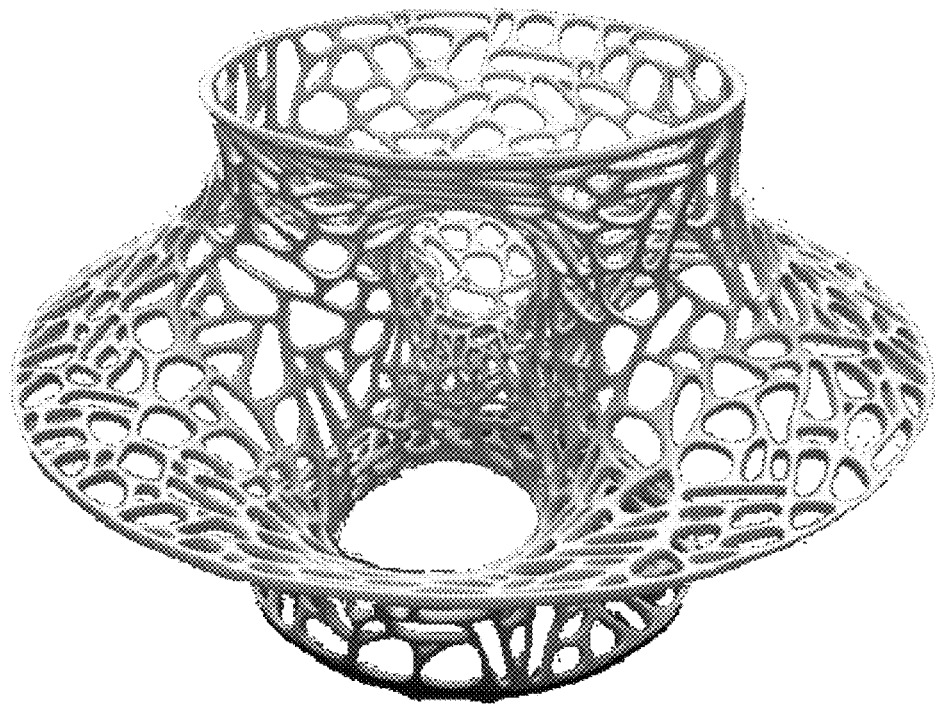
Figure 21:
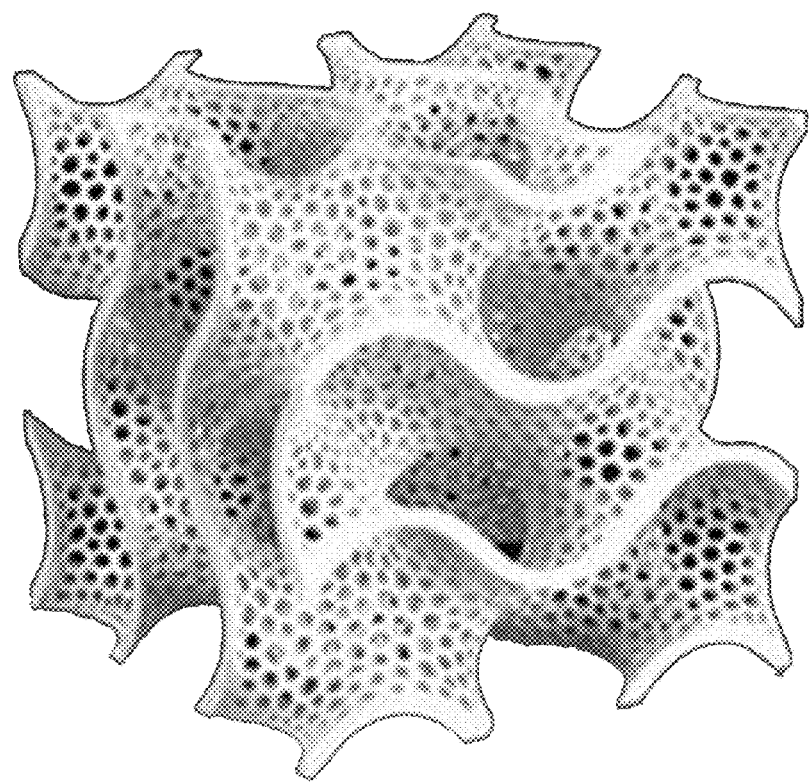

FIGS. 19-21 illustrate various three dimensional fractal-like structures, which may be used to induce turbulence in a flowing heat transfer medium, or may act as heat sinks for a heat source, which may be located centrally or eccentrically within the respective structure.

Figure 22:
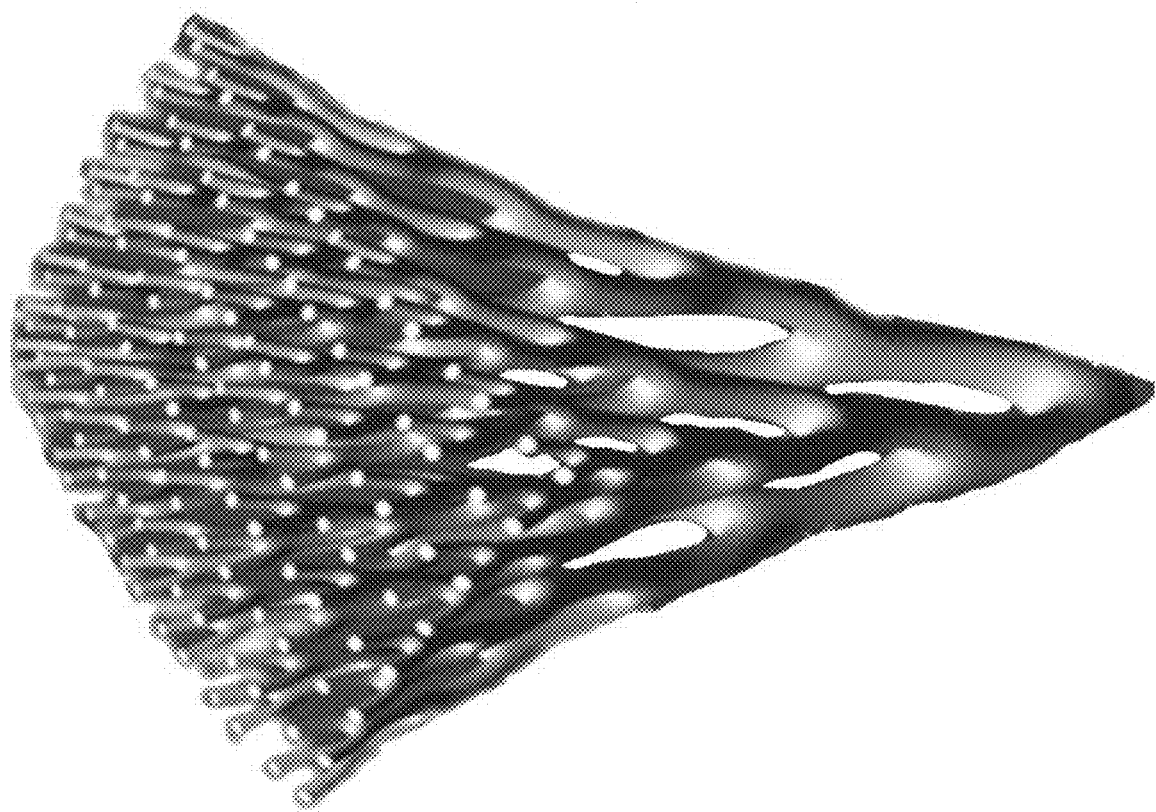
FIG. 22 shows a branching array of elements, which have increasing surface area:cross section area with increasing distance from the root. A multiscale pattern (not shown) may be formed on the surfaces.

FIG. 22 shows a branching array of elements, which have increasing surface area:cross section area with increasing distance from the root. A multiscale pattern (not shown) may be formed on the surfaces. As discussed above, the structure may have vibrations, especially under turbulent flow conditions, which can increase heat dissipation efficiency.

FIG. 23 shows a solid fractal mass with based on Sierpinski's triangles, with a set of exposed surfaces.

A Computational Flow Dynamics (CFD) model is a mathematical approach which may be used to estimate the thermal resistance of naturally branched structures. A prior art CFD implementation is based to the assumption of the steady state and considers the energy loss in the branch by heat conduction and heat convection. The bifurcations are modeled by a recursive rule to calculate the thermal resistance of the whole branch. Input parameters are geometric properties of every single sector of the branch including its length, width and height, the thermal conductivity of the material and the heat transfer coefficient on the surfaces. This coefficient takes account of the geometry of the heat sink because it respects the flow conditions round the surfaces that are influenced by the space available for air flow. In the CFD model, with an increasing number of bifurcations, thermal resistance initially decreases. After reaching its minimum value it increases again. This effect is caused by a change in convective heat dissipation with the length of the branched sectors.

In the prior art design, assuming constant total length and material volume of the branch, the surface for convection is increased with every new bifurcation. At the same time, each new sector reduces the space between the neighbor branches and affects the airflow between the surfaces negatively. At a specific number of bifurcations the reduced airflow no longer compensates the benefit from the newly generated surfaces. In consequence, the thermal resistance rises. If the spacing between the surfaces is too small, the fluid-flow through the channels is hindered and the heat transport by convection is reduced.

Figure 24:
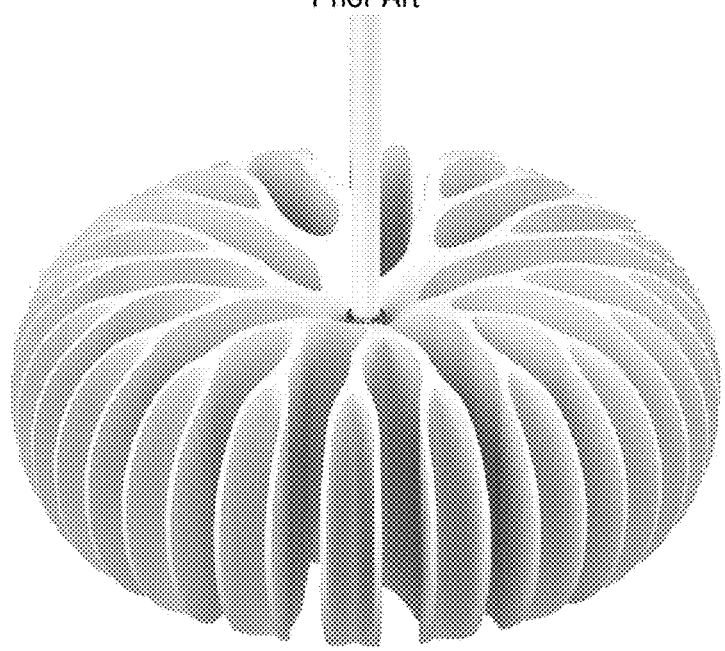
FIG. 24 shows a prior art heat sink for a lamp.

FIG. 24 shows a stylized radially symmetric branched heat sink designed according to this method. According to the present technology, the exposed surfaces of the heat sink are further textured, such as by etching, additive manufacturing, laser processing, or other known processing schemes, to assume a fractal surface configuration, superimposed on the underlying branched network. See, A. Sachs, B. Bergdoll, D. Gamboni and P. Ursprung: Nature Design. Museum für Gestaltung Zürich, Lars Müller Publishers, Zürich 2007; C. Herbold and C. Neumann: Vorbild Natur: Bionische Strukturen zur Entwärmung von LEDs. Tagungsband LICHT, Berlin 2012; A. Bar-Cohen and W. M. Rohsenow: Thermally Optimum Spacing of Vertical, Natural Convection Cooled, Parallel Plates., J. Heat Transfer, 106, pp. 116-123, 1984; A. Bejan and S. Lorente: Design with Construal Theory. John Wiley & Sons, Inc., Hoboken, N.J. 2008; MIM-Expert-Group and Fraunhofer-IFAM: Metal Injection Moulding (MIM), Powder Injection Moulding, 2012. As with other 3D designs, the structure may be modified according to the present technology to include a surface pattern or perforation pattern which has multiscale characteristics, or used in conjunction with another separate multiscale element to improve performance.

The branches of this prior art design are constructed in one plane that is extended in the third dimension to form a cylindrical body. This cylinder has a diameter of 50 mm and a height of 50 mm. All simulations are performed with a thermal power dissipation of 7 W on an area of 5 mm×5 mm in the middle of the bottom end plane, with passive flow of the heat transfer medium. FIG. 26 shows the approximately calculated trend of thermal resistance for one branch (grey) and simulation results of the same branch (black). Based on the results of the CFD mathematical approximation, different parameters of the geometry are evaluated in detail by thermal simulations.

According to the present technology, the branches may be asymmetric, and the branches may be non-constant length, and therefore, while a limit may still be reached as to the increasing marginal utility of branches, that limit may be increased, or increased efficiency achieved with the same mass or operating cost. Further, by addressing surface configuration rather than gross morphology only, the heat transfer coefficient of the heat sink is increased, and flow restriction can be decreased.

Figure 25:
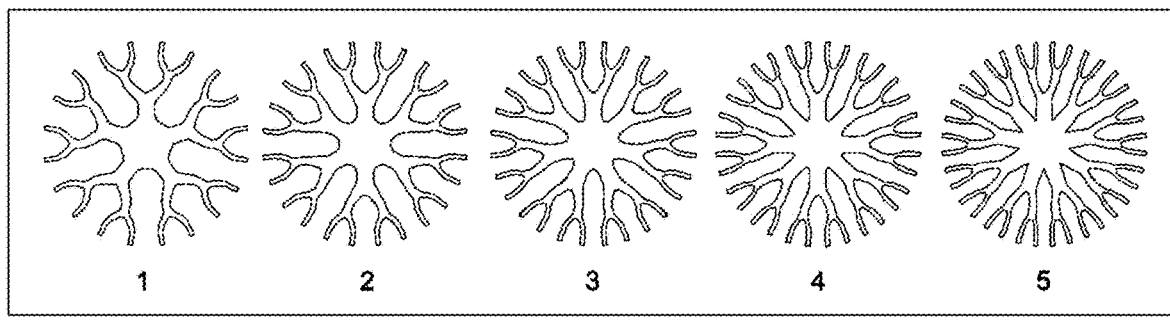

The prior art heat sinks in FIG. 25 shows a top view of heat sink simulation models with different number of branches. The models contain five to nine branches with two symmetric bifurcations in every branch. Simulation results show that the lowest thermal resistance of these designs is achieved with seven branches where the difference is up to 12%. The low number of branches in heat sinks 1 and 2 wastes space for additional surfaces while the large surfaces of heat sinks 4 and 5 cause narrow flow channels between the branches. FIG. 27 shows simulation results for the different numbers of branches. FIG. 28 shows the temperature distribution on the surface of both types as well as the flow velocity in the center plane. The higher temperatures and the areas with low flow velocity at the branched heat sink are obvious. The thermal resistance of the non-branched heat sink is 8.3% higher compared to the thermal resistance resulting for the branched version.

Figure 29:
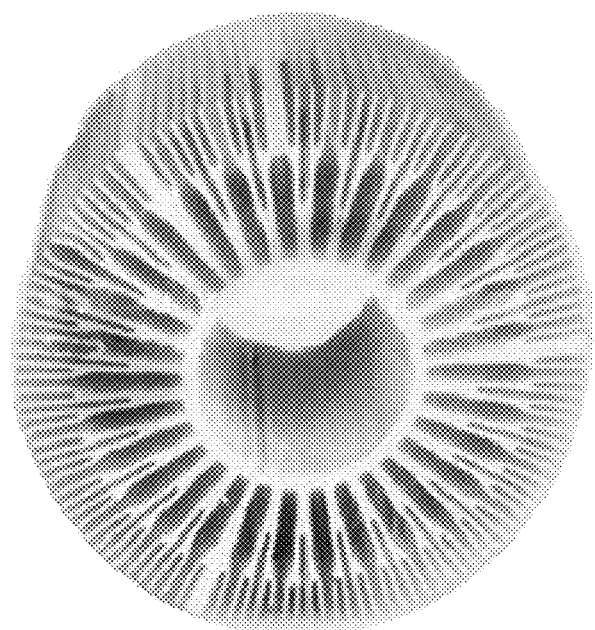
FIG. 29 shows a radially symmetric branched heat sink, with two levels of branching.

FIG. 29 shows a stylized radially symmetric branched heat sink, with two levels of branching. The surfaces of this heat sink may be perforated or patterned as described herein.

Figure 30:
FIG. 30 shows an incremental range of cross sections for heat sinks, with increasing heat transfer coefficient toward the right.

FIG. 30 shows an incremental range of cross sections for extruded heat sinks, with increasing passive heat transfer coefficient toward the right. Note that actual heat transfer depends on heat transfer fluid characteristics, and passive convection or laminar may not apply, especially where turbulence is intentionally introduced in the medium. However, by providing a heat sink design that has reasonable performance under laminar flow or passive convective cooling conditions, a mode of operation is provided which is tolerant of fan failure, and permits reduced fan energy consumption and acoustic emissions. The optimization of the algorithm may therefore take into account not only peak heat dissipation capability, but also performance under low heat load, jointly optimizing both ranges of operation.

Figure 31:
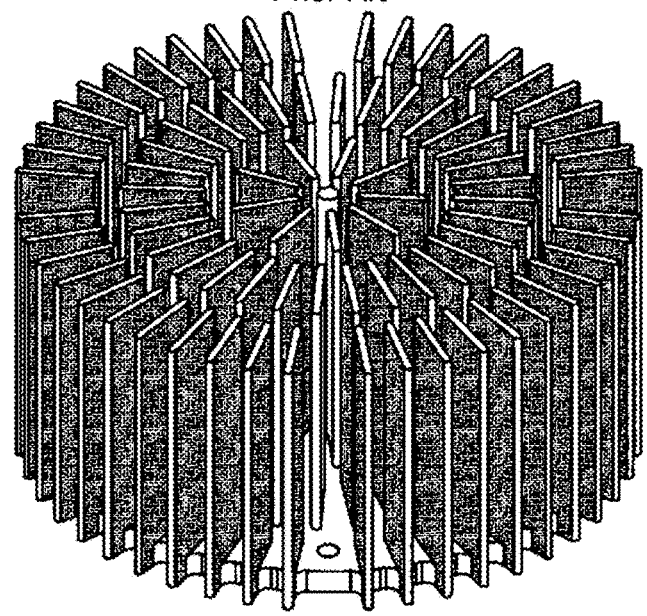
FIGS. 31 and 32 show a radially symmetric heat sink with a progressive increase in the number of plate surfaces with increasing distance from the center (FIG. 31), or a branching pattern (FIG. 32), each plate having a superimposed fractal pattern in the form of a texture.
Figure 32:
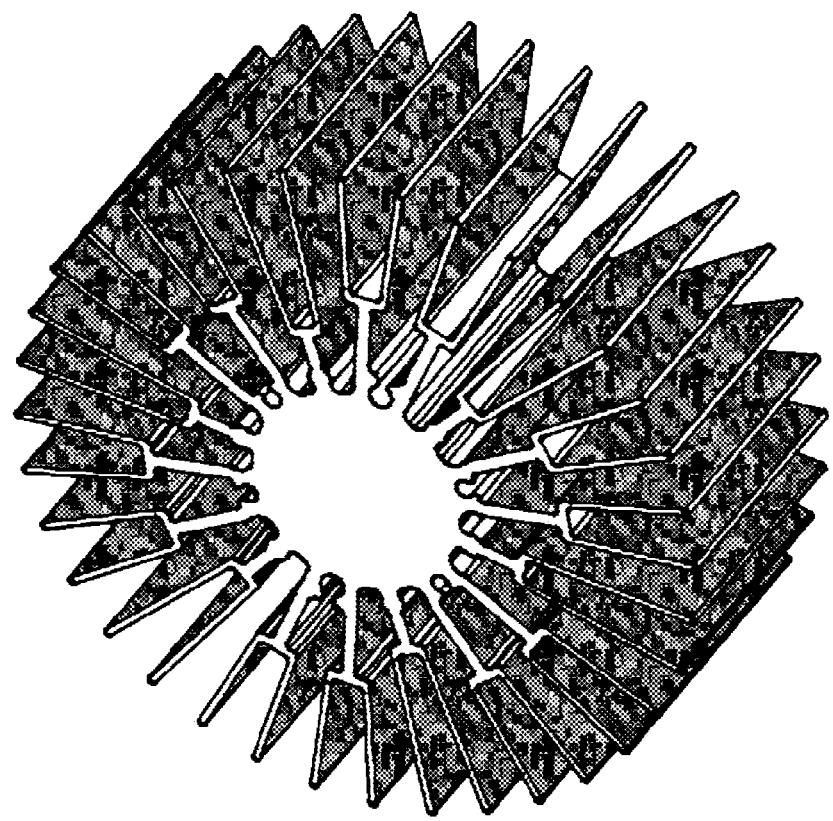
Figure 33:
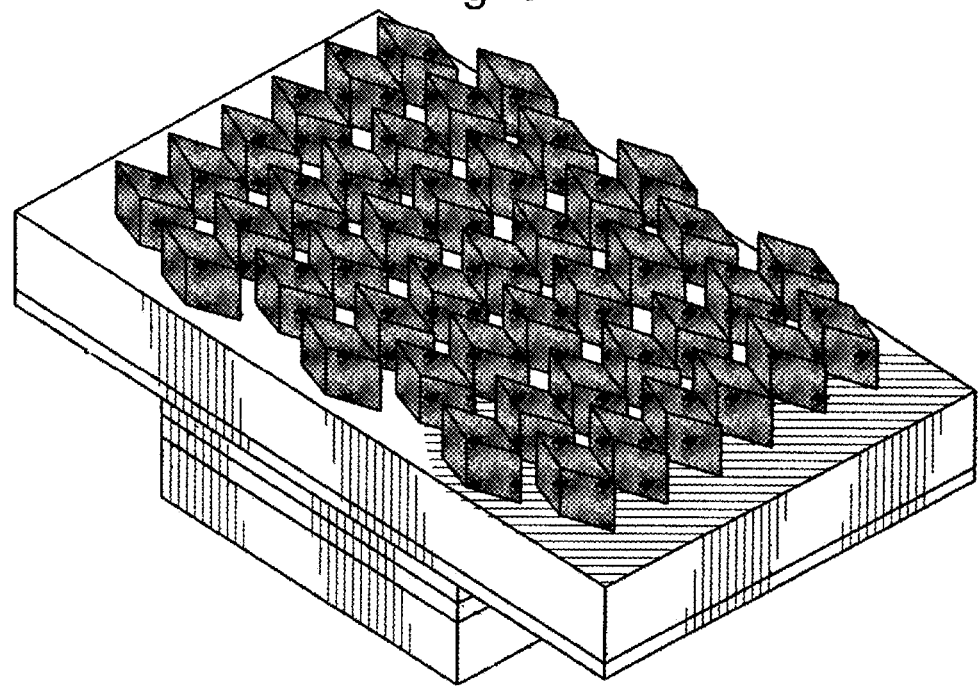
FIG. 33 shows a heating comprising a regular array of radiator elements, each element being textured with a fractal surface pattern to increase heart transfer.

FIGS. 31 and 32 show a radially symmetric heat sink with a progressive increase in the number of plate surfaces with increasing distance from the center (FIG. 31), or a branching pattern (FIG. 32), each plate having a superimposed fractal pattern in the form of a texture. FIG. 33 shows a heating comprising a regular array of radiator elements, each element being textured with a fractal surface pattern to increase heart transfer. These textured surfaces will induce vortices characteristic of turbulence near the surface under certain flow conditions, and for a given flow rate, increase heat dissipation capacity.

According to one embodiment the present technology, the pattern on each axis would general demonstrate its own self-similar configuration, and the patterns would not be overlaid on orthogonal axes, resulting in interscale interactions.

Figure 34:
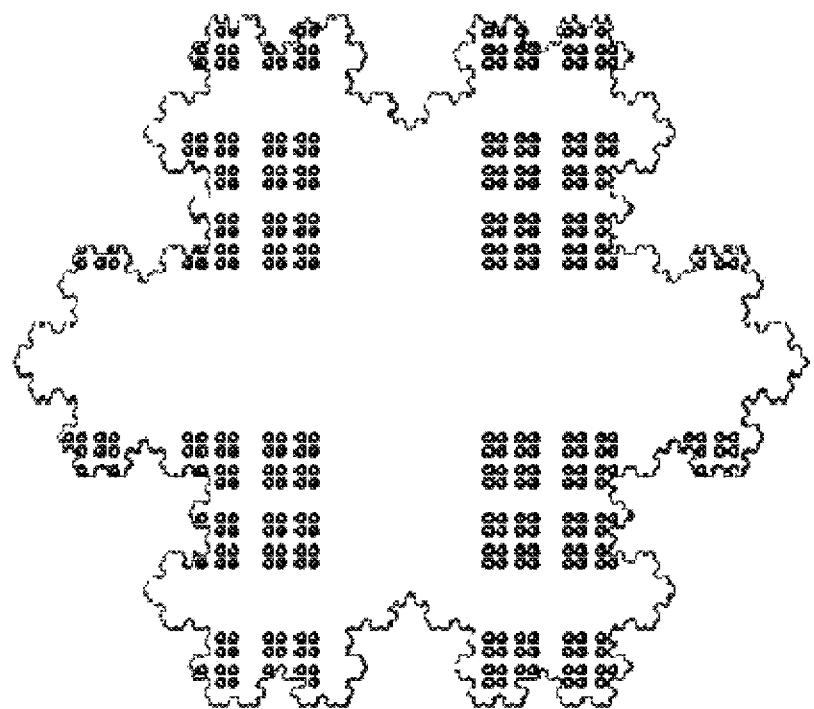
FIG. 34 shows a Koch snowflake external pattern with a perforated internal pattern.

FIG. 34 shows a Koch snowflake external pattern with a perforated internal pattern. This may be used as a fractal grid or as a surface pattern of a heat exchange surface.

Figure 35:
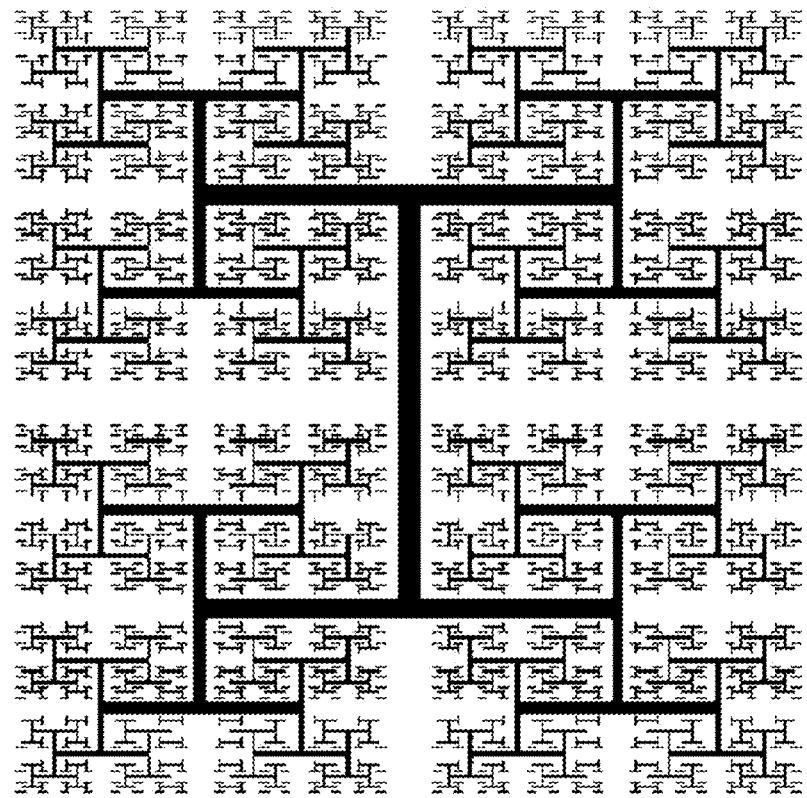
FIGS. 35-37 show branched network fractal grid, of a first type, a second type with 4 orders of elements, and a third type with 5 orders of elements, respectively.
Figure 36:
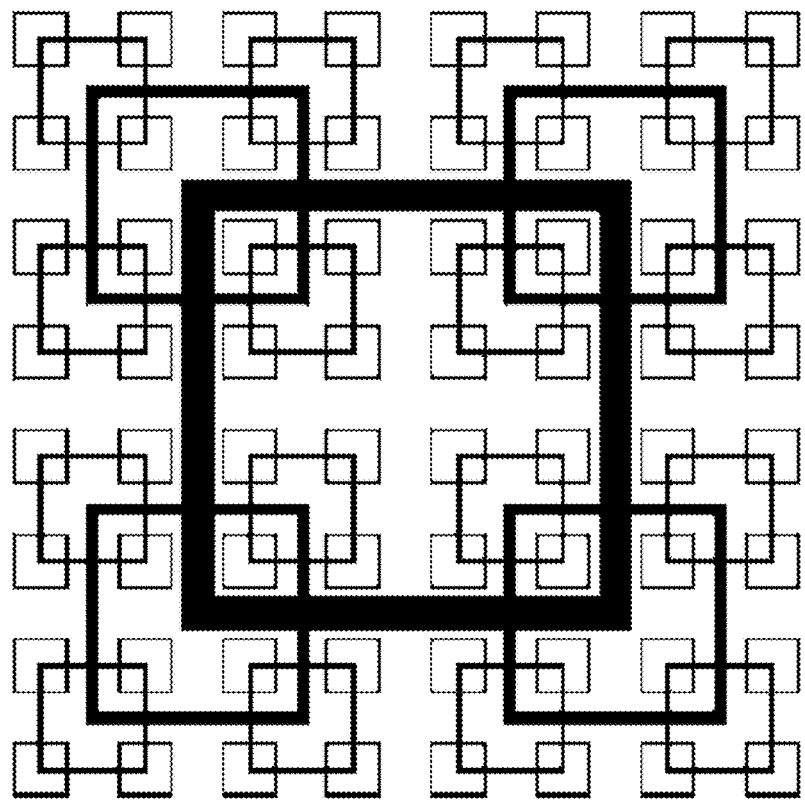
Figure 37:
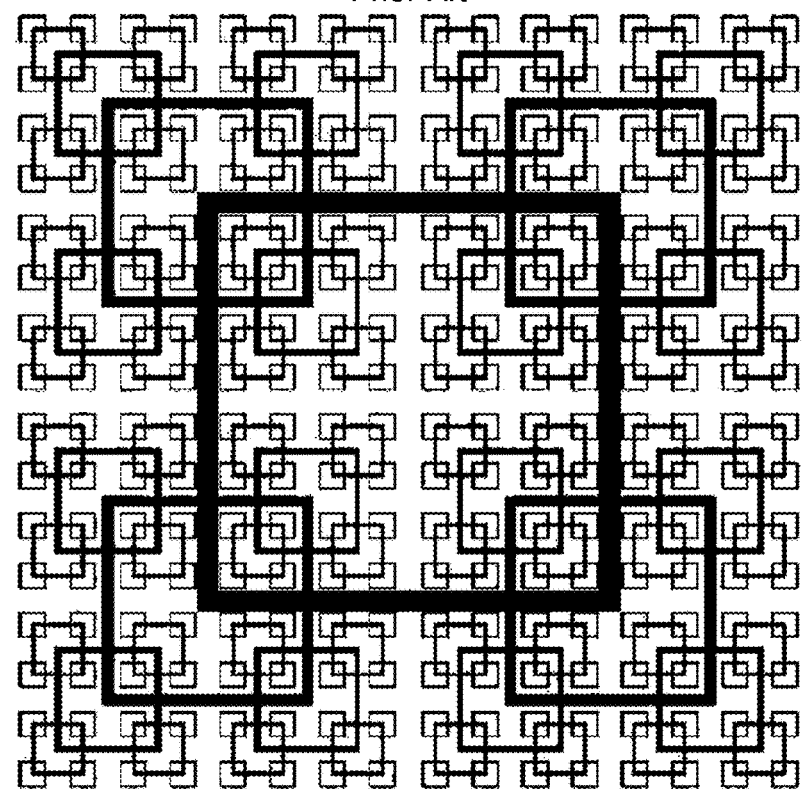

FIG. 35 shows a first type of branched network fractal grid. FIG. 36 shows a second type of branched network fractal grid, with 4 orders of elements. FIG. 37 shows a third type of branched network fractal grid, similar to FIG. 36, but with 5 orders of elements. These are known for use as fractal grids for inducing air flow turbulence.

Figure 38:
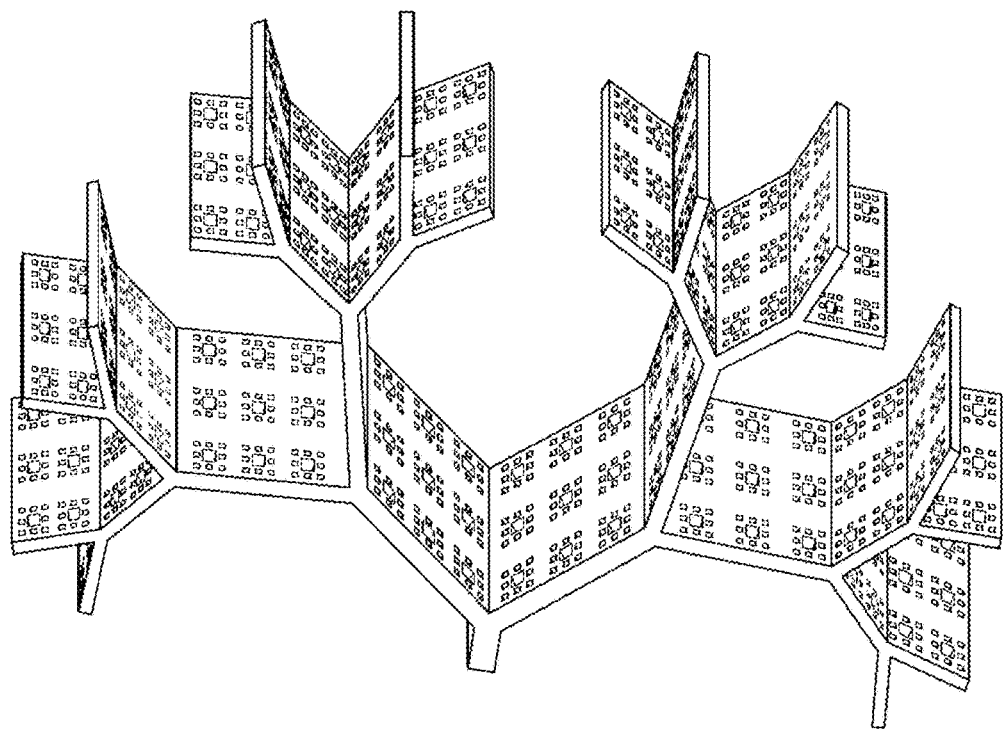
FIGS. 38-40 show a branched network heat sink with a fractal perforation pattern and first and second detail of the pattern, respectively.
Figure 39:
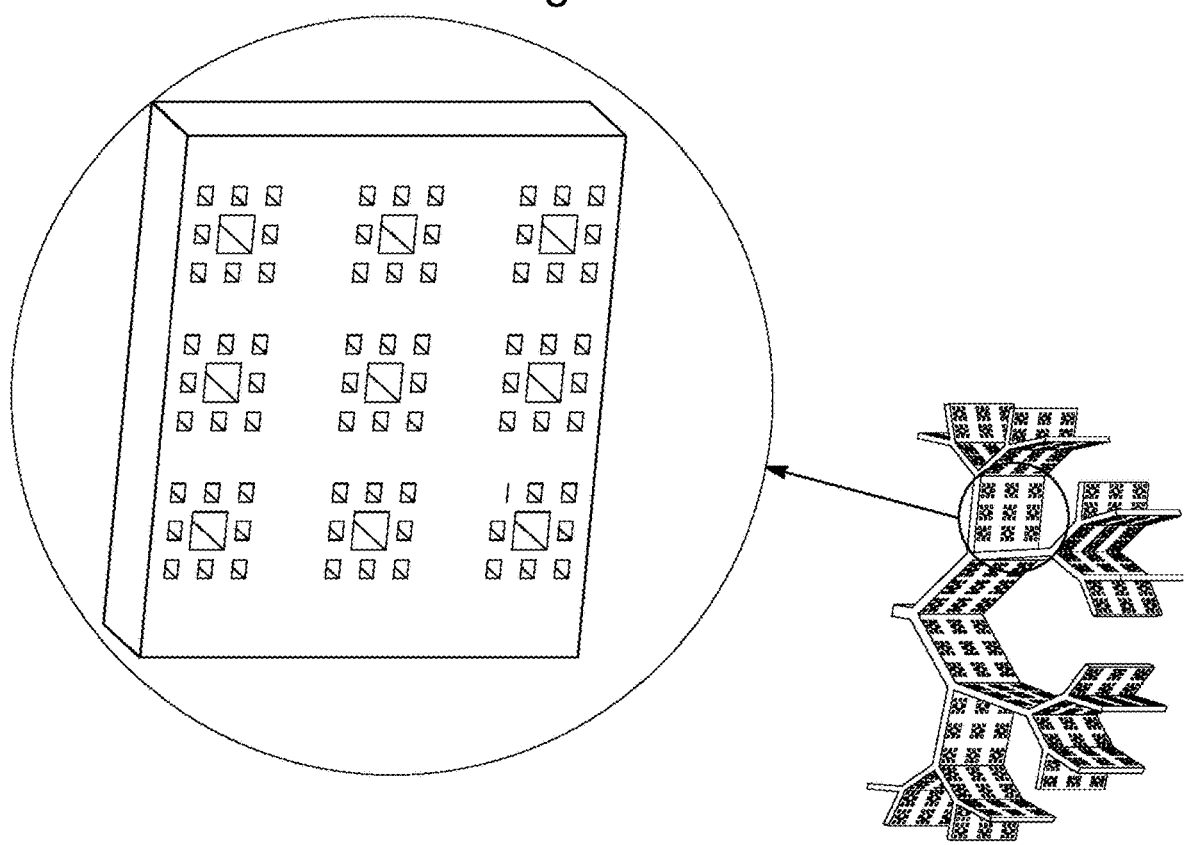
Figure 40:
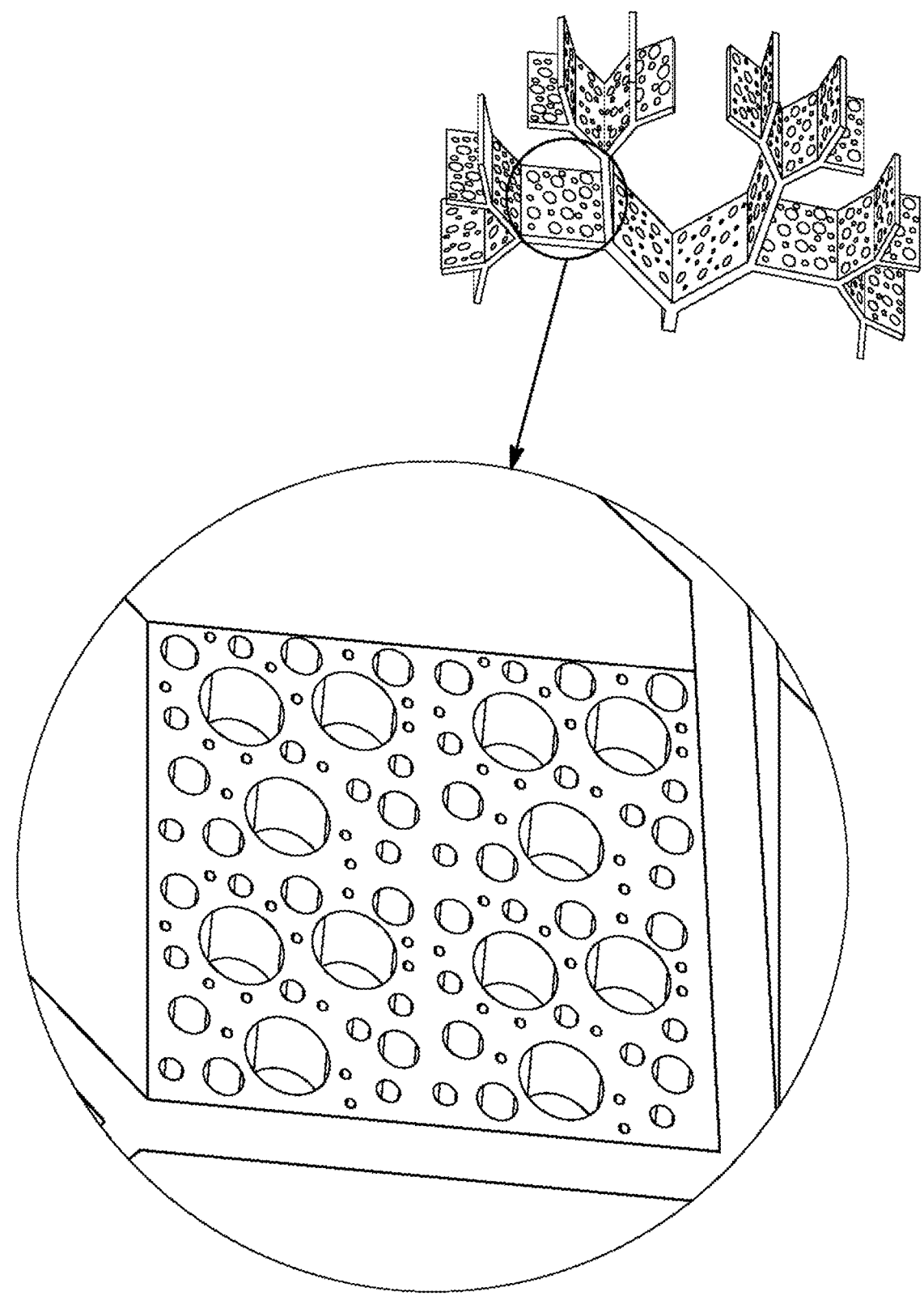

FIG. 38 shows an exemplary branched network heat sink, with a fractal perforation pattern. FIG. 39 shows a first detail of the perforation pattern of FIG. 38. FIG. 40 shows a second detail of the perforation pattern of FIG. 38. In accordance with as perforated surface embodiment of the invention disclosed herein, the heat sink comprises a heat exchange device having heat exchange surfaces which are perforated. As a result, enhanced heat transfer may be achieved. Additionally, use of perforations may increase heat transfer by up to a factor of two per pumping power. Further, the plurality of heat exchange elements may be hollow. The combination of hollow heat exchange elements with perforations can result in increases in heat transfer greater than that of a solid heat exchange element of the same diameter. Additionally, increases in heat transfer per pumping power of up to 20% could be achieved by varying the inclination angle and diameter of the perforations in aligned arrays of the plurality of heat exchange elements. Furthermore, one or more of the number of perforations and shape of perforations may be configured in order to control the heat transfer. For instance, under natural convection, heat transfer is directly proportional to the number of square perforations. In another instance, circular and square perforations may be used to obtain higher Nusselt number. Since heat transfer is proportional to Nusselt number, greater heat transfer may be achieved with such an arrangement. In yet another instance, the Nusselt number corresponding to the plurality of heat exchange elements may be varied based on one or more of a pitch, a hole diameter, a surface area and flow velocity. In particular, by modifying the pitch of the perforations, the Nusselt number and hence heat transfer may be increased.

Figure 41:
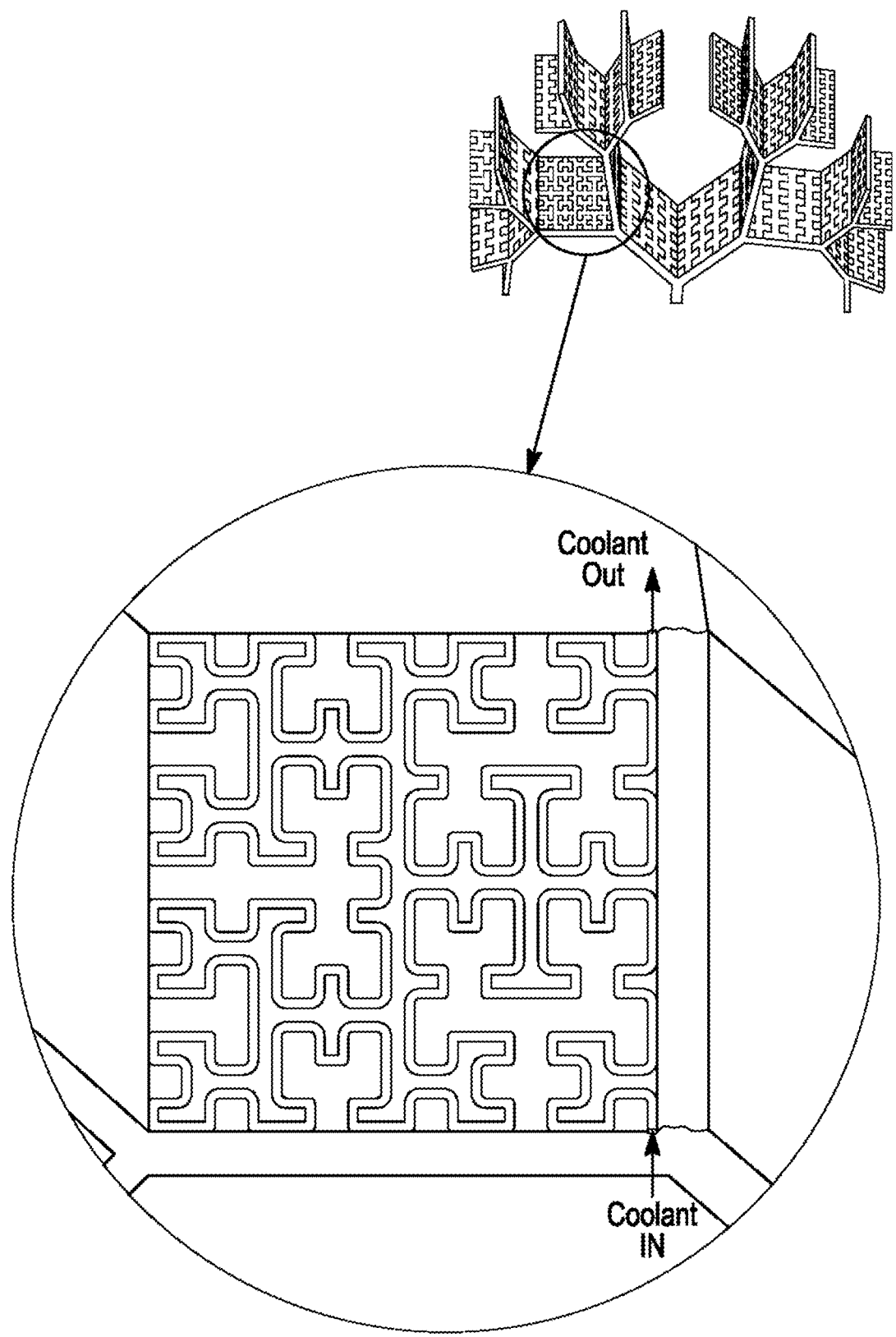
FIG. 41 shows a detail of a first serpentine microchannel pattern within the heat sink plates of FIG. 38.
Figure 42:
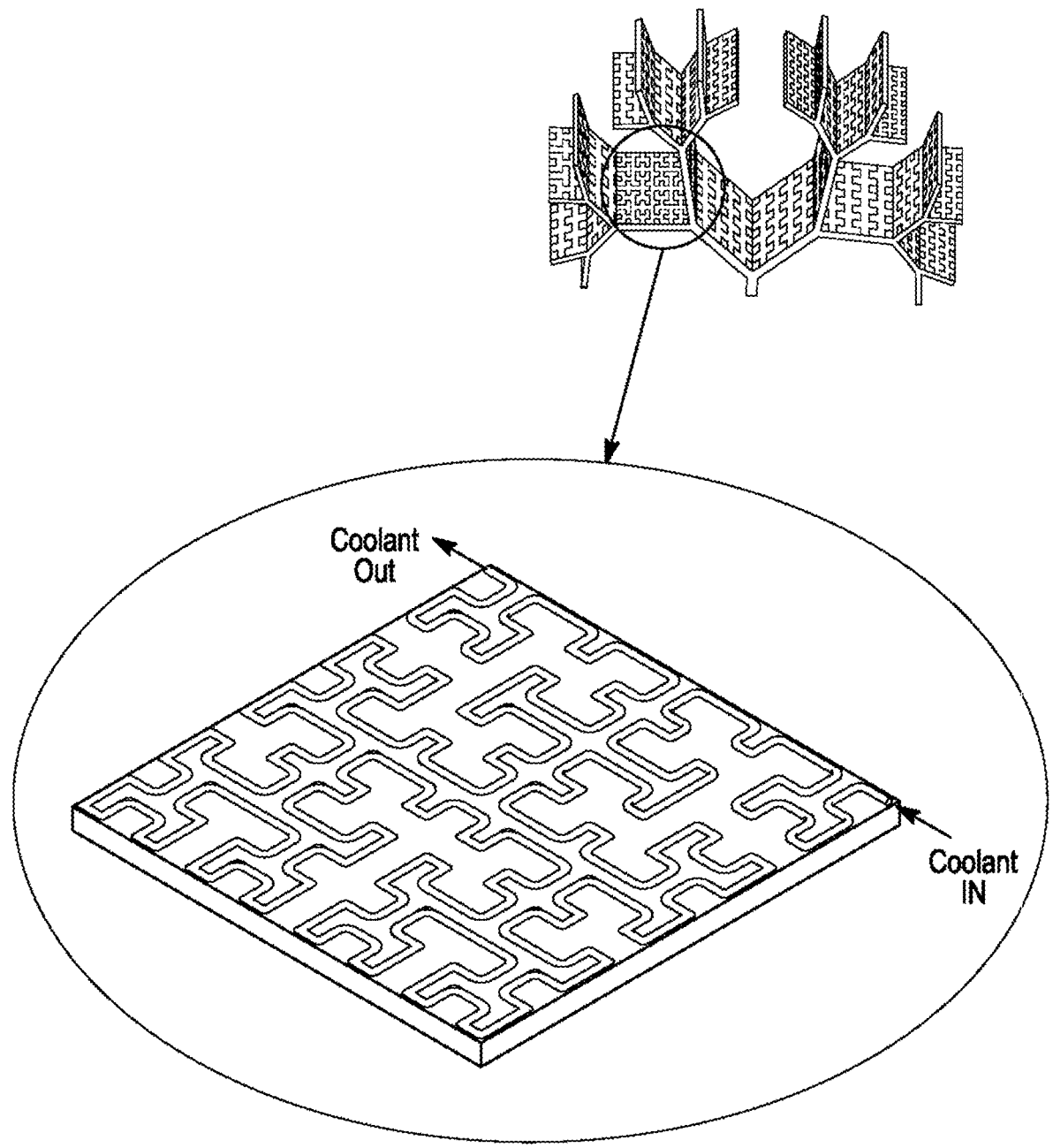
FIG. 42 shows a detail of a second serpentine microchannel pattern within the heat sink plates of FIG. 38.
Figure 43:
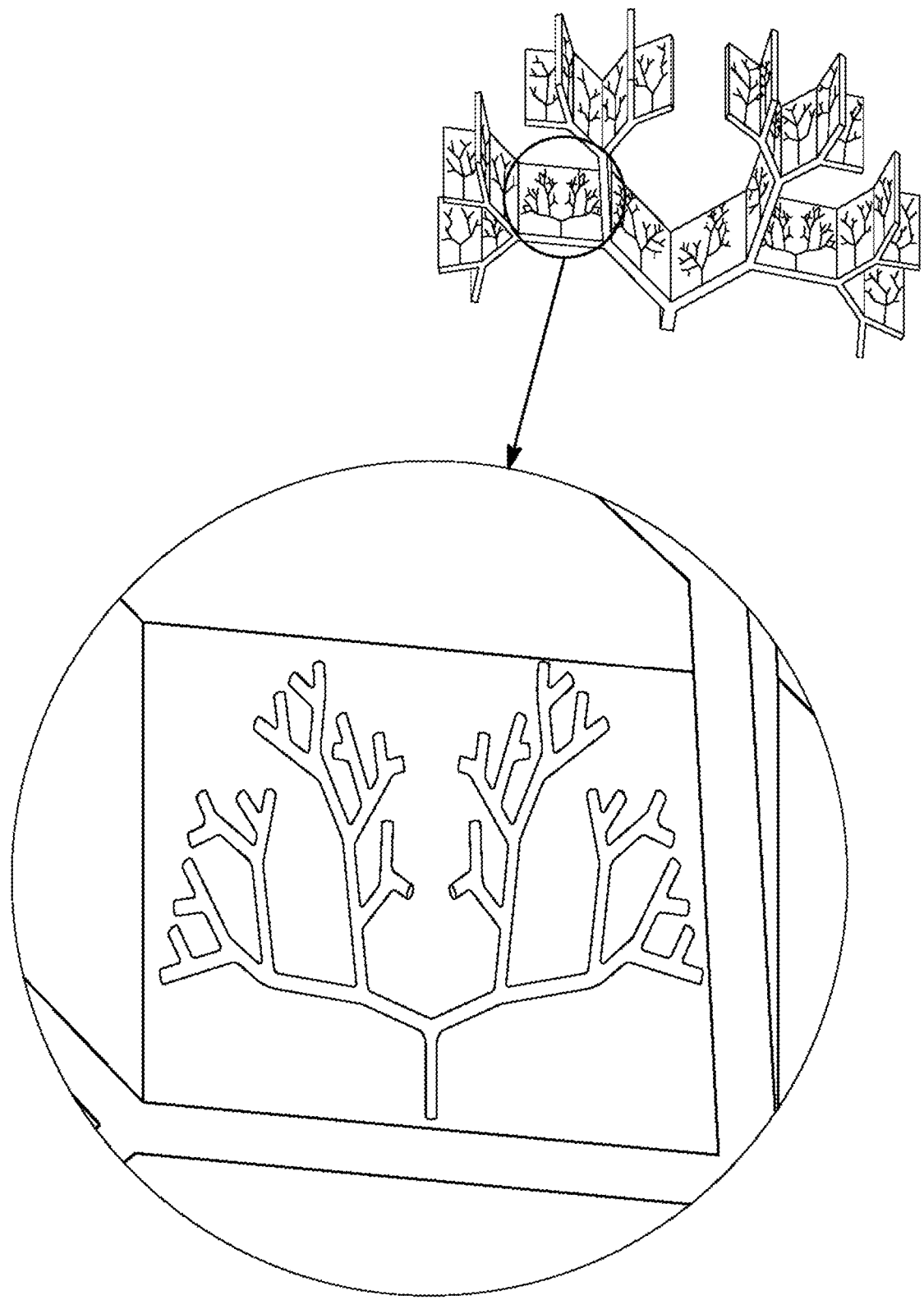
FIG. 43 shows a detail of a first branched microchannel pattern within the heat sink plates of FIG. 38.
Figure 44:
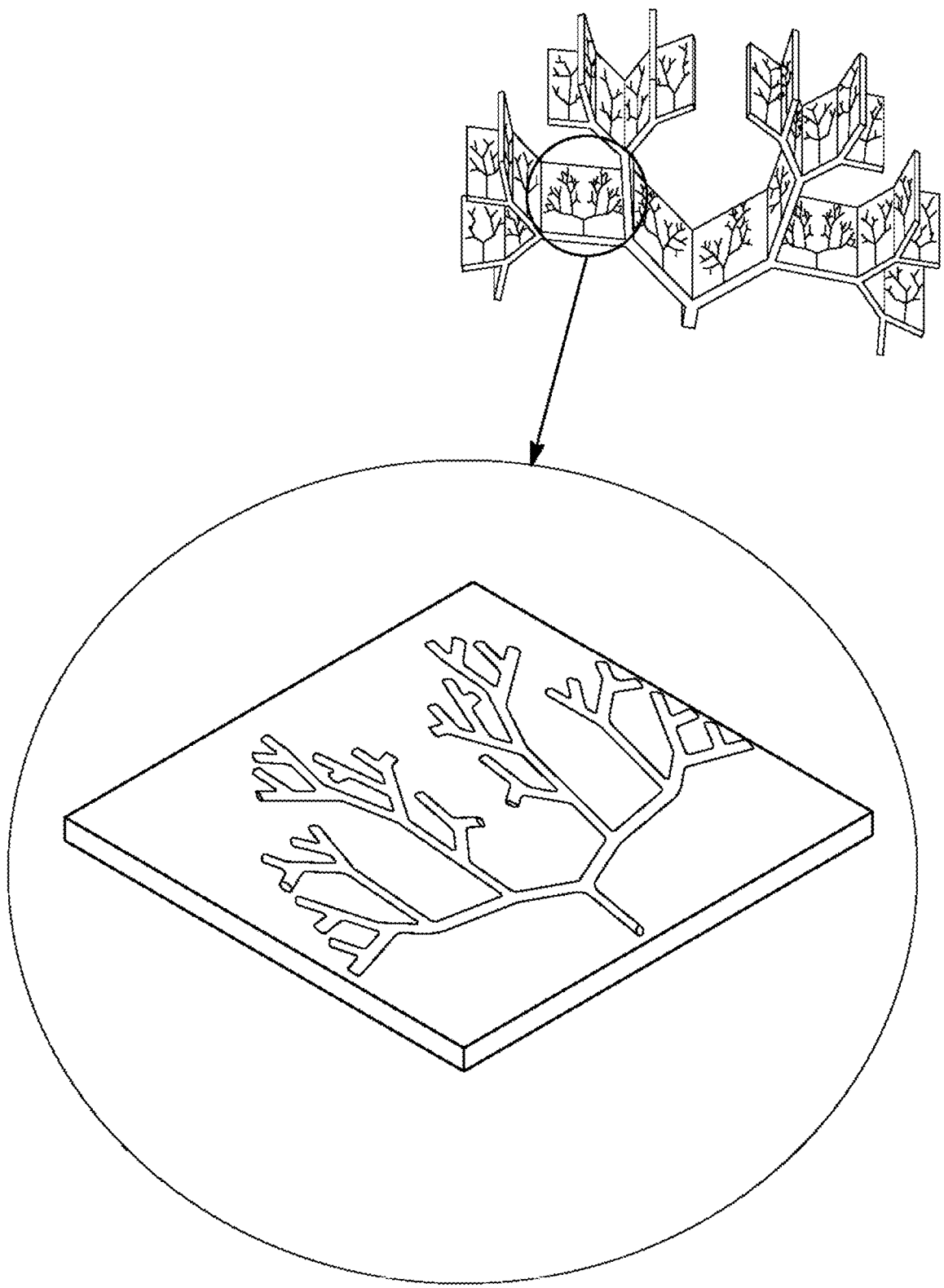
FIG. 44 shows a detail of a second branched microchannel pattern within the heat sink plates of FIG. 38.

FIG. 41 shows a detail of a first serpentine microchannel pattern within the heat sink plates of FIG. 38. FIG. 42 shows a detail of a second serpentine microchannel pattern within the heat sink plates of FIG. 38. FIG. 43 shows a detail of a first branched microchannel pattern within the heat sink plates of FIG. 38. FIG. 44 shows a detail of a second branched microchannel pattern within the heat sink plates of FIG. 38.

Microchannel heat sink technology, both serpentine and branched channel, have been previously studied. The present technology enhances such designs by permitting 3D designs, rather that the available planar configurations, and can combine both internal fluid flows with external heat transfer medium flows, which can be jointly optimized, to improve performance. In some cases, a compressed gas is fed to into the microchannel, which is then released at strategic locations, to induce turbulent flows on external cooling surfaces of the device.

Figure 45:
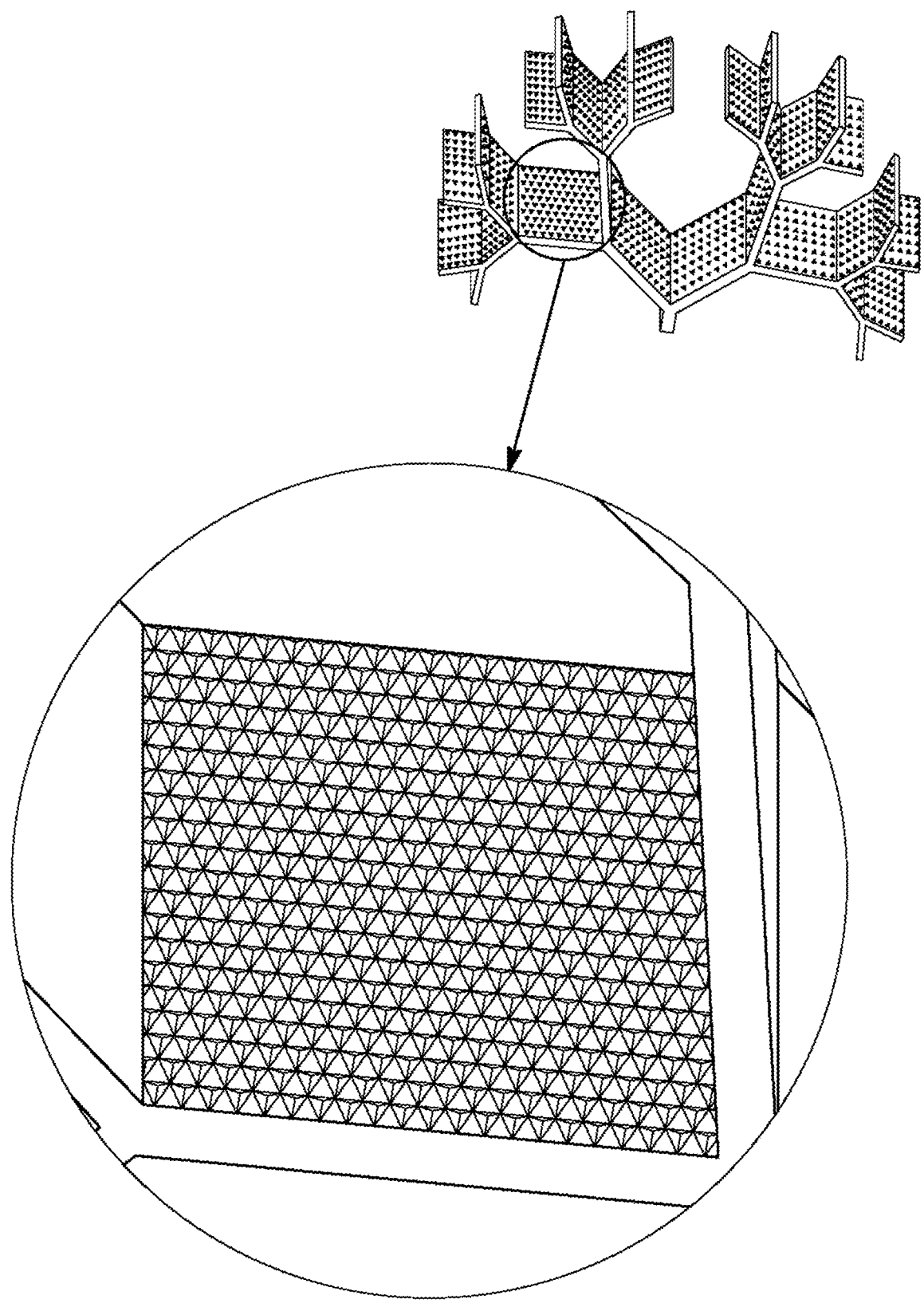
FIG. 45 shows a detail of a textured surface of the heat sink plates of FIG. 38.

FIG. 45 shows a detail of a textured surface of the heat sink plates of FIG. 38.

A list of common fractals, with their exact and calculated Hausdorff dimension, from en.wikipedia.org/wiki/List_of_fractals_by_Hausdorff_dimension, is provided in Table 1. See also en.wikipedia.org/wiki/Fractal_dimension.

The surfaces of the heat exchange surfaces may have a texture, which is spatially optimized according an independent fractal algorithm. Where an additive or subtractive manufacturing process is employed, the surface configuration may be according to a fractal algorithmic design. The surface of triangles may include holes arranged in a fractal pattern, or it may include etching or channels for cooling liquid branching according to a fractal algorithm. In other cases, the surface configuration may be determined by a self-organizing or self-assembling coating. The coating may have characteristics that vary over space, which may be dependent on a curing temperature, and thus, if the heat source is the solid to be cooled and a representative air flow pattern during cooling, the texture will be dependent on the low level morphology and heat sink design. The coating may also be induced to spatial variation through other physical means, such as a photolithographic curing of a texturing material, or other manufacturing techniques.

The fractal shape may have some apertures in it (not illustrated) to allow the solid to be cooled to connect with other elements. The solid should be connected to the fractal heat sink through an efficient heat conduction surface.

A spacing between the plurality of heat exchange elements is determined based on a height of the plurality of heat exchange elements. For a given heat rate, an optimal spacing between the plurality of heat exchange elements may decrease with an increase in height of the plurality of heat exchange elements.

A shape corresponding to the plurality of heat exchange elements may be configured to provide enhanced heat transfer. For instance, the plurality of heat exchange elements may be fluted. In another instance, the plurality of heat exchange elements may be wavy. The shape corresponding to the plurality of heat exchange elements may be triangular, circular, elliptical, rectangular and trapezoidal. For instance, the plurality of heat exchange elements may be elliptically annular. Further, an elliptical aspect ratio corresponding to the plurality of heat exchange elements may be varied in order to obtain greater heat transfer efficiency. As a non-limiting example, the elliptical aspect ratio may be increased in order to obtain higher heat transfer efficiency. In another instance, the plurality of heat exchange elements may be trapezoidal with an optimal aspect number of 1.5. In yet another instance, the plurality of heat exchange elements may be diamond shaped pin fins. Further, the pitch corresponding to the plurality of heat exchange elements may be varied to obtain enhanced heat transfer. For example, the pitch may be varied in proportion to the required heat transfer coefficient.

The surface geometry of the plurality of heat exchange elements may be varied in order to provide enhanced heat transfer. For instance, square ribs along the plurality of heat exchange elements may be used. In another instance, diamond shaped surface protrusions may be provided over the plurality of heat exchange elements. In yet another instance, grooves may be created on the surfaces of the plurality of heat exchange elements. In a further instance, dimples may be placed on the flat base of the plurality of heat exchange elements forming a pin fin. Further, in an instance, convex shaped dimples may be used to obtain greater heat transfer.

An orientation of the plurality of heat exchange elements may be varied in order to enhance heat transfer. For instance, in case the number of the plurality of heat exchange elements is large, the plurality of heat exchange elements may be oriented vertically with respect to the flat base of the plurality of heat exchange elements. In another instance, in case the plurality of heat exchange elements are short with a finning factor of less than 2.7, a horizontal orientation may be used in order to provide better heat transfer.

The plurality of heat exchange elements may be configured in order to control an amount of heat transfer by radiation. For example, the height of the plurality of heat exchange elements may be maintained short. On the other hand, the height of the plurality of heat exchange elements may be increased in order to reduce the amount of heat transfer by radiation. As another example, the plurality of heat exchange elements may be circular around an annular heat pipe. Further, a ratio of spacing between the plurality of heat exchange elements and diameter of the plurality of heat exchange elements may be controlled in order to vary the amount of heat transfer by radiation. For instance, the ratio may be decreased in order to decrease the amount of heat transfer by radiation. Similarly, the ratio may be increased in order to increase the amount of heat transfer by radiation.

The number of iterations corresponding to the fractal variation between respective branches of the plurality of heat exchange elements may be configured in order to control heat transfer. For instance, the number of iterations may be increased in order to obtain greater heat transfer. However, beyond a certain limit, heat transfer may not be directly proportional to the number of iterations. Additionally, varying the number of iterations may also control diffusion rate across the surfaces of the plurality of heat exchange elements based on the fact that diffusion rate is directly proportional to the number of iterations. However, a certain number of iterations such as, but not limited to, four to five iterations, the diffusion rate may converge.

A dimension corresponding to the fractal variation between respective branches of the plurality of heat exchange elements may be configured in order to control heat transfer. In general, the heat transfer is directly proportional to the fractal dimension. However, this relationship is valid only till a limited number of iterations.

The number of branches corresponding to the plurality of heat exchange elements may be configured to control the heat transfer. Under natural convection, heat transfer effectiveness is found to be directly proportional to the number of branches. However, after a certain number of branch generations, heat transfer effectiveness saturates. Further, a branching ratio may be configured in order to obtain minimum resistance to heat conduction and hence greater heat transfer. In a non-limiting example, a branching ratio of 0.707 ($\sqrt{2}/2$) or 0.7937 may be used.

Figure 46:
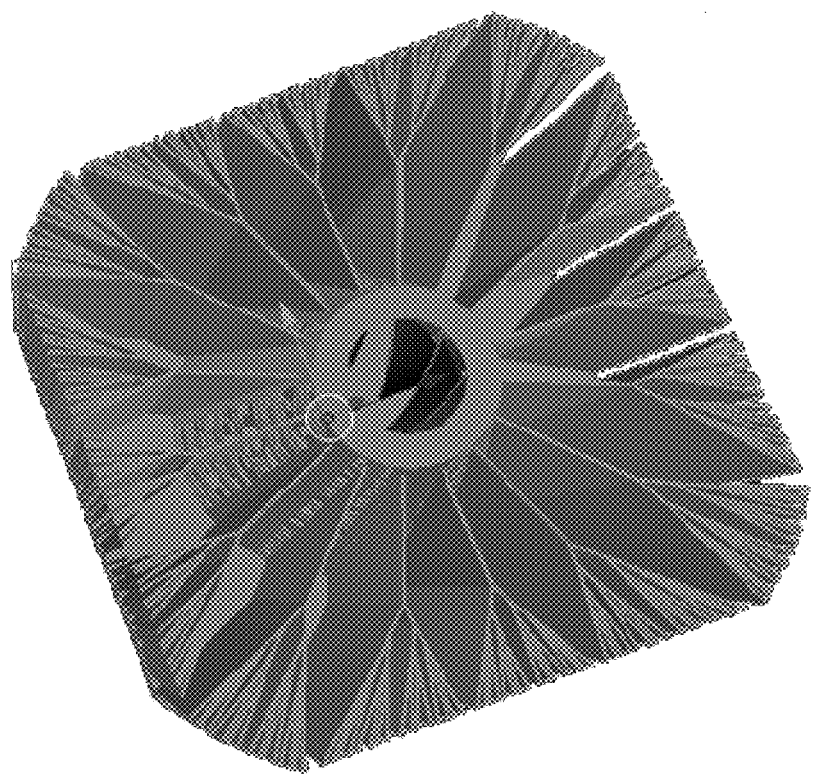
FIG. 46 shows a top perspective view of hollow conical perforated structure heat sink having a set of fractal branched fins extending radially.
Figure 47:
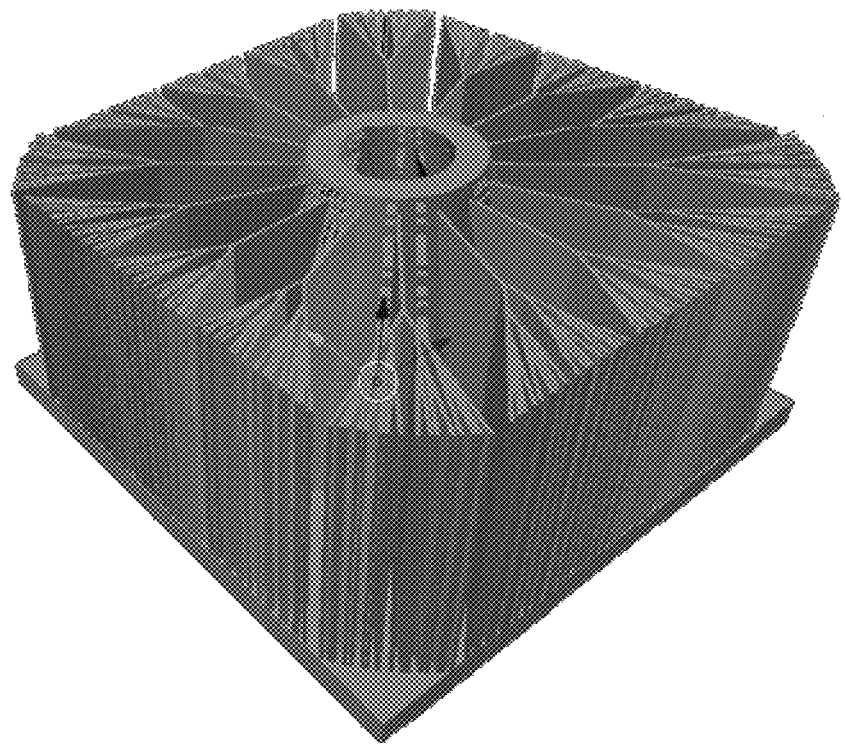
FIG. 47 shows a side perspective view of the heat sink according to FIG. 46.
Figure 48:
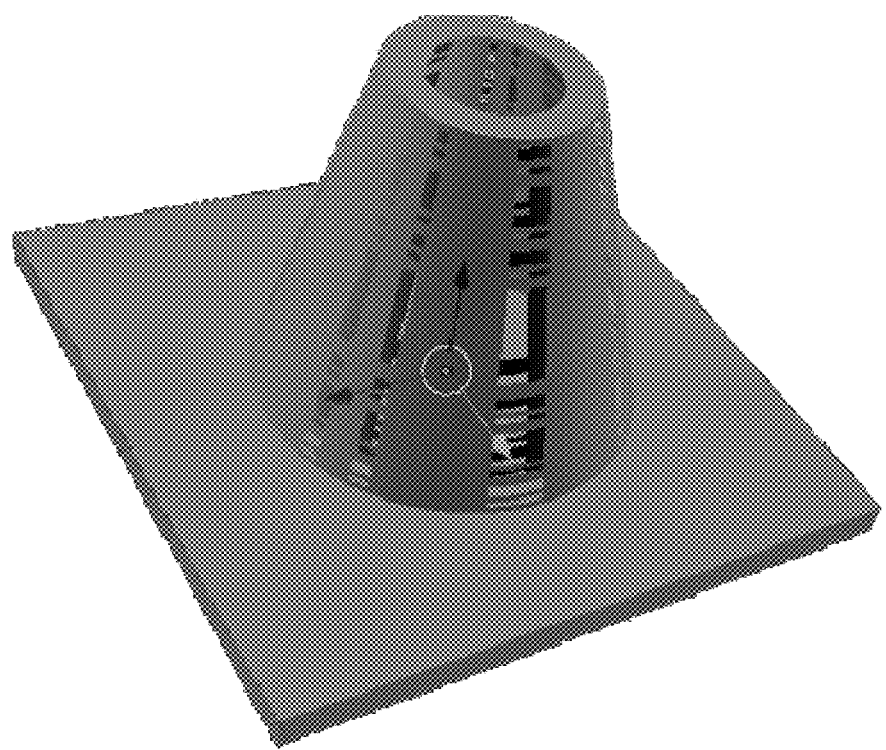
FIG. 48 shows the hollow frustum of the conical perforated structure heat sink shown in FIG. 46, absent the set of branched fins.

As shown in FIGS. 46-48, a hollow conical perforated structure is provided, with a set of radially extending branched fins, as a heat sink. According to this design, the branched fins and/or the aperture pattern on the frustum of the hollow conical perorated structure may be fractal in nature. A cone is an object having circular cross-sections of a diminishing radii, self-similar on any scale. The frustum of a hollow cone itself is topologically regular, but the hole pattern may follow a fractal pattern. The convection may induce sufficient flows to ensure heat dissipation.

The frustum of a cone rests on a horizontal metal plate that supports the whole structure and is attached to the integrated circuit board, the chip or another source of heat that is being cooled. The lower surface of the horizontal plate connecting to the surface of the heat source is typically smooth, in order to provide efficient heat transfer from a flat surface of the object from which the heat is received. From this plate, a cylinder with a diminishing diameter, e.g., a hollow frustum of a cone, extends, to allow hot air to escape upward (the narrowing of the cylinder is meant to increase the velocity of the air as it rises, to promote the formation of a vortex). As noted above, the perforated holes prove intake of air to create convection. Therefore, the cone angle and hole pattern may be optimized to produce a convective flow over a range of operating conditions. This optimization may be performed using computational flow dynamics software.

The surface of the frustum of the hollow cone is perforated with holes, arranged in a pattern, which may be a fractal pattern, to allow air to pass through the walls to facilitate the upward draft. An example of such fractal pattern may be spiral arrangement of the holes, wherein the spiral on the surface of a cone is a pattern having diminishing radius, self-similar on any scale. The holes may be arranged in a fractal pattern; note that the chirality and diminishing diameter of the spiral will tend to make any spatial pattern other than a line of holes asymmetric. The size of the holes may also follow a fractal pattern diminishing with the height of the cone, remaining self-similar on any scale. The holes provided in a spiral pattern around the cone, may template formation of a vortex. Similarly, the inner surface of the cone may have one or more spiral grooves, to create a helical movement of hot air to promote formation of the vortex. Because of the reversal of the Coriolis effect, designs intended for use below the equator should have a reverse spiral direction.

Heat dissipation elements in the form of fins extend outward of from the frustum of the cone in a branching pattern, which may be designed according to a fractal branching pattern. It is noted that, in some cases, the branching pattern may be defined to deviate from a self-similar fractal branching pattern. For example, where space or other constraints dictate the branching pattern, the result may differ from a fractal design. The fins may also have a pattern of perforations and/or surface relief, which may also respectively be provided in a fractal pattern.

Such a design may be difficult to produce using a typical subtractive machining process. However, the design may be produced by an additive manufacturing process, such as laser sintering or investment casting based on a three-dimensional printed form. The details or various parameters of the design may be generated based mechanical and physical constraints, a design thesis, and a computational flow dynamics environment, such as Comsol. Design parameters may be iterated incrementally, using a genetic algorithm, or based on a Monte Carlo exploration of the design space, for example. A set of design rules may limit minimum and maximum feature sizes for various aspects of the design.

As shown in FIGS. 46 and 47, the fins may be provided in an extruded formation, permitting a composite manufacturing process of the horizontal place, the conical core and the fins, as separate components, which are connected or fused. Therefore, the materials used for the horizontal plate, the central core (frustum of a cone), and the fins need not be identical. For example, the plate may be steel, core may be copper, while the fins may be aluminum.

According to this design, heat dissipation occurs in two ways: (a) formation of the vortex carrying hot air upward away from the base, inside the cylinder or frustum of a cone, and (b) through the outwardly directed fins carrying heat away from the cylinder or frustum of a cone. Note that the external configuration of the core need not directly correlate with the internal configuration, and for example, the external surface may be cylindrical and the internal surface may be conical or Venturi-shaped (having a constriction and subsequent dilation).

The perforations on the walls of the cylinder or the frustum of a cone may be optimized for overall efficiency, to enhance peak heat dissipation, or to enhance efficiency at a particular operating point.

A fan or blower may be provided to induce air flow over a range of speeds. The design may provide efficient operation using passive convective dissipation over a portion of the operating range, and active heat dissipation over a more extended range. Such a fan may be optimally positioned on the top of the frustum of a cone over its opening.

Heat transfer may be controlled based on the velocity of fluidic heat exchange medium flowing over the plurality of heat exchange elements. In general, the heat transfer is directly proportional to the velocity of fluidic heat exchange medium under forced convection. Additionally, the optimal number of branches required to maximize heat transfer has been found to reduce with increase in velocity of fluidic heat exchange medium. Accordingly, under forced convection with higher velocity, less number of branches may be required to achieve a required amount of heat transfer. Heat transfer by the plurality of heat exchange elements in the form of an array of perforated fins may be controlled by varying a pumping power. In this case, the heat transfer can be inversely proportional to the pumping power with small increase for turbulent cross-flow but significant increase for parallel flow.

Various parts of the heat sink may be manufactured using manufacturing techniques such as, but not limited to, injection molding, die casting, extrusion, forging, gravitational molding, CNC milling, CNC punching, stamping, wire cut machine and wire cut Electrical Discharge Machining (EDM), additive manufacturing (e.g., 3D printing, 2.5D printing, etc. Various parts of the heat sink may be manufactured by a machining processing employing cutting tools and controlled slicing techniques to construct the plurality of heat exchange elements from a solid block of material such as, but not limited to, copper or aluminum. This technique is preferable to construct the plurality of heat exchange elements with smaller thickness than is possible by other techniques such as extrusion. Advantages of the heat sink manufactured using this technique include high aspect ratio, thin fin, low tooling cost, easy and inexpensive to prototype, unidirectional flow and single piece construction. Parts of the heat sink may also be manufactured by bending sheets made of, but not limited to, copper or aluminum into fins to form the plurality of heat exchange elements. The fins are then bonded to the flat base of the heat sink. This technique allows the flat base, the core, and the fins to be made of different materials. Advantages of this manufacturing technique include light weight of fins, lower tooling cost and differing materials for the flat base and the fins. Various parts of the heat sink may be manufactured from sheets of material such as, but not limited to, copper or aluminum bonded onto the flat base using one or more of epoxy, soldering and brazing. This technique of manufacturing is suitable for high power application with low thermal resistance and where forced air cooling is available. Parts of the heat sink may also be manufactured using die casting. In this technique, material such as, but not limited to, liquid aluminum is forced under high pressure into re-usable steel molds. This technique is especially suited when the heat exchange elements are of complex shapes.

Those skilled in the art will recognize many ways to fabricate the heat sinks described herein. For example, modern three-dimensional laser and liquid printers can create objects such as the heat sinks described herein with a resolution of features on the order of 16 μm. Also, it is possible to grow a crystal structure using a recursive growth algorithm or through crystal growth techniques. For example, U.S. 2006/0037177, describes a method of controlling crystal growth to produce fractals or other structures through the use of spectral energy patterns by adjusting the temperature, pressure, and electromagnetic energy to which the crystal is exposed. This method might be used to fabricate the heat sinks described herein. For larger heat sinks, such as those intended to be used in car radiators, traditional manufacturing methods for large equipment can be adapted to create the fractal structures described herein.

In an extruded multi-level branching heat sink design, the extruded heat sink may be further subject to a spatially varying texturing, which may result from deposition or etching. For example, due to the inaccessible crevices, a self-assembling/self-organizing etching process is preferred, in which the approximate surface roughness varies with the topological distance from the heat source. For example, a solution may be provided, which deposits particles in a controlled manner. The particles in an etch bath are heat activated, and the heat sink is selectively heated such that the particles result in a desired distribution (size, location, depth) of etched features. Because these are dependent on the fractal-like shape of the heat sink, they will also be fractal. However, interactions between the particles in the etch process may also create an independent self-similar spatially varying result.

In a typical prior heat sink, the energy cost of a fan is considered high (and the penalty of noise also considered high), and therefore low pressure and modest heat transfer fluid flow rates are provided, with the flow tending to be laminar over a set of plates or vanes. Such flow conditions tend to promote particulate deposition on the heat exchange surfaces. On the other hand, in some cases, the energy cost of the fan and/or noise are not the critical variables to be minimized. In such cases, high flow rates such as to cause turbulent flow are desirable, since these disrupt the boundary layer and provide a higher heat transfer coefficient, while also reducing (or abating) particulate deposition on the heat exchange surfaces. In a spatial-filled fractal or fractal-like object has surfaces with characteristic sizes over a broad range, a heat dissipative structure may be provided in or near the geometric center. (The structure may be split approximately in half, and the structure mounted over a heat dissipative structure on a surface). Perforations through the surfaces may be optimized according to a multiscale or fractal algorithm to control cooling medium flow pattern, and heat dissipation. A source of compressed air may be provided blowing in a void near the heat dissipative structure, with the air flow exiting the structure through the fractal like object. A relatively small compressor may pressurize a plenum, which is periodically exhausted through one or more nozzles, toward heat transfer surfaces subject to fouling. The compressor may act in parallel to a fan, i.e., both run concurrently, and the compressor may be run from the same motor as the fan. The compressor may have at least two modes of operation, one employed when the heat dissipation load permits the heat to be shed based on the fan or convective flows, and therefore permitting the plenum to be charged to relatively high pressures, and thus produce a high impulse to dislodge dust and debris, and another mode assumed when heat load is high, and a more continuous flow of lower pressure air from the compressor assist in heat sink operation. In this way, maximum air flow is available at peak heat dissipation requirement times, and a lower air flow with high peak flow rates is available at low heat dissipation times. Further, it is noted that vibration of the heat exchange elements of the structure may assist in heat dissipation, especially if movements are macroscopic, and thus are associated with pressure gradients and air flows around the elements.

A heat sink according to the present technology may be designed using a computational flow dynamics (CFD) model of the heat sink, with either an iterative testing approach with design alternates, for example using a genetic algorithm, or an adaptive deterministic algorithm that is guided by the CFD properties of the base design. The CFD model may be used as the optimization criteria for the multiscale generative algorithm. For example, the variables of the multiscale generative algorithms for the gross morphology and surface configuration may be initially run in a sparse sampling of the entire available parameter range, with the CFD performance measured for each iteration, over the range of conditions. A genetic algorithm may then be implemented to further explore the solution space, using the prior CFD data as guidance. A success criterion is established, and the search can cease when met, though in many cases, the cessation criteria is that the design meets the performance criteria and also that the exploration has consumed budgeted resources, so that a readily findable solution is not unnecessarily ignored. For example, if implemented in a cloud computing environment, the budget may be a cost budget. In other cases, the exploration continues for a period of time, and when the deadline passes, the best sufficient design is employed.

One advantage of this approach is that the optimization may proceed with ad hoc constraints, such as spatial constraints. Thus, each iteration of the generative algorithm for generating the "shape" fractal (the lower level design algorithm) presents a choice, which may be guided by the CFD thermal model of the heat sink. Likewise, the second level fractal textures may also be designed according to a CFD framework. Because the CFD of the lower level is dependent on the surface properties of the structure, the model for each element (i.e., a structure at a level of recursion of the lower level algorithm having the surface defined by the upper level texture mapping algorithm) includes properties of both lower and upper levels.

In some cases, the distinct technology may be limited to the second level texture or perforation pattern applied to a basic shape that is distinct from a fractal design. For example, the texture or perforation pattern may be may be provided on a symmetric, uniform array (branched or otherwise) of heat sink elements according to known designs.

As discussed above, a presumption of uniform flow of the heat transfer medium is not necessarily applicable, and the design may be optimized for a range of flow conditions. For example, as thermal load increases, the flow rate and source vector may change. In some cases, the heat sink configuration itself may change, such as by means of a shape memory alloy (SMA), bimetallic elements, phase change medium (solid-liquid, liquid gas, etc.), electromagnetic, piezoelectric, etc. Typically, the addition of additional structure (i.e., mass) to a heat sink leads to increased efficiency, and for example, a larger branched structure would typically be expected to have greater efficiency than a corresponding heat sink having a smaller branched structure. However, in some cases, the larger structure impairs heat transfer fluid flow, and therefore can lower efficiency.

Typically, the surface texture is provided to increase the efficiency of the system at peak heat load, and preferably to reduce cost and/or acoustic emissions at lower loads. Reduced cost includes both material cost and operating cost, with operating cost typically corresponding to fan running power. Thus, for example, a heat sink design may be modified by a surface perforation pattern, and thereby modified to have lower mass and higher surface area, to provide higher peak thermal load capacity.

This document describes illustrative examples of the apparatus, methods, and articles of manufacture for making and using fractal heat sinks. Neither the specific embodiments of the invention as a whole, nor those of its features necessarily limit the general principles underlying the invention. The specific features described herein may be used in some embodiments, but not in others, in the various combinations and permutations, without departure from the spirit and scope of the invention as set forth herein. Various physical arrangements of components and various step sequences also fall within the intended scope of the invention. Many additional modifications are intended in the foregoing disclosure, and it will be appreciated by those of ordinary skill in the art that in some instances some features of the invention will be employed in the absence of a corresponding use of other features. The illustrative examples therefore do not limit the metes and bounds of the invention and the legal protection afforded the invention, which function is carried out by current and future claims and their equivalents.

The heat sink may have an associated control system, comprising a feedback input, which may be a system state defining past, present or future heat load or other operating conditions, or a feedback sensor defining current temperatures, air flow, acoustic emission (e.g., indicative of turbulence) or other conditions. The inputs are processed by an automated processor (e.g., microprocessor or microcontroller, and/or a system processor, remote processor (e.g., cloud processor), or the like. The processor or control system then produces an output, which may be used to control a fan or other heat exchange medium flow rate or flow conditions (e.g., a fan speed), a turbulence-generating device and/or characteristics thereof (e.g., a distance or orientation of a fractal grid from a heat exchange surface), a configuration of a heat exchange surface (e.g., angular inclination with respect to heat exchange medium flow), etc. The algorithm by which the automated control operates may employ a multifactorial optimization, which may include energy consumption of fan or other non-processing components, thermal cycling damage to components, heat damage to components, headroom for additional processing load, acoustic emissions, processor thermal throttling, dust accumulation and reduction, and the like. The various aspects of the operating conditions may be combined into a distance function, and treated as a unitary dimensionless variable, or subjected to a combinatorial optimization, especially where multiple inputs and/or outputs do not have directly correlated behavior.

What is claimed is:
1. A heat sink comprising:
a heat transmissive body;
a base of the heat transmissive body, configured to receive a heat load;
an external surface of the heat transmissive body, comprising a plurality of elongated sections separated from each other by regions of an external heat transfer fluid in a first pattern, configured to transfer a heat load from the base to the external heat transfer fluid; and a physical multiscale portion having a physical multiscale pattern distinct from the first pattern of the plurality of elongated sections, the physical multiscale pattern being defined by an iterated function system and comprising a plurality of successive levels of differently scaled self-similar features, the physical multiscale portion being configured to interact with a flow of the external heat transfer fluid around the external surface of the heat transmissive body to disrupt a pattern of the flow.

2. The heat sink according to claim 1, further comprising a fan or blower, configured to induce the flow of the external heat transfer fluid, to cause a turbulent flow pattern of the external heat transfer fluid interacting with the physical multiscale pattern.

3. The heat sink according to claim 2, wherein the fan or blower is configured to induce the flow of the external heat transfer fluid over a range of flow rates, and wherein a first flow rate provides the flow of external heat transfer fluid proximate to a portion of the external surface which is not turbulent, and a second flow rate provides the flow of external heat transfer fluid proximate to the portion of the external surface which is turbulent, wherein the first flow rate is higher than the second flow rate.

4. The heat sink according to claim 2, wherein the fan or blower is configured to induce the flow of the external heat transfer fluid over a range of flow rates, wherein a bulk flow vector of the external heat transfer fluid in a region interacting with the physical multiscale pattern changes over the range of flow rates.

5. The heat sink according to claim 1, wherein the physical multiscale pattern is integral with the external surface.

6. The heat sink according to claim 1, wherein the physical multiscale pattern is separate from the external surface.

7. The heat sink according to claim 1, wherein the physical multiscale pattern comprises a fractal grid.

8. The heat sink according to claim 1, wherein the physical multiscale pattern comprises a 3D fractal filter.

9. The heat sink according to claim 1, wherein the physical multiscale pattern comprises a perforation pattern of the external surface.

10. The heat sink according to claim 1, wherein the physical multiscale pattern comprises a fractal texture.

11. The heat sink according to claim 1, wherein the physical multiscale pattern comprises a 3D relief pattern on the external surface.

12. The heat sink according to claim 1, wherein the physical multiscale pattern is configured to induce a turbulent flow of the external heat transfer fluid prior to interacting with a portion of the external surface.

13. The heat sink according to claim 1, wherein the physical multiscale pattern is configured to induce a turbulent flow of the external heat transfer fluid while interacting with the external surface.

14. The heat sink according to claim 1, wherein the external surface has a configuration of the plurality of elongated sections defined by a second iterated function system distinct from the iterated function system.

15. The heat sink according to claim 14, wherein the second iterated function system comprises a three-dimensional algorithm adapted to define positions of the elongated sections extending in three dimensions.

16. The heat sink according to claim 1, wherein at least the external surface, and the physical multiscale pattern are together optimized according to a Computational Flow Dynamics model of heat transfer with the external heat transfer fluid.

17. The heat sink according to claim 16, wherein a genetic algorithm is provided to supply parameters of a generative algorithm for at least the physical multiscale pattern.

18. A heat sink comprising:
a base configured to transfer a heat load;
a heat transmissive body, having the base, and a three-dimensional configuration comprising a plurality of heat exchange surfaces in a first pattern; and
a physical multiscale portion in a physical multiscale pattern distinct from the plurality of plurality of heat exchange surfaces, defined by a deterministic function resulting in a fractal dimension exceeding a respective topological dimension,
the physical multiscale portion being configured to interact with a flow of the external heat transfer fluid proximate to a respective external surface to disrupt a pattern of the flow and enhance a heat transfer from the respective heat transfer surface with respect to the respective heat transfer surface absent the physical multiscale portion over a range of flow rates.

19. The heat sink according to claim 18, wherein the physical multiscale pattern comprises at least one of a multiscale perforation and a surface relief pattern provided on the plurality of heat exchange surfaces, having a Hausdorff dimension exceeding a respective topological dimension, configured to transfer heat between the heat transmissive body and a flowing stream of the external heat transfer fluid at a heat transfer fluid flow rate with an efficiency greater than a corresponding heat transmissive body absent the at least one of the multiscale perforation and the surface relief pattern provided on the plurality of heat exchange surfaces, at the same heat transfer fluid flow rate.

20. A heat-exchange device, comprising a plurality of heat-exchange elements arranged in a three-dimensional space in a first configuration, each said heat-exchange element having a surface texture or perforation pattern arranged in a fractal configuration.

21. The heat-exchange device of claim 20, wherein the first configuration is a 2D fractal extended in a third dimension.

22. The heat-exchange device of claim 20, wherein the first configuration is defined by a fractal algorithm selected from the group consisting of an L-system, a Quadratic Koch Island, a Koch Snowflake, a modified Koch Snowflake, an Icosahedron flake, an Octahedron flake, a fractal canopy, a fractal tree, a fractal grid, a Sierpinski Triangle, a Sierpinski Carpet, a Sierpinski tetrahedron, a Dodecaedron fractal, a Cantor set, Cantor dust, 3D Cantor dust, a branching tree, and a Peano curve.

23. The heat-exchange device of claim 20, wherein the fractal configuration is defined by a fractal algorithm selected from the group consisting of Cantor dust, a crinkled canopy, a Koch surface, a Triangular Koch fractal surface, an Appolony Fractal, a Circle Inversion Fractal, a Circle Packing Fractal, an Apollonian Gasket, a Sierpinski Carpet, and a Hex Fractal Carpet.

24. A heat sink comprising:
an interface configured to receive a heat load from a heat source;
a body having a plurality of heat exchange elements configured to transfer heat from the interface to a surrounding heat transfer fluid, arranged in three-dimensional space according to a body fractal pattern, each of the plurality of heat exchange elements having features arranged in an element fractal pattern, selected from the group consisting of at least one of a plurality of holes having locations arranged in the element fractal pattern, and a textured relief portion having a textured relief pattern in the element fractal pattern, the fractal features in the element fractal pattern being configured to interact with a flow of the surrounding heat transfer fluid over a range of flow rates to disrupt a pattern of the flow and enhance a heat transfer from the plurality of heat exchange elements with respect to the flow of the surrounding heat transfer fluid over a range of flow rates absent the interaction with the fractal features.

25. The heat sink of claim 24, wherein the fractal features comprise the plurality of holes arranged in the element fractal pattern, having holes of different sizes.

26. The heat sink of claim 24, wherein the fractal features comprise the textured relief in the element fractal pattern.

27. The heat sink of claim 24, wherein each of the plurality of heat exchange elements is both perforated with the plurality of holes and has a textured relief pattern together arranged in the element fractal pattern.

28. The heat sink of claim 24, wherein the body fractal pattern defines a branched network of the plurality of heat exchange elements, a plurality of the heat exchange elements each having at least two branch nodes.

29. The heat sink of claim 24, further comprising a electronic device having an integrated circuit, configured to generate heat and transfer the generated heat through the interface for dissipation by the plurality of heat exchange elements.

30. A heat sink comprising:

a heat transmissive body, configured to receive a heat load;

a plurality of elongated elements having heat exchange surfaces, configured in a three-dimensional pattern; and an external multiscale aperture pattern having a plurality of successive levels of differently scaled apertures defined by an iterated function system, configured to interact with a fluid flow around the heat exchange surfaces to disrupt a flow pattern, being optimized under at least one set of conditions to maximize heat transfer efficiency for transfer of heat into the fluid flow.

31. The heat sink according to claim 30, further comprising a fan or blower, configured to induce the fluid flow through the plurality of successive levels of differently scaled apertures, to cause a turbulent flow pattern of the fluid flow.

32. The heat sink according to claim 31, further comprising a controller configured to control the fan or blower, having at least one processor configured to estimate the turbulent flow pattern of the fluid flow dependent on an output of the controller.

33. The heat sink according to claim 32, wherein the at least one processor is further configured to control the fan or blower selectively dependent on an acoustic emission of the heat sink dependent on a flow rate of the fluid flow.

34. The heat sink according to claim 32, further comprising at least one microphone configured to detect sound, wherein the controller is further configured to control a speed of the fan or blower dependent on the detected sound.

* * * * *